US012712144B2

(12) United States Patent
Kawatsu et al.

(10) Patent No.: US 12,712,144 B2
(45) Date of Patent: Aug. 18, 2026

(54) ION GENERATION DEVICE AND ION IMPLANTER

(71) Applicant: Sumitomo Heavy Industries Ion Technology Co., Ltd., Tokyo (JP)

(72) Inventors: Sho Kawatsu, Ehime (JP); Masateru Sato, Ehime (JP)

(73) Assignee: Sumitomo Heavy Industries Ion Technology Co., Ltd., Tokyo (JP)

( * ) Notice: Subject to any disclaimer, the term of this patent is extended or adjusted under 35 U.S.C. 154(b) by 324 days.

(21) Appl. No.: 18/619,397

(22) Filed: Mar. 28, 2024

(65) Prior Publication Data

US 2024/0266140 A1 Aug. 8, 2024

Related U.S. Application Data

(63) Continuation of application No. PCT/JP2022/027548, filed on Jul. 13, 2022.

(30) Foreign Application Priority Data

Oct. 8, 2021 (JP) ................................ 2021-166241

(51) Int. Cl.

| | |
|---|---|
| ***H01J 37/08*** | (2006.01) |
| ***H01J 37/09*** | (2006.01) |
| ***H01J 37/31*** | (2006.01) |
| ***H01J 37/317*** | (2006.01) |

(52) U.S. Cl.

CPC .............. *H01J 37/08* (2013.01); *H01J 37/09* (2013.01); *H01J 37/3171* (2013.01); *H01J 2237/061* (2013.01)

(58) Field of Classification Search

CPC ........ H01J 37/08; H01J 37/09; H01J 37/3171; H01J 2237/061

See application file for complete search history.

(56) References Cited

U.S. PATENT DOCUMENTS

| | | | |
|---|---|---|---|
| 2015/0340194 | A1 | 11/2015 | Sato |
| 2016/0351379 | A1 | 12/2016 | Sato |
| 2018/0261434 | A1 | 9/2018 | Kawaguchi et al. |
| 2020/0303153 | A1 | 9/2020 | Ochi |

(Continued)

FOREIGN PATENT DOCUMENTS

| | | | |
|---|---|---|---|
| EP | 0851453 | B1 | 7/1998 |
| JP | H07-161323 | A | 6/1995 |
| JP | 2010-073387 | A | 4/2010 |

(Continued)

*Primary Examiner* — Nicole M Ippolito
(74) *Attorney, Agent, or Firm* — Michael Best & Friedrich LLP

(57) ABSTRACT

An ion generation device includes an arc chamber including an internal space and including a front slit for extracting an ion beam from plasma generated in the internal space, a magnetic field generator that generates a magnetic field applied in an axial direction in the internal space, and a first cathode configured to supply a thermoelectron into the internal space. The first cathode includes a first cathode cap, a first heat source, and a first thermal shield including a first extension portion. A first tip portion, and a first tip opening, and a first opening width of the first tip opening in the radial direction is smaller than a maximum width of the first cathode cap in the radial direction.

26 Claims, 29 Drawing Sheets

(56) References Cited

U.S. PATENT DOCUMENTS

2026/0038761 A1* 2/2026 Takagi .................. H01J 29/484

FOREIGN PATENT DOCUMENTS

| | | | |
|---|---|---|---|
| JP | 2015-225720 | A | 12/2015 |
| JP | 2016-225139 | A | 12/2016 |
| TW | 201545196 | A | 12/2015 |
| TW | 202040650 | A | 11/2020 |
| WO | 03/100806 | A1 | 4/2003 |

* cited by examiner 100
10
11
12
14
15a
15b
16
18
20
22(22a)
22b
24
26
28
30
32
34
36
38
40
42
44
W
R1
IB θ1
76d
54D
θ2
d2
76e
76g
72
76
76a
72d 72e
A1
76c
72a wa
72
72e
72d
72a
wb wa
72
72a wa
72
72a wa
72
72e2
72e1
72a
72d
wb wa
72
72e
72d
72a wa
72
72e
72d
72a wa
72
72e2
72f
72e1
72a
72d
wb wa
72
72e
72f
72a
72d wa
72
72e
72f
72a
72d wa
72
72e3
72e2
72e1
72a
72d
wb wa
72
72e2
72e1
72a
72d wa
72
72e2
72e1
72a
72d wa
72
72e2
72e1
72a
72d
wb wa
72
72e
72a
72d
wb wa
72
72e
72a
72d

ION GENERATION DEVICE AND ION IMPLANTER

CROSS-REFERENCE TO RELATED APPLICATIONS

This is a bypass continuation of International PCT Application No. PCT/JP2022/027548, filed on Jul. 13, 2022, which claims priority to Japanese Patent Application No. 2021-166241, filed on Oct. 8, 2021, which are incorporated by reference herein in their entirety.

BACKGROUND

Technical Field

Certain embodiments of the present disclosure relate to an ion generation device and an ion implanter.

Description of Related Art

In a semiconductor manufacturing process, a process of implanting an ion into a semiconductor wafer is implemented as standard to change a semiconductor conductivity, change a semiconductor crystal structure, or the like. A device used in this process is generally referred to as an ion implanter. In such an ion implanter, an ion is generated by an ion generation device including an indirectly heated cathode (IHC) and an arc chamber. The generated ion is extracted to the outside of the arc chamber through an extraction electrode.

SUMMARY

According to an aspect of the present disclosure, there is provided an ion generation device including an arc chamber including an internal space and including a front slit for extracting an ion beam from plasma generated in the internal space, a magnetic field generator that generates a magnetic field applied in an axial direction in the internal space, and a first cathode configured to supply a thermoelectron into the internal space, in which the first cathode includes a first cathode cap that protrudes in the axial direction toward an inside of the arc chamber and emits the thermoelectron supplied into the internal space, a first heat source that heats the first cathode cap, and a first thermal shield including a first extension portion that extends in the axial direction in a substantially tubular shape on a radially outer side of the first cathode cap and is adjacent to the first cathode cap with a gap in a radial direction perpendicular to the axial direction, a first tip portion that protrudes toward the inside of the arc chamber, and a first tip opening that opens in the axial direction at the first tip portion. A first opening width of the first tip opening in the radial direction is smaller than a maximum width of the first cathode cap in the radial direction.

According to another aspect of the present disclosure, there is provided an ion implanter. The ion implanter includes the ion generation device of a certain aspect, a beam accelerator that accelerates an ion beam extracted from the ion generation device, and an implantation processing chamber in which the ion beam output from the beam accelerator is implanted to a wafer.

DETAILED DESCRIPTION

Figure 1:
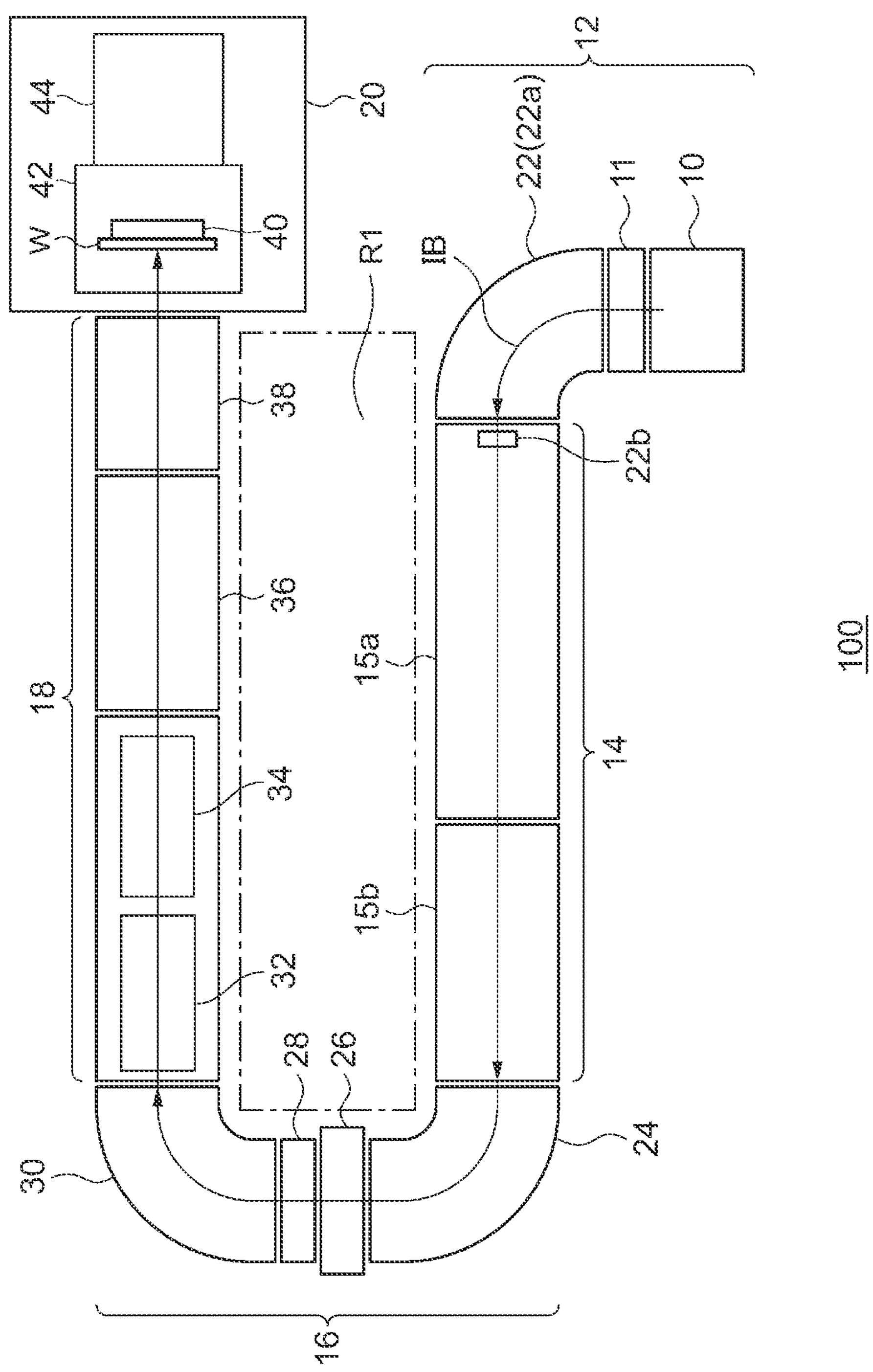
FIG. 1 is a top view of a schematic configuration of an ion implanter according to an embodiment.

In recent years, there has been an increasing demand for the generation of a high-energy ion beam in order to implant the ion into a deeper region of a wafer surface. In order to generate the high-energy ion beam, it is effective that a multiply charged ion is generated by the ion generation device and the generated multiply charged ion is accelerated by using a DC acceleration mechanism or a radio-frequency acceleration mechanism (for example, linear acceleration mechanism). In a case where a sufficient amount of multiply charged ions are generated by the ion generation device, it is necessary to set a high arc condition with a larger arc voltage and/or arc current. Thus, the abrasion of the arc chamber may become more remarkable. Under such a high arc condition, the life of the ion generation device is shortened, which leads to a decrease in productivity of the ion implanter.

The present disclosure provides an ion generation device capable of generating a larger number of multiply charged ions under a low arc condition.

Any combination of the above-described components or a replacement of the components and expressions of the present disclosure between methods, devices, systems, and the like is also effective as an aspect of the present disclosure.

According to a non-limiting exemplary embodiment of the present disclosure, it is possible to provide the ion generation device capable of generating a larger number of multiply charged ions under the lower arc condition.

Hereinafter, an ion generation device and an ion implanter according to the embodiment will be described in detail with reference to the drawings. In the description of the drawings, the same reference numerals will be assigned to the same elements, and duplicate description will be omitted as appropriate. Further, a configuration described below is an example and does not limit the scope of the present disclosure.

FIG. 1 is a top view of a schematic configuration of an ion implanter 100 according to the embodiment. The ion implanter 100 is a so-called high energy ion implanter. The ion implanter 100 generates an ion beam IB by extracting out and accelerating an ion generated by an ion generation device 10 and transports the ion beam IB to a workpiece (for example, substrate or wafer W) along a beamline to implant the ion into the workpiece.

The ion implanter 100 includes a beam generation unit 12 that generates the ion and performs mass separation, a beam acceleration unit 14 that further accelerates the ion beam IB into a high-energy ion beam, a beam deflection unit 16 that performs energy analysis of the high-energy ion beam, energy dispersion control, and trajectory correction, a beam transport unit 18 that transports the high-energy ion beam to the wafer W, and a substrate transfer processing unit 20 that implants the high-energy ion beam into the wafer W.

The beam generation unit 12 includes the ion generation device 10, an extraction electrode 11, and a mass analyzer 22. In the beam generation unit 12, the ion is extracted from the ion generation device 10 through the extraction electrode 11 and is accelerated at the same time, and the mass analyzer 22 performs mass analysis on the extracted and accelerated ion beam. The mass analyzer 22 includes a mass analyzing magnet **22*a* and a mass resolving aperture 22*b*. As a result of the mass analysis by the mass analyzer 22, ion species necessary for the implantation are selected, and an ion beam of the selected ion species is guided to the next beam acceleration unit 14**.

The beam acceleration unit 14 includes a plurality of linear accelerators that accelerate the ion beam, that is, one or more radio-frequency resonators. The beam acceleration unit 14 is a radio-frequency acceleration mechanism that accelerates the ion by a reaction of a radio-frequency (RF) electric field. The beam acceleration unit 14 includes a first linear accelerator **15*a* including a basic multi-stage radio-frequency resonator, and a second linear accelerator 15*b* including an additional multi-stage radio-frequency resonator for ultra-high energy ion implantation. A direction of the ion beam accelerated by the beam acceleration unit 14 is changed by the beam deflection unit 16**.

The high-energy ion beam that exits from the beam acceleration unit 14 has an energy distribution in a certain range. Therefore, in order to cause the high-energy ion beam to be reciprocally scanned and parallelized on a downstream side of the beam acceleration unit 14 to implant the high-energy ion beam to the wafer, it is necessary to implement in advance high-precision energy analysis, energy dispersion control, trajectory correction, and beam convergence/divergence adjustment.

The beam deflection unit 16 performs the energy analysis of the high-energy ion beam, the energy dispersion control, and the trajectory correction. The beam deflection unit 16 includes at least two high-precision deflection electromagnets, at least one energy width limiting slit, at least one energy resolving aperture, and at least one lateral converger. The plurality of deflection electromagnets are configured to perform the energy analysis of the high-energy ion beam and precise correction of an ion implantation angle into the wafer W.

The beam deflection unit 16 includes an energy analysis electromagnet 24, a lateral convergence quadrupole lens 26 that suppresses energy dispersion, an energy resolving aperture 28, and a deflection electromagnet 30 that provides steering (correction of ion beam trajectory). The energy analysis electromagnet 24 may be referred to as an energy filter electromagnet (EFM). The high-energy ion beam is redirected by the beam deflection unit 16 and directed in the direction in which the wafer W is located.

The beam transport unit 18 is a beamline unit that transports the ion beam IB emitted from the beam deflection unit 16, and includes a beam shaper 32 configured of a convergent/divergent lens group, a beam scanner 34, a beam parallelizer 36, and a final energy filter 38 (including final energy separation slit). A length of the beam transport unit 18 is designed to match a total length of the beam generation unit 12 and the beam acceleration unit 14. The beam acceleration unit 14 and the beam transport unit 18 are connected by the beam deflection unit 16 to form a U-shaped layout as a whole.

The substrate transfer processing unit 20 is provided at an end terminal on a downstream side of the beam transport unit 18. The substrate transfer processing unit 20 includes an implantation processing chamber 42 and a substrate transfer unit 44. The implantation processing chamber 42 is provided with a platen drive unit 40 that holds the wafer W during the ion implantation and moves the wafer W in a direction perpendicular to a beam scanning direction. The substrate transfer unit 44 is provided with a wafer transfer mechanism such as a transfer robot for carrying the wafer W before the ion implantation into the implantation processing chamber 42 and carrying out the ion-implanted wafer W from the implantation processing chamber 42.

The ion generation device 10 is configured to generate a multiply charged ion of a dopant such as boron (B), phosphorus (P), or arsenic (As). The beam acceleration unit 14 accelerates the multiply charged ion extracted from the ion generation device 10 to generate the high-energy ion beam of 1 MeV or higher, 4 MeV or higher, or 12 MeV or higher. With the acceleration of the multiply charged ion (for example, doubly charged, triply charged, or quadruply charged or higher), it is possible to generate the ion beam having higher energy compared with a case where a singly charged ion is accelerated.

The beam acceleration unit 14 may be configured as one linear accelerator as a whole, instead of a two-stage linear accelerator as illustrated, or may be mounted separately as a linear accelerator having three or more stages. Further, the beam acceleration unit 14 may be configured of any other type of accelerator, and may include, for example, a DC acceleration mechanism. The present embodiment is not limited to the specific ion acceleration method, and any beam accelerator may be employed as long as the high-energy ion beam of 1 MeV or higher, 4 MeV or higher, or 12 MeV or higher can be generated.

With the high-energy ion implantation, a desired dopant ion is implanted into a wafer surface with higher energy than the ion implantation of energy less than 1 MeV. Therefore, it is possible to implant the desired dopant into a deeper region (for example, depth of 5 μm or more) of the wafer surface. An application of the high-energy ion implantation is, for example, formation of a P-type region and/or an N-type region in manufacturing a semiconductor device such as the latest image sensor.

Various aspects can be considered for a configuration of each part of the ion implanter 100 of the present disclosure. The ion implanter of the present disclosure is not limited to any aspect of the configuration of each part other than the ion generation device, as long as the ion generation device described below can be applied. Further, the ion generation device and the ion implanter of the present disclosure are suitable for the generation of the ion beam configured of the multiply charged ion, but are also applicable to the generation of the ion beam configured of the singly charged ion.

The ion generation device 10 according to the present embodiment generates an arc discharge in an internal space of an arc chamber to generate plasma containing the multiply charged ion. The ion generation device 10 is of a type that uses a so-called indirect-heating-type cathode, and causes a thermoelectron emitted from a cathode cap to collide with a source gas to generate the plasma. In general, in order to generate the multiply charged ion by stripping more electrons from an atom contained in a source gas, it is necessary to set a high arc condition with a larger arc voltage and/or arc current. Under such a high arc condition, the abrasion of the arc chamber is severe and the life of the ion generation device is shortened. Thus, frequent maintenance is required for the device. As a result, an operation ratio of the ion implanter 100 decreases, and the production efficiency of the semiconductor device decreases.

In the present embodiment, there is provided an ion generation device capable of generating a larger number of multiply charged ions under a low arc condition. The "low arc condition" expressed here refers to an arc condition in which the arc voltage and the arc current are relatively lower than a "high arc condition" required to generate the multiply charged ion in an ion generation device in the related art. In the present embodiment, with employment of at least one of the following features (1) to (7), high density plasma is efficiently generated even under the low arc condition, and a larger number of multiply charged ions are allowed to be extracted from the high-density plasma.

(1) With use of a thermal shield provided around the cathode cap, a range is narrowed in which the thermoelectron is emitted from the cathode cap toward the internal space of the arc chamber.

(2) A plurality of thermal shields are provided around the cathode cap to promote a rise in temperature of the cathode cap.

(3) A voltage for extracting the thermoelectron is applied to the thermal shield provided around the cathode cap.

(4) One thermal shield is provided around a repeller head to promote a rise in temperature of the repeller head.

(5) With the use of the thermal shield provided around the repeller head, a range is narrowed in which the thermoelectron is emitted from the repeller head toward the internal space of the arc chamber.

(6) A plurality of thermal shields are provided around the repeller head to further promote the rise in temperature of the repeller head.

(7) A voltage for extracting the thermoelectron is applied to the thermal shield provided around the repeller head.

First Embodiment

Figure 2:
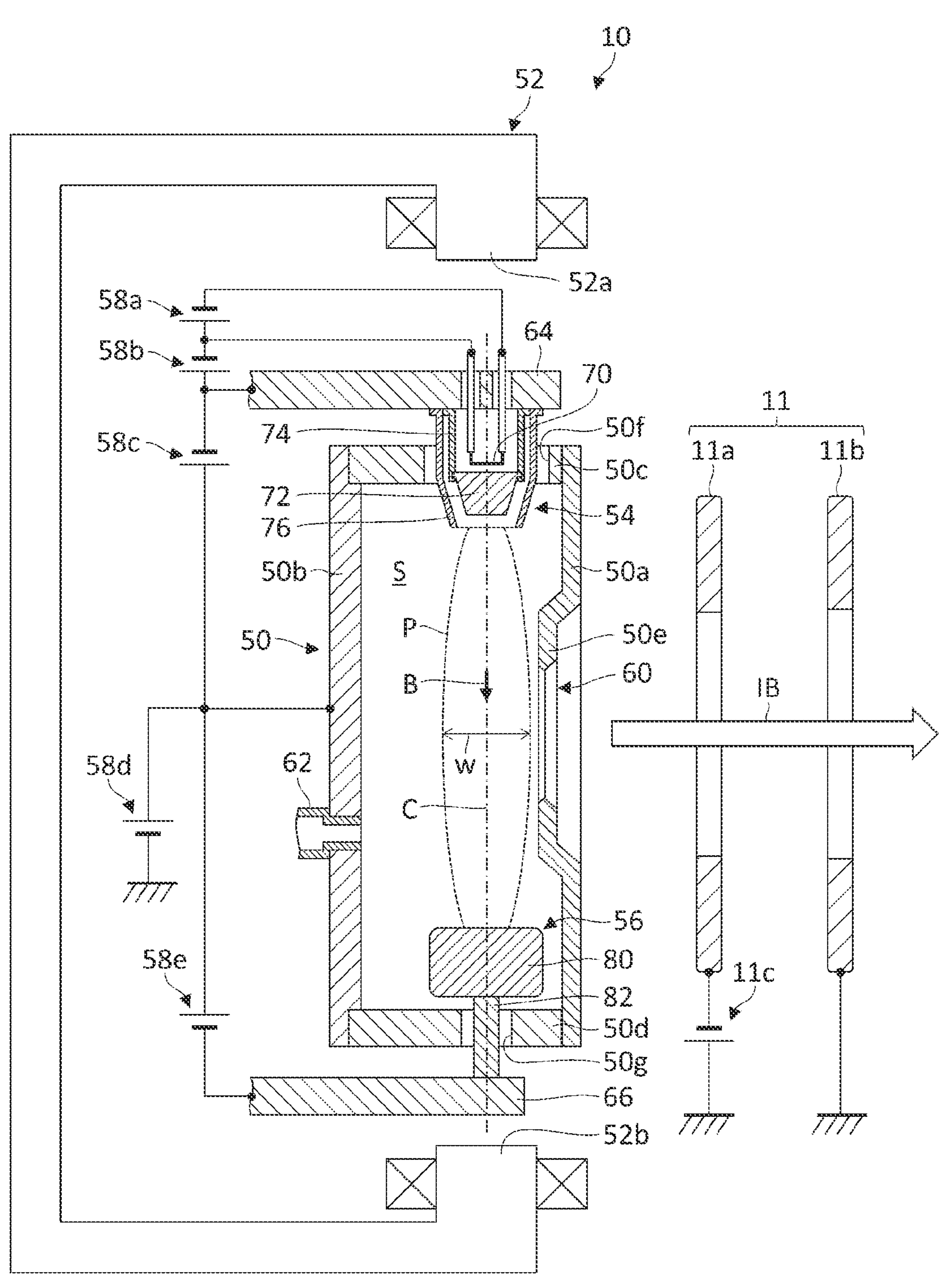
FIG. 2 is a cross-sectional view of a schematic configuration of an ion generation device according to a first embodiment.

FIG. 2 is a diagram showing a schematic configuration of the ion generation device 10 according to a first embodiment. The ion generation device 10 includes an arc chamber 50, a magnetic field generator 52, a first cathode 54, a repeller 56, a first filament power supply **58*a*, a first cathode power supply 58*b*, a first arc power supply 58*c*, an extraction power supply 58*d*, and a repeller power supply 58*e***.

The extraction electrode 11 for extracting the ion beam IB through a front slit 60 of the arc chamber 50 is disposed near the ion generation device 10. The extraction electrode 11 includes a first extraction electrode **11*a* and a second extraction electrode 11*b*. The first extraction electrode 11*a* is connected to a suppression power supply 11*c* and is applied with a negative suppression voltage. The second extraction electrode 11*b* is applied with a ground voltage. The arc chamber 50 is connected to the extraction power supply 58*d*** and is applied with a positive extraction voltage.

The arc chamber 50 has an internal space S in which the plasma is generated. The arc chamber 50 has a substantially rectangular box shape that partitions the internal space S. The arc chamber 50 includes the front slit 60 for extracting the ion beam IB from the plasma generated in the internal space S. The front slit 60 has an elongated shape extending in a direction (also referred to as axial direction) toward the repeller 56 from the first cathode 54. The drawing schematically shows, by a broken line, a plasma generation region P in which the high density plasma is generated.

The arc chamber 50 includes four side walls including a front wall **50*a* and a back wall 50*b*, and a first end wall 50*c* and a second end wall 50*d*. The front wall 50*a* includes the front slit 60. A protrusion portion 50*e* that protrudes toward the inside of the arc chamber 50 is provided at a central portion of the front wall 50*a*, and the front slit 60 is formed in the protrusion portion 50*e*. With the formation of the front slit 60 in the protrusion portion 50*e***, it is possible to extract the ion beam IB from higher-density plasma. The back wall

50*b* faces the front wall 50*a* with the internal space S interposed therebetween. The back wall 50*b* is provided with a gas introduction port 62 for introducing the source gas. The first end wall 50*c* and the second end wall 50*d* are disposed so as to face each other in the axial direction with the internal space S interposed therebetween. The first end wall 50*c* includes a first cathode insertion hole 50*f* that extends in the axial direction. The second end wall 50*d* includes a repeller insertion hole 50*g* that extends in the axial direction.

The arc chamber 50 is made of a refractory material. For example, a refractory metal such as tungsten (W), molybdenum (Mo), or tantalum (Ta), or an alloy thereof is used. A part or the whole of the arc chamber 50 may be made of graphite (C). For example, the front wall 50*a* or the protrusion portion 50*e* may be made of graphite, and the side wall (for example, back wall 50*b*) other than the front wall 50*a* or the protrusion portion 50*e*, the first end wall 50*c*, and the second end wall 50*d* may be made of the refractory metal such as tungsten.

The magnetic field generator 52 is provided outside the arc chamber 50 and generates a magnetic field B applied in the axial direction in the internal space S of the arc chamber 50. The magnetic field generator 52 includes a first magnetic pole 52*a* and a second magnetic pole 52*b*, and for example, generates the magnetic field B in the axial direction from the first magnetic pole 52*a* toward the second magnetic pole 52*b*. The direction of the magnetic field B may be an opposite direction, or may be a direction from the second magnetic pole 52*b* toward the first magnetic pole 52*a*. The arc chamber 50 is disposed between the first magnetic pole 52*a* and the second magnetic pole 52*b*.

The first cathode 54 supplies the thermoelectron into the internal space S of the arc chamber 50. The first cathode 54 is inserted into the first cathode insertion hole 50*f*, and is fixed to a first cathode support member 64 in a state of being electrically isolated from the arc chamber 50. The first cathode support member 64 is provided outside the arc chamber 50. The first cathode 54 includes a first heat source 70, a first cathode cap 72, a first thermal break 74, and a first thermal shield 76.

The first heat source 70 is a heat source for heating the first cathode cap 72. The first heat source 70 is, for example, a filament connected to the first filament power supply 58*a*. The first heat source 70 is disposed inside the first thermal break 74 so as to face the first cathode cap 72. The first cathode power supply 58*b* is connected between the first heat source 70 and the first cathode cap 72, and a cathode voltage is applied to therebetween.

The first cathode cap 72 is a solid member that protrudes in the axial direction toward the inside of the arc chamber 50. The first cathode cap 72 has a shape rotationally symmetric with respect to a center axis C extending in the axial direction, and has, for example, a truncated cone shape. The first cathode cap 72 is heated by the first heat source 70 to emit the thermoelectron toward the internal space S. The first arc power supply 58*c* is connected between the first cathode cap 72 and the arc chamber 50, and the arc voltage is applied to therebetween.

The first thermal break 74 is a cylindrical member that supports the first cathode cap 72, and extends in the axial direction from the first cathode support member 64 toward the first cathode cap 72. The first thermal shield 76 extends in the axial direction in a tubular shape on a radially outer side of the first cathode cap 72 and the first thermal break 74. The first thermal shield 76 reflects heat radiation from the first cathode cap 72 and the first thermal break 74 which are in a high temperature state, and suppresses heat escape from the first cathode cap 72 and the first thermal break 74 to promote a rise in temperatures of the first cathode cap 72 and the first thermal break 74.

The first cathode cap 72, the first thermal break 74, and the first thermal shield 76 are made of the refractory material. For example, a refractory metal such as tungsten, molybdenum, or tantalum, an alloy thereof, or graphite is used. As an example, the first cathode cap 72 and the first thermal shield 76 are made of tungsten, and the first thermal break 74 is made of tantalum.

The repeller 56 is provided on a side opposite to the first cathode 54 in the axial direction with the internal space S interposed therebetween. The repeller 56 repels an electron near the repeller 56 and causes an electron to stay in the plasma generation region P to improve the plasma generation efficiency. The repeller 56 is inserted into the repeller insertion hole 50*g*, and is fixed to a repeller support member 66 in a state of being electrically isolated from the arc chamber 50. The repeller support member 66 is provided outside the arc chamber 50. The repeller power supply 58*e* is connected between the repeller 56 and the arc chamber 50, and a repeller voltage is applied to therebetween. The repeller power supply 58*e* may not be provided, and the repeller 56 may be configured to have a floating potential. Further, in a configuration in which the repeller power supply 58*e* is not provided, with connection of the arc power supply 58*c* to the repeller 56, the arc voltage may be applied to the repeller 56.

The repeller 56 includes a repeller head 80 and a repeller shaft 82. The repeller head 80 is a solid member that protrudes in the axial direction toward the inside of the arc chamber 50, and is disposed to be exposed to the internal space S. The repeller head 80 is provided at a position facing the first cathode cap 72 in the axial direction. The repeller shaft 82 is a columnar member that supports the repeller head 80, and extends in the axial direction from the repeller support member 66 toward the repeller head 80.

The repeller head 80 and the repeller shaft 82 are made of the refractory material. For example, a refractory metal such as tungsten, molybdenum, or tantalum, an alloy thereof, or graphite is used. A part or the whole of the repeller 56 may be made of graphite. For example, the repeller shaft 82 may be made of graphite, and the repeller head 80 may be made of the refractory metal such as tungsten.

Subsequently, an operation of the ion generation device 10 will be described. The filament constituting the first heat source 70 is heated by the first filament power supply 58*a* and emits a primary thermoelectron. The primary thermoelectron, which is emitted by the first heat source 70, is accelerated by the cathode voltage (for example, 200 V to 600 V) generated by the first cathode power supply 58*b*, collides with the first cathode cap 72, and heats the first cathode cap 72 with heat generated by the collision. The first cathode cap 72 heated by the first heat source 70 emits a secondary thermoelectron into the internal space S. The secondary thermoelectron, which is emitted by the first cathode cap 72, is accelerated by the arc voltage (for example, 50 V to 150 V) generated by the first arc power supply 58*c*. The accelerated secondary thermoelectron is supplied to the plasma generation region P as an electron having sufficient energy to generate the plasma containing the multiply charged ion. The electron supplied to the plasma generation region P is constrained by the magnetic field B applied in the axial direction in the internal space S, and moves in a spiral shape along the magnetic field B. The repeller 56 repels the electron to the plasma generation region P by the repeller voltage (for example, 120 V to 200

V) generated by the repeller power supply 58*e*. As a result, with limitation of the electron motion to the plasma generation region P, it is possible to improve the plasma generation efficiency. The electron moving in a spiral shape in the plasma generation region P ionizes the source gas, which is introduced from the gas introduction port 62, to generate the plasma containing the multiply charged ion in the internal space S.

In the first embodiment, with employment of the feature (1), a larger number of multiply charged ions are generated under the low arc condition. Specifically, with the use of the first thermal shield 76 provided around the first cathode cap 72, the range is narrowed in which the thermoelectron is emitted from the first cathode cap 72 toward the internal space S of the arc chamber 50. With the narrowing of the range in which the thermoelectron is emitted, a range of the plasma generation region P (width w in radial direction perpendicular to axial direction) is narrowed, and the higher-density plasma is generated in the narrower range. Such a configuration of the first cathode 54 will be described in detail with reference to FIG. 3.

Figure 3:
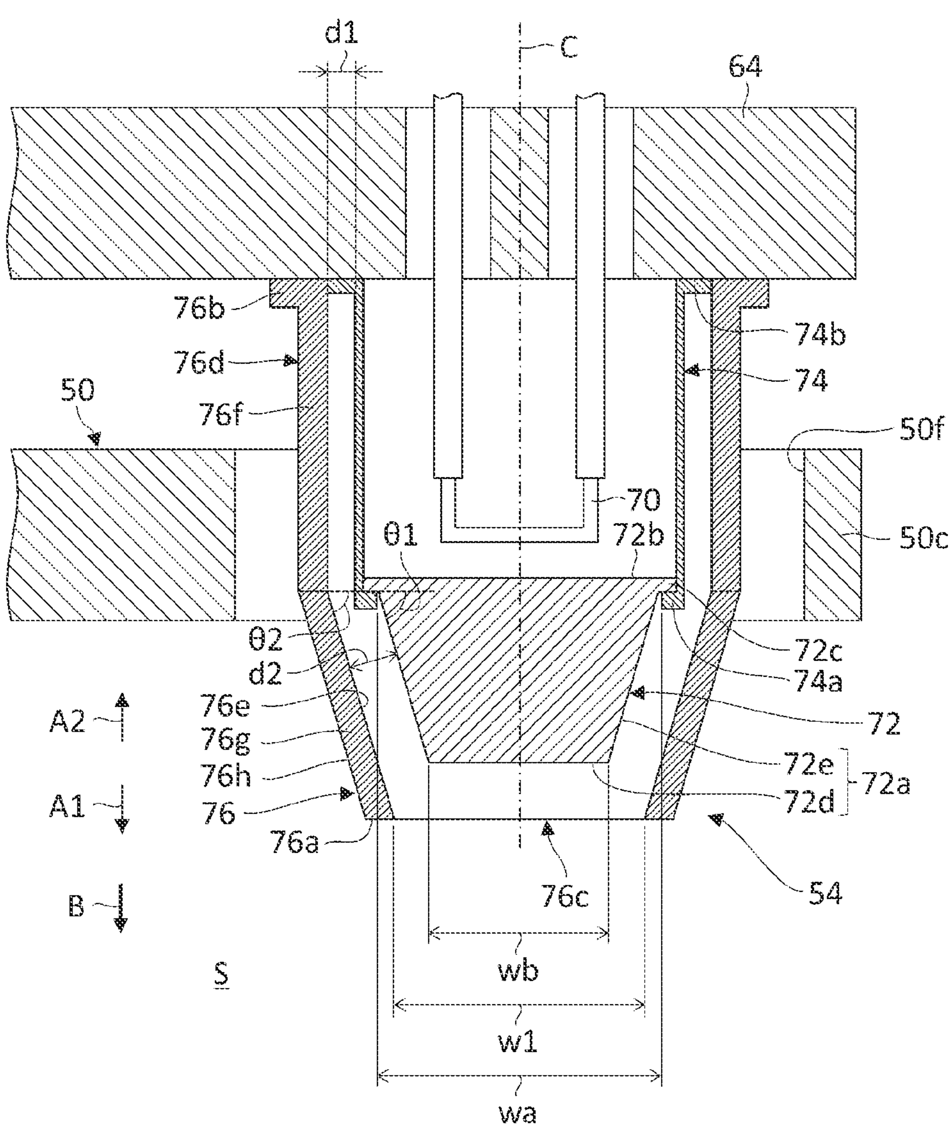
FIG. 3 is a cross-sectional view of a configuration of a first cathode according to the first embodiment in detail.

FIG. 3 is a detailed cross-sectional view of a configuration of the first cathode 54 according to the first embodiment, and is an enlarged view of the first cathode 54 shown in FIG. 2. In FIG. 3, an arrow A1 indicates a direction extending in the axial direction from the outside to the inside of the arc chamber 50 with reference to the first end wall 50*c*. The arrow A1 is a direction toward an inner side of the arc chamber 50 along the axial direction. An arrow A2 is a direction opposite to the arrow A1 and is a direction toward an outer side of the arc chamber 50 along the axial direction. In the first embodiment, a potential of the first thermal shield 76 is the same as a potential of the first cathode cap 72.

The first cathode cap 72 protrudes in the axial direction toward the inside of the arc chamber 50. The first cathode cap 72 has a tapered shape whose width in the radial direction decreases toward the inside of the arc chamber 50, and has, for example, a trapezoidal shape symmetrical in the cross section of FIG. 3. The first cathode cap 72 includes a thermoelectron emission surface 72*a*, a heat inflow surface 72*b*, and a flange 72*c*.

The thermoelectron emission surface 72*a* is a surface that protrudes toward the inside of the arc chamber 50, and is a surface that emits the thermoelectron supplied into the internal space S. The thermoelectron emission surface 72*a* includes a tip surface 72*d* configured of a flat surface exposed in the axial direction toward the inside of the arc chamber 50 and a side surface 72*e* configured of a curved surface (for example, truncated cone surface) exposed in a direction oblique to the axial direction. A width wb of the tip surface 72*d* in the radial direction is smaller than a maximum width wa (outer diameter of side surface 72*e*) of the thermoelectron emission surface 72*a* in the radial direction, and is, for example, 10% or more and 95% or less of the maximum width wa, and is preferably 50% or more and 80% or less of the maximum width wa.

The heat inflow surface 72*b* is a flat surface facing the first heat source 70, and is exposed in the axial direction toward the outside of the arc chamber 50. The first cathode cap 72 is mainly heated by the primary thermoelectron directed from the first heat source 70 toward the heat inflow surface 72*b*. The flange 72*c* is provided so as to protrude on the radially outer side (for example, in a direction away from center axis C in the radial direction) at or near a position of the heat inflow surface 72*b*. The flange 72*c* engages with a locking end portion 74*a* of the first thermal break 74.

The first thermal break 74 includes the locking end portion 74*a* that protrudes in the direction of the arrow A1 toward the inside of the arc chamber 50, and an attachment end portion 74*b* that protrudes in the direction of the arrow A2 toward the outside of the arc chamber 50. The first thermal break 74 extends in the axial direction in a cylindrical shape from the attachment end portion 74*b* toward the locking end portion 74*a*. The locking end portion 74*a* engages with the flange 72*c* of the first cathode cap 72 to fix the first cathode cap 72. The attachment end portion 74*b* is attached to the first cathode support member 64.

The first thermal shield 76 is provided on the radially outer side of the first cathode cap 72 and the first thermal break 74. The first thermal shield 76 includes a first tip portion 76*a* that protrudes in the direction of the arrow A1 toward the inside of the arc chamber 50, and a first terminal portion 76*b* that protrudes in the direction of the arrow A2 toward the outside of the arc chamber 50. The first tip portion 76*a* protrudes toward the inside of the arc chamber 50 more than the first cathode cap 72. That is, a position of the first tip portion 76*a* in the axial direction is closer to the inner side of the arc chamber 50 than a position of a tip (tip surface 72*d*) of the first cathode cap 72 in the axial direction. The first terminal portion 76*b* is attached to the first cathode support member 64. In a modification example, the first terminal portion 76*b* may be attached to the first thermal break 74.

The first thermal shield 76 includes a first tip opening 76*c* that opens in the axial direction at the first tip portion 76*a*. The first tip opening 76*c* allows the thermoelectron, which is supplied from the first cathode cap 72 toward the internal space S, to pass therethrough. The first tip opening 76*c* is configured to narrow a pass-through range of the thermoelectron emitted from the thermoelectron emission surface 72*a*. A first opening width w1 in the radial direction in the first tip opening 76*c* is smaller than a maximum width of the first cathode cap 72 in the radial direction (width at position of the flange 72*c* in the radial direction), and is smaller than a maximum width wa of the thermoelectron emission surface 72*a* in the radial direction. The first opening width w1 of the first tip opening 76*c* is 5% or more and 95% or less of the maximum width wa of the thermoelectron emission surface 72*a*, and is, for example, 50% or more and 90% or less of wa. A tip width wb of the thermoelectron emission surface 72*a* in the radial direction (width wb of the tip surface 72*d* in the radial direction) is smaller than the first opening width w1 of the first tip opening 76*c*. The width wb of the tip surface 72*d* in the radial direction is, for example, 5% or more and 95% or less of the first opening width w1 of the first tip opening 76*c*, and is, for example, 10% or more and 90% or less of w1.

The first thermal shield 76 includes a first extension portion 76*d* that extends in the axial direction in the tubular shape from the first terminal portion 76*b* toward the first tip portion 76*a*. The first extension portion 76*d* is adjacent to the first cathode cap 72 and the first thermal break 74 with a gap in the radial direction. The first extension portion 76*d* includes a first cylindrical portion 76*f* and a first tapered portion 76*g*.

The first cylindrical portion 76*f* is a portion where a width of an inner surface 76*e* of the first extension portion 76*d* in the radial direction is constant, and is disposed adjacent to the first thermal break 74 with a gap in the radial direction. The first cylindrical portion 76*f* is configured such that at least the inner surface 76*e* has a cylindrical shape. The first cylindrical portion 76*f* is configured such that, for example, a distance d1 from the inner surface 76*e* of the first extension portion 76*d* to the first thermal break 74 is constant. The first cylindrical portion 76*f* shown in FIG. 3 is not adjacent to the first cathode cap 72 with a gap in the radial direction. However, in the modification example, the first cylindrical portion 76*f* may be configured to be adjacent to the first cathode cap 72 with a gap in the radial direction.

The first tapered portion 76*g* is a portion where the width of the inner surface 76*e* of the first extension portion 76*d* in the radial direction changes in the axial direction, and is a portion where the width of the inner surface 76*e* of the first extension portion 76*d* in the radial direction decreases toward the inside of the arc chamber 50. The first tapered portion 76*g* is disposed adjacent to the first cathode cap 72 with a gap in the radial direction, and is disposed along the thermoelectron emission surface 72*a* (side surface 72*e*) of the first cathode cap 72. The first tapered portion 76*g* is configured such that at least the inner surface 76*e* has the truncated cone shape. The first tapered portion 76*g* is configured such that, for example, a distance d2 from the inner surface 76*e* of the first extension portion 76*d* to the first cathode cap 72 is constant. For example, an inclination angle θ2 of the inner surface 76*e* of the first tapered portion 76*g* with respect to the radial direction is the same as an inclination angle θ1 of the side surface 72*e* of the first cathode cap 72 with respect to the radial direction. The first tapered portion 76*g* may be configured such that an outer surface 76*h* of the first extension portion 76*d* has the truncated cone shape. The first tapered portion 76*g* shown in FIG. 3 is configured to be adjacent to the first thermal break 74 (locking end portion 74*a*) with a gap in the radial direction, but the first tapered portion 76*g* may be configured to be not adjacent to the first thermal break 74 with a gap in the radial direction.

Figure 4:
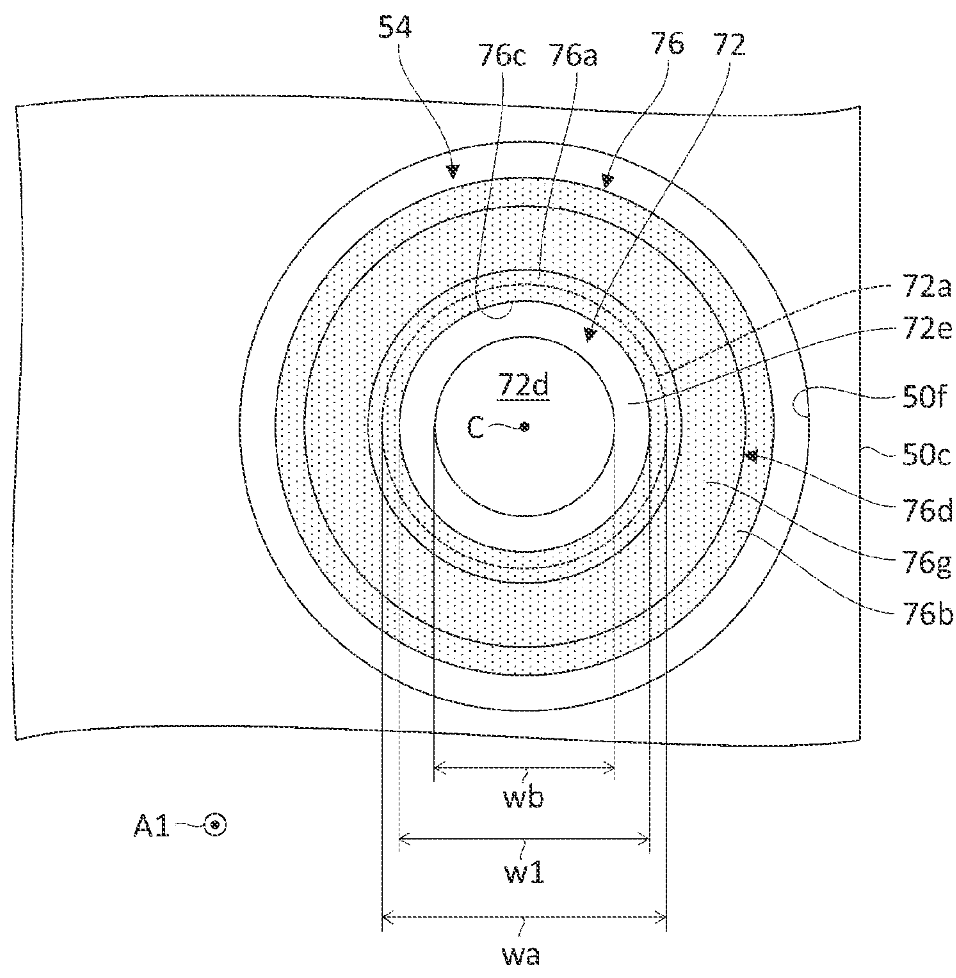
FIG. 4 is a plan view of a configuration of the first cathode in FIG. 3 as viewed in an axial direction.

FIG. 4 is a plan view of a configuration of the first cathode 54 in FIG. 3 as viewed in the axial direction, and the first cathode 54 is viewed in a direction from the inside to the outside of the arc chamber 50. In FIG. 4, the first thermal shield 76 is shaded for the sake of clarity. As shown in FIG. 4, the first cathode cap 72 and the first thermal shield 76 have the shape rotationally symmetric with respect to the center axis C extending in the axial direction, and are disposed to be coaxial with each other. Although the first thermal break 74 is not visible in FIG. 4, the first thermal break 74 also has the shape rotationally symmetric with respect to the center axis C, and is disposed to be coaxial with the first cathode cap 72 and the first thermal shield 76.

As described above, the first opening width w1 of the first tip opening 76*c* in the radial direction is smaller than the maximum width wa of the thermoelectron emission surface 72*a* of the first cathode cap 72 in the radial direction and is larger than the tip width wb of the thermoelectron emission surface 72*a* in the radial direction (width wb of the tip surface 72*d* in the radial direction). Therefore, at least a part of the first thermal shield 76 is disposed to overlap the first cathode cap 72 in the axial direction. More specifically, at least a part of an edge of the first tip opening 76*c* of the first thermal shield 76 overlaps the thermoelectron emission surface 72*a* (specifically, side surface 72*e*) of the first cathode cap 72 in the axial direction.

According to the first embodiment, with the first opening width w1 of the first tip opening 76*c* of the first thermal shield 76 to be made smaller than the maximum width of the first cathode cap 72 in the radial direction, it is possible to narrow the range in the radial direction in which the thermoelectron is emitted from the first cathode cap 72 toward the inside of the arc chamber 50. As a result, it is possible to intensively supply the thermoelectron to the range limited in the radial direction and to generate the high density plasma in the plasma generation region P even under the low arc condition.

According to the first embodiment, since the first cathode cap 72 has the tapered shape, it is possible to supply the thermoelectron emitted from the side surface 72*e* of the first cathode cap 72 toward the inside of the arc chamber 50. Further, since the first thermal shield 76 includes the first tapered portion 76*g*, with disposition of the inner surface 76*e* of the first extension portion 76*d* closer to the side surface 72*e* of the first cathode cap 72 to suppress the heat escape from the first cathode cap 72, it is possible to promote the rise in temperatures of the first cathode cap 72. As a result, it is easy to maintain the first cathode cap 72 at a high temperature even under the low arc condition, and it is possible to supply a larger number of thermoelectrons to the plasma generation region P.

Modification Examples According to First Embodiment

Hereinafter, modification examples of the first cathode 54 according to the first embodiment will be shown with reference to FIGS. 5A to 10B. Hereinafter, while showing structures of the first cathode cap 72 and the first thermal shield 76, differences from the first embodiment described above will be mainly described and description of common points will be omitted as appropriate.

Figure 5A:
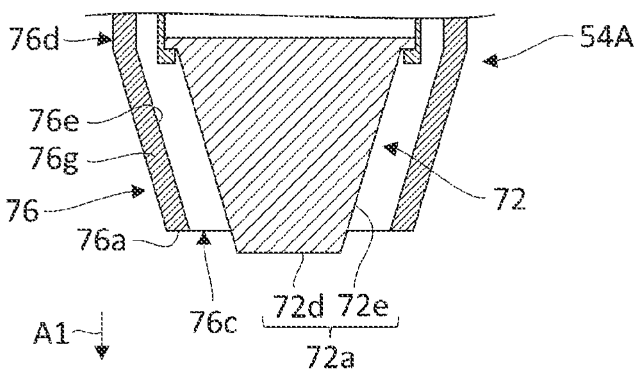
FIGS. 5A and 5B are cross-sectional views schematically showing a configuration of a first cathode according to a modification example of the first embodiment.
Figure 5B:
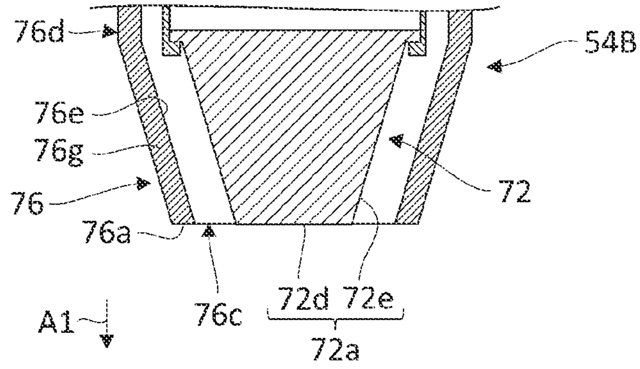

FIGS. 5A and 5B are cross-sectional views schematically showing configurations of first cathodes 54A and 54B according to the modification example. In the first cathode 54A shown in FIG. 5A, the tip (tip surface 72*d*) of the first cathode cap 72 protrudes toward the inside of the arc chamber more than the first tip portion 76*a* of the first thermal shield 76. That is, the position of the tip (tip surface 72*d*) of the first cathode cap 72 in the axial direction is closer to the inner side of the arc chamber than the position of the first tip portion 76*a* in the axial direction. In FIG. 5A, a length of the first cathode cap 72 in the axial direction is larger than that in FIG. 3. In a further modification example, a length of the first extension portion 76*d* (for example, first tapered portion 76*g*) in the axial direction may be smaller than that in FIG. 3. In the first cathode 54B shown in FIG. 5B, the position of the tip (tip surface 72*d*) of the first cathode cap 72 in the axial direction is the same as the position of the first tip portion 76*a* of the first thermal shield 76 in the axial direction.

Figures 6A, 6B:
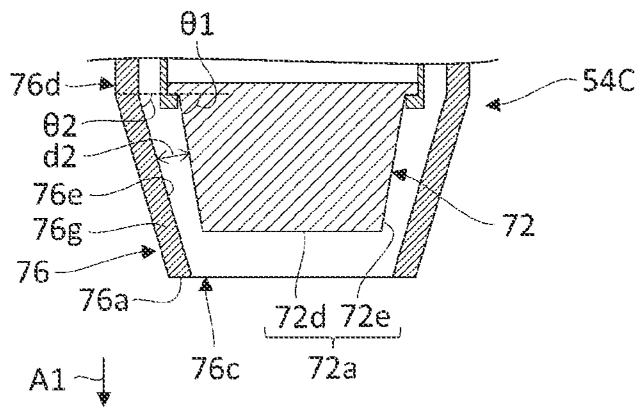
FIGS. 6A and 6B are cross-sectional views schematically showing a configuration of a first cathode according to the modification example of the first embodiment.

FIGS. 6A and 6B are cross-sectional views schematically showing configurations of first cathodes 54C and 54D according to the modification example. In the first cathode 54C shown in FIG. 6A, the distance d2 from the inner surface 76*e* of the first extension portion 76*d* to the first cathode cap 72 changes according to the position in the axial direction, and the distance d2 is configured to decrease toward the inside of the arc chamber. In FIG. 6A, the inclination angle θ2 of the inner surface 76*e* of the first tapered portion 76*g* with respect to the radial direction is smaller than the inclination angle θ1 of the side surface 72*e* of the first cathode cap 72 with respect to the radial direction.

In the first cathode 54D shown in FIG. 6B, contrary to FIG. 6A, the distance d2 from the inner surface 76*e* of the first extension portion 76*d* to the first cathode cap 72 is configured to increase toward the inside of the arc chamber. In FIG. 6B, the inclination angle θ2 of the inner surface 76*e* of the first tapered portion 76*g* with respect to the radial direction is larger than the inclination angle θ1 of the side surface 72*e* of the first cathode cap 72 with respect to the radial direction.

Figure 7A:
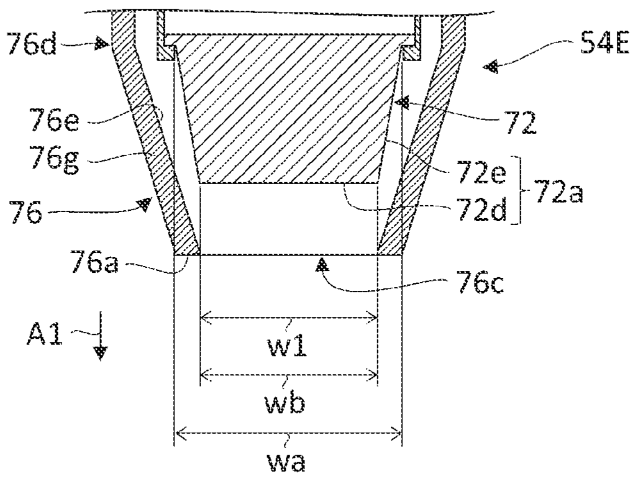
FIGS. 7A and 7B are cross-sectional views schematically showing a configuration of a first cathode according to the modification example of the first embodiment.
Figure 7B:
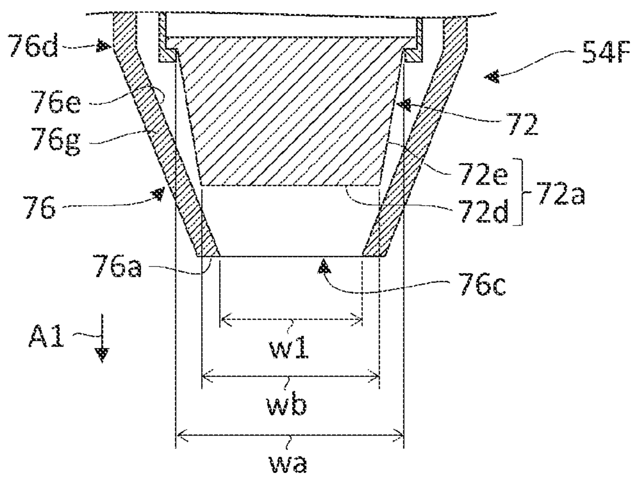

FIGS. 7A and 7B are cross-sectional views schematically showing configurations of first cathodes 54E and 54F according to the modification example. In the first cathode 54E shown in FIG. 7A, the first opening width w1 of the first tip opening 76*c* in the radial direction is smaller than the maximum width wa of the thermoelectron emission surface 72*a* of the first cathode cap 72 in the radial direction and is the same as the tip width wb of the thermoelectron emission surface 72*a* in the radial direction (width wb of the tip surface 72*d* in the radial direction). In the first cathode 54F shown in FIG. 7B, the first opening width w1 of the first tip opening 76*c* in the radial direction is smaller than the tip width wb of the thermoelectron emission surface 72*a* of the first cathode cap 72 in the radial direction (width wb of the tip surface 72*d* in the radial direction).

Figure 8A:
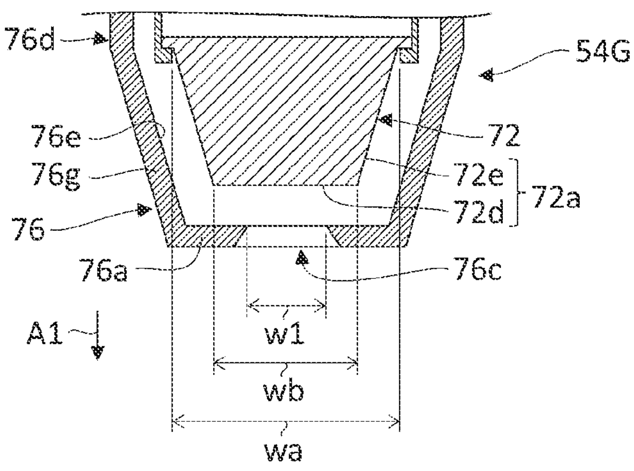
FIGS. 8A and 8B are cross-sectional views schematically showing a configuration of a first cathode according to the modification example of the first embodiment.
Figure 8B:
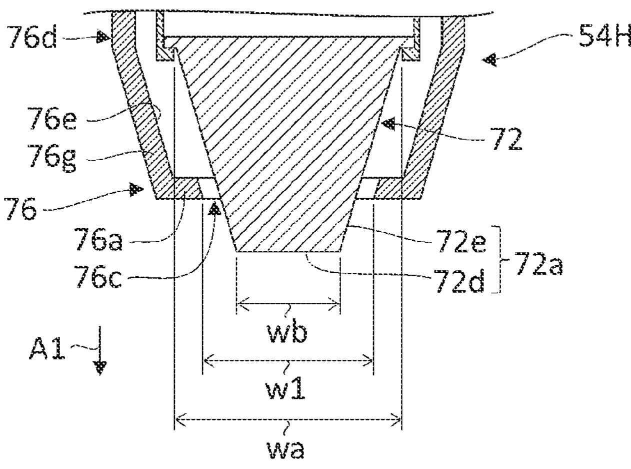

FIGS. 8A and 8B are cross-sectional views schematically showing configurations of first cathodes 54G and 54H according to the modification example. In the first cathode 54G shown in FIG. 8A, the first tip portion 76*a* of the first thermal shield 76 extends on a radially inner side. The first tip portion 76*a* extends on the radially inner side from a tip of the first extension portion 76*d*. The first tip opening 76*c* in FIG. 8A has the tapered shape whose opening width in the radial direction increases toward the inside of the arc chamber. In a further modification example, the first tip opening 76*c* in FIG. 8A may be configured to have a constant width in the radial direction, or may have a reverse tapered shape in which the width in the radial direction decreases toward the inside of the arc chamber. In FIG. 8A, the first opening width w1 of the first tip opening 76*c* in the radial direction is smaller than the tip width wb of the thermoelectron emission surface 72*a* in the radial direction (width wb of the tip surface 72*d* in the radial direction). In a further modification example, the first opening width w1 of the first tip opening 76*c* in the radial direction may be the same as or larger than the tip width wb of the thermoelectron emission surface 72*a* in the radial direction (width wb of the tip surface 72*d* in the radial direction).

In the first cathode 54H shown in FIG. 8B, as in FIG. 8A, the first tip portion 76*a* of the first thermal shield 76 extends on the radially inner side. In FIG. 8B, the tip (tip surface 72*d*) of the first cathode cap 72 protrudes toward the inside of the arc chamber more than the first tip portion 76*a*, and the first tip portion 76*a* extends on the radially inner side toward the first cathode cap 72. The first tip opening 76*c* in FIG. 8B has the tapered shape whose opening width in the radial direction decreases toward the inside of the arc chamber. In a further modification example, the first tip opening 76*c* in FIG. 8B may be configured to have a constant width in the radial direction, or may have the tapered shape whose opening width in the radial direction increases toward the inside of the arc chamber. In FIG. 8B, the first opening width w1 of the first tip opening 76*c* in the radial direction is larger than the tip width wb of the thermoelectron emission surface 72*a* in the radial direction (width wb of the tip surface 72*d* in the radial direction).

Figure 9A:
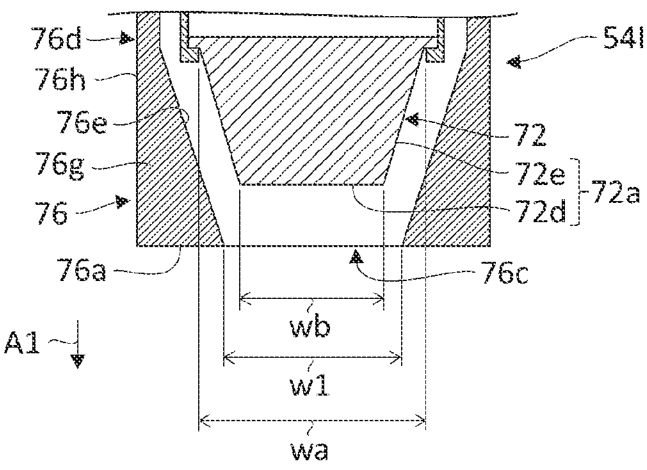
FIGS. 9A and 9B are cross-sectional views schematically showing a configuration of a first cathode according to the modification example of the first embodiment.
Figure 9B:
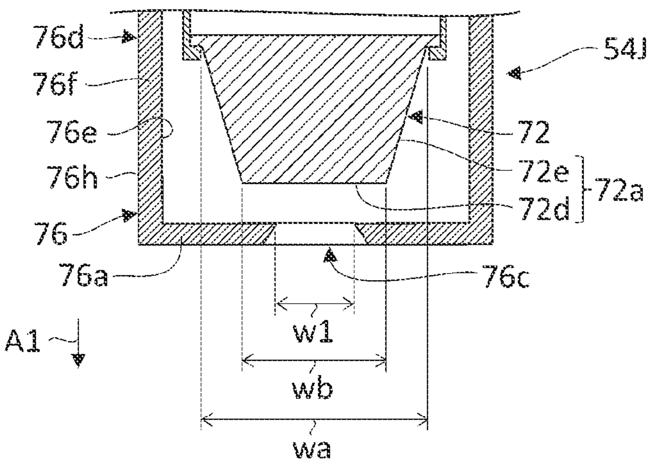

FIGS. 9A and 9B are cross-sectional views schematically showing configurations of first cathodes 54I and 54J according to the modification example. In the first cathode 54I shown in FIG. 9A, only the inner surface 76*e* of the first tapered portion 76*g* of the first thermal shield 76 has the tapered shape, and the outer surface 76*h* does not have the tapered shape. In FIG. 9A, the inner surface 76*e* of the first tapered portion 76*g* is a truncated cone surface, and the outer surface 76*h* of the first tapered portion 76*g* is a cylindrical surface. In FIG. 9A, the first opening width w1 of the first tip opening 76*c* in the radial direction is larger than the tip width wb of the thermoelectron emission surface 72*a* in the radial direction (width wb of the tip surface 72*d* in the radial direction). In a further modification example, the first opening width w1 of the first tip opening 76*c* in the radial direction may be the same as or smaller than the tip width wb of the thermoelectron emission surface 72*a* in the radial direction (width wb of the tip surface 72*d* in the radial direction).

In the first cathode 54J shown in FIG. 9B, the first extension portion 76*d* of the first thermal shield 76 has the first cylindrical portion 76*f*, but does not have the first tapered portion 76*g*. In FIG. 9B, the first cylindrical portion 76*f* is adjacent to the first cathode 54 with a gap in the radial direction, and the first tip portion 76*a* is provided at a tip of the first cylindrical portion 76*f*. The first tip portion 76*a* extends on the radially inner side from the first cylindrical portion 76*f*. The first tip opening 76*c* in FIG. 9B has the tapered shape whose opening width in the radial direction increases toward the inside of the arc chamber. In a further modification example, the first tip opening 76*c* in FIG. 9B may be configured to have a constant width in the radial direction, or the reverse tapered shape in which the width in the radial direction decreases toward the inside of the arc chamber. In FIG. 9B, the first opening width w1 of the first tip opening 76*c* in the radial direction is smaller than the tip width wb of the thermoelectron emission surface 72*a* in the radial direction (width wb of the tip surface 72*d* in the radial direction). In a further modification example, the first opening width w1 of the first tip opening 76*c* in the radial direction may be the same as or larger than the tip width wb of the thermoelectron emission surface 72*a* in the radial direction (width wb of the tip surface 72*d* in the radial direction).

In FIGS. 9A and 9B, the first tip portion 76*a* protrudes toward the inside of the arc chamber more than the tip (tip surface 72*d*) of the first cathode cap 72. In a further modification example, the tip (tip surface 72*d*) of the first cathode cap 72 may have the same position in the axial direction as the first tip portion 76*a*, or may protrude toward the inside of the arc chamber more than the first tip portion 76*a*.

Figure 10A:
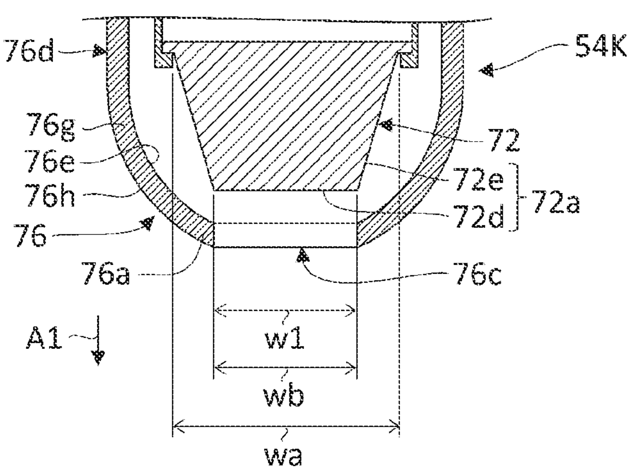
FIGS. 10A and 10B are cross-sectional views schematically showing a configuration of a first cathode according to the modification example of the first embodiment.
Figure 10B:
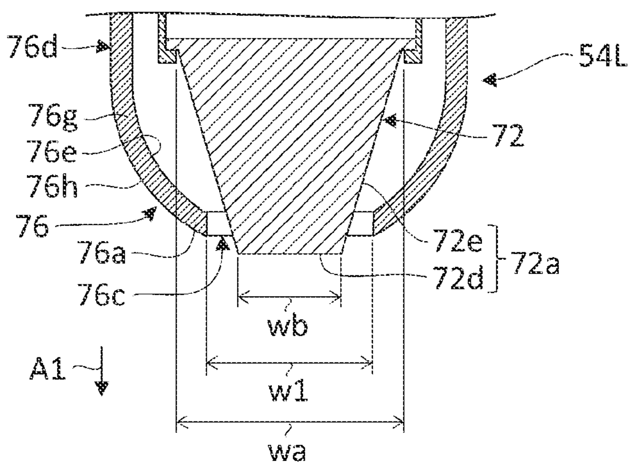

FIGS. 10A and 10B are cross-sectional views schematically showing configurations of first cathodes 54K and 54L according to the modification example. In the first cathodes 54K and 54L shown in FIGS. 10A and 10B, the first tapered portion 76*g* is configured in a dome shape. Specifically, the inner surface 76*e* and the outer surface 76*h* of the first tapered portion 76*g* are configured of a curved surface that is convex toward the inner side of the arc chamber. The inner surface 76*e* and the outer surface 76*h* of the first tapered portion 76*g* are configured to be, for example, a part of a spherical surface, an elliptical spherical surface, or a rotating parabolic surface.

In the first cathode 54K shown in FIG. 10A, the first tip portion 76*a* protrudes toward the inside of the arc chamber more than the tip (tip surface 72*d*) of the first cathode cap 72. In FIG. 10A, the first opening width w1 of the first tip opening 76*c* in the radial direction is the same as the tip width wb of the thermoelectron emission surface 72*a* in the radial direction (width wb of the tip surface 72*d* in the radial direction). As a further modification example, the first opening width w1 of the first tip opening 76*c* in the radial direction may be larger than or smaller than the tip width wb of the thermoelectron emission surface 72*a* in the radial direction (width wb of the tip surface 72*d* in the radial direction).

In the first cathode 54L shown in FIG. 10B, the tip (tip surface 72*d*) of the first cathode cap 72 protrudes toward the inside of the arc chamber more than the first tip portion 76*a*. The first tip portion 76*a* extends obliquely with respect to the axial direction toward the first cathode cap 72. In FIG. 10B, the first opening width w1 of the first tip opening 76*c* in the radial direction is larger than the tip width wb of the thermoelectron emission surface 72*a* in the radial direction (width wb of the tip surface 72*d* in the radial direction).

The feature relating to the disposition of the first cathode cap 72 and the first thermal shield 76 shown in FIGS. 3 to 10B and the feature relating to the shape of the first thermal shield 76 shown in FIGS. 3 to 10B can be used in combination as appropriate. Further, the first cathode cap 72 shown in FIGS. 3 to 10B may have a polygonal truncated pyramid shape, instead of the truncated cone shape. The first cathode cap 72 shown in FIGS. 3 to 10B may have a shape that is non-rotationally symmetrical with respect to the center axis C in FIG. 3. A shape of a space formed by the inner surface 76*e* of the first tapered portion 76*g* shown in FIGS. 3 and 5A to 9A may be a pyramidal trapezoidal shape. The shape of the space formed by the inner surface 76*e* of the first tapered portion 76*g* shown in FIG. 9B may be a polygonal columnar shape. The shape of the space formed by the inner surface 76*e* of the first tapered portion 76*g* shown in FIGS. 3 to 10B may have the shape that is non-rotationally symmetrical with respect to the center axis C in FIG. 3.

Figures 11A, 11B, 11C, 11D, 11E, 11F, 11G, 11H, 11I, 11J, 11K, 11L, 11M, 11N, 11O:
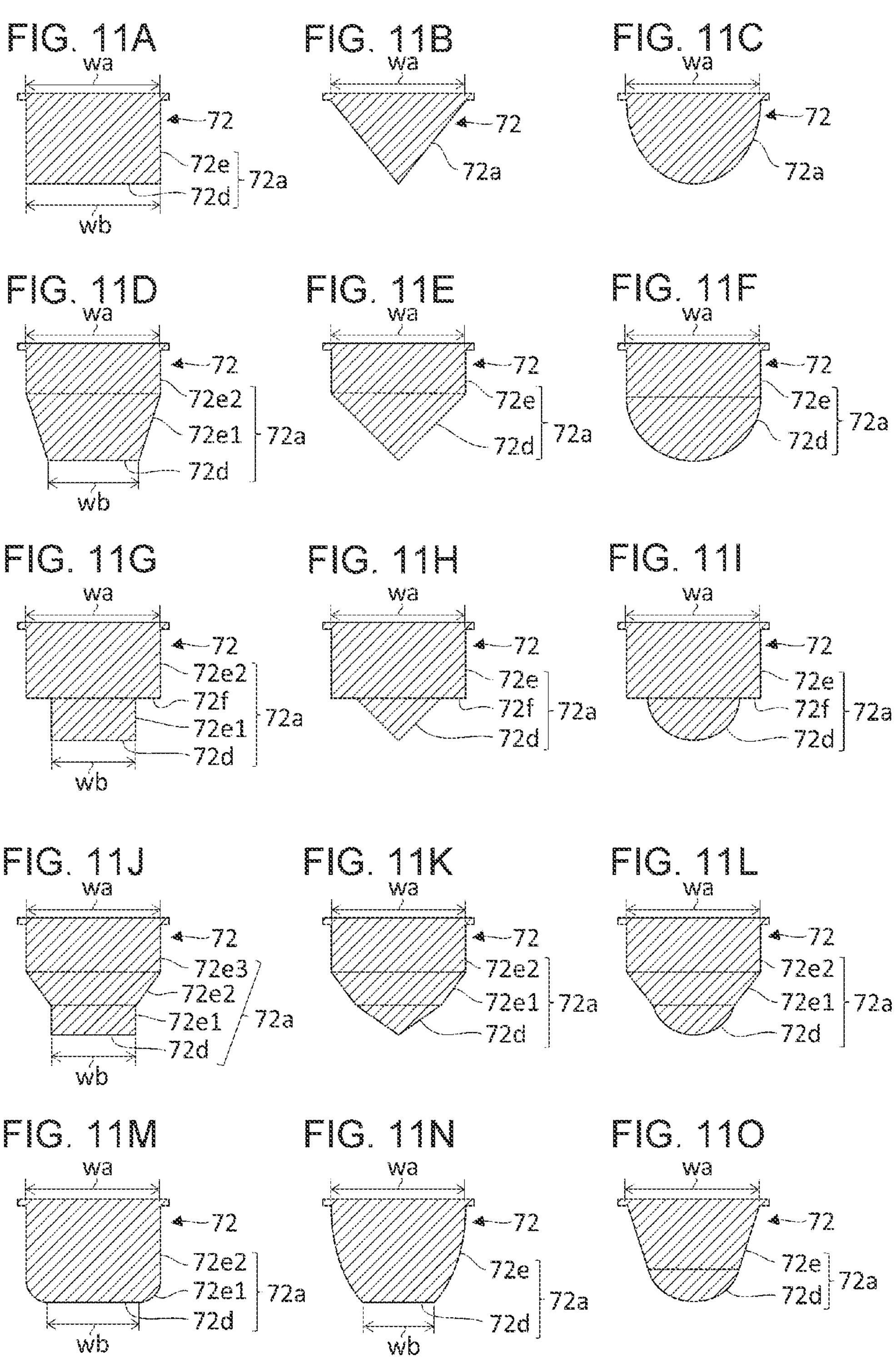
FIGS. 11A to 11O are cross-sectional views schematically showing a shape of a first cathode cap according to the modification example of the first embodiment.

FIG. 11A to 11O are cross-sectional views schematically showing a shape of the first cathode cap 72 according to the modification example. FIGS. 11A to 11O show the first cathode cap 72 having a shape different from the truncated cone shape shown in FIGS. 3 to 10B. The first cathode cap 72 shown in FIGS. 11A to 11O can be used in place of the first cathode cap 72 having the truncated cone shape shown in FIGS. 3 to 10B. That is, the first cathode cap 72 shown in FIGS. 11A to 11O can be used in combination with the first thermal shield 76 shown in FIGS. 3 to 10B.

FIG. 11A shows a first cathode cap 72 having a columnar shape (or polygonal columnar shape). The thermoelectron emission surface 72*a* of the first cathode cap 72 shown in FIG. 11A includes the tip surface 72*d* configured of the flat surface exposed in the axial direction toward the inside of the arc chamber, and the side surface 72*e* configured of the cylindrical surface (polygonal cylindrical surface) exposed in the radial direction. In FIG. 11A, a width of the thermoelectron emission surface 72*a* in the radial direction is constant, and both the maximum width wa and the tip width wb of the thermoelectron emission surface 72*a* in the radial direction correspond to the width (diameter of the side surface 72*e*) of the tip surface 72*d* in the radial direction.

FIG. 11B shows the first cathode cap 72 having a conical shape (or polygonal conical shape). The thermoelectron emission surface 72*a* of the first cathode cap 72 shown in FIG. 11B is configured of a conical surface (or polygonal conical surface) that protrudes in the axial direction toward the inside of the arc chamber. Therefore, the first cathode cap 72 in FIG. 11B does not have a tip surface configured of the flat surface exposed in the axial direction toward the inside of the arc chamber. In FIG. 11B, the maximum width wa of the thermoelectron emission surface 72*a* in the radial direction corresponds to a diameter of a bottom surface of a conical shape (or polygonal conical shape), and a tip width of the thermoelectron emission surface 72*a* in the radial direction is zero.

FIG. 11C shows the first cathode cap 72 having a dome shape. The first cathode cap 72 has, for example, a shape obtained by cutting a sphere or an elliptical sphere in half. The thermoelectron emission surface 72*a* of the first cathode cap 72 shown in FIG. 11C is configured of a curved surface (for example, a part of spherical surface, elliptical spherical surface, or rotating parabolic surface) that protrudes in the axial direction toward the inside of the arc chamber, and does not have the tip surface configured of the flat surface exposed in the axial direction toward the inside of the arc chamber. In FIG. 11C, the maximum width wa of the thermoelectron emission surface 72*a* in the radial direction corresponds to a diameter of the dome shape in the radial direction, and the tip width of the thermoelectron emission surface 72*a* in the radial direction is zero.

FIG. 11D shows the first cathode cap 72 having a shape in which a column and a truncated cone (or polygonal column and polygonal truncated pyramid) are coaxially overlapped with each other. The thermoelectron emission surface 72*a* of the first cathode cap 72 shown in FIG. 11D includes the tip surface 72*d* configured of the flat surface exposed in the axial direction toward the inside of the arc chamber, a first side surface 72*e*1 configured of the truncated cone surface (or polygonal truncated pyramid surface), and a second side surface 72*e*2 configured of the cylindrical surface (or polygonal cylindrical surface). In FIG. 11D, the maximum width wa of the thermoelectron emission surface 72*a* in the radial direction corresponds to a diameter of the column (or polygonal column), and the tip width wb of the thermoelectron emission surface 72*a* in the radial direction corresponds to the width of the tip surface 72*d* in the radial direction.

FIG. 11E shows the first cathode cap 72 having a shape in which a column and a cone (or polygonal column and a polygonal cone) are coaxially overlapped with each other. The thermoelectron emission surface 72*a* of the first cathode cap 72 shown in FIG. 11E includes the tip surface 72*d* configured of the conical surface (or polygonal conical surface) that protrudes in the axial direction toward the inside of the arc chamber, and the side surface 72*e* configured of the cylindrical surface (or polygonal cylindrical surface). In FIG. 11E, the maximum width wa of the thermoelectron emission surface 72*a* in the radial direction corresponds to a diameter of the column (or polygonal column), and the tip width of the thermoelectron emission surface 72*a* in the radial direction is zero.

FIG. 11F shows the first cathode cap 72 having a shape in which a column and a dome shape are coaxially overlapped with each other. The thermoelectron emission surface 72*a* of the first cathode cap 72 shown in FIG. 11F includes the tip surface 72*d* configured of the curved surface (for example, a part of spherical surface, elliptical spherical surface, or rotating parabolic surface) that protrudes in the axial direction toward the inside of the arc chamber, and the side surface 72*e* configured of the cylindrical surface. In FIG. 11F, the maximum width wa of the thermoelectron emission surface 72*a* in the radial direction corresponds to a diameter of the column, and the tip width of the thermoelectron emission surface 72*a* in the radial direction is zero.

FIG. 11G shows the first cathode cap 72 having a shape in which two columns (or polygonal columns) having different diameters are coaxially overlapped with each other. The thermoelectron emission surface 72*a* of the first cathode cap 72 shown in FIG. 11G includes the tip surface 72*d* configured of the flat surface exposed in the axial direction toward the inside of the arc chamber, the first side surface 72*e*1 configured of the cylindrical surface (or polygonal cylindrical surface) having a smaller diameter, an intermediate end surface **72*f* configured of a ring-shaped flat surface exposed in the axial direction toward the inside of the arc chamber, and the second side surface 72*e*2 configured of the cylindrical surface (or polygonal cylindrical surface) having a larger diameter. In FIG. 11G, the maximum width wa of the thermoelectron emission surface 72*a* in the radial direction corresponds to a diameter of the second side surface 72*e*2, and the tip width wb of the thermoelectron emission surface 72*a* in the radial direction corresponds to the width (diameter of the first side surface 72*e*1) of the tip surface 72*d*** in the radial direction.

FIG. 11H shows the first cathode cap 72 having a shape in which a column (or polygonal column) and a cone having a diameter smaller than the column (or polygonal cone having a diameter smaller than the polygonal column) are coaxially overlapped with each other. The thermoelectron emission surface **72*a* of the first cathode cap 72 shown in FIG. 11H includes the tip surface 72*d* configured of the conical surface (or polygonal conical surface) exposed in the axial direction toward the inside of the arc chamber, the intermediate end surface 72*f* configured of the ring-shaped flat surface exposed in the axial direction toward the inside of the arc chamber, and the side surface 72*e* configured of the cylindrical surface (or polygonal cylindrical surface). In FIG. 11H, the maximum width wa of the thermoelectron emission surface 72*a* in the radial direction corresponds to the diameter of the side surface 72*e*, and the tip width of the thermoelectron emission surface 72*a*** in the radial direction is zero.

FIG. 11I shows the first cathode cap 72 having a shape in which a column (or polygonal column) and a dome shape having a diameter smaller than that of the column (or polygonal column) are coaxially overlapped with each other. The thermoelectron emission surface **72*a* of the first cathode cap 72 shown in FIG. 11I includes the tip surface 72*d* configured of the curved surface (for example, part of spherical surface, elliptical spherical surface, or rotating parabolic surface) that protrudes in the axial direction toward the inside of the arc chamber, the intermediate end surface 72*f* configured of the ring-shaped flat surface exposed in the axial direction toward the inside of the arc chamber, and the side surface 72*e* configured of the cylindrical surface (or polygonal cylindrical surface). In FIG. 11I, the maximum width wa of the thermoelectron emission surface 72*a* in the radial direction corresponds to the diameter of the side surface 72*e*, and the tip width of the thermoelectron emission surface 72*a*** in the radial direction is zero.

FIG. 11J shows the first cathode cap 72 having a shape in which two columns (or two polygonal columns) having different diameters and one truncated cone (or one polygonal truncated pyramid) are coaxially overlapped with each other, and the one truncated cone (or the one polygonal truncated pyramid) connects the two columns (or the two polygonal columns). The thermoelectron emission surface **72*a* of the first cathode cap 72 shown in FIG. 11J includes the tip surface 72*d* configured of the flat surface exposed in the axial direction toward the inside of the arc chamber, the first side surface 72*e*1 configured of the cylindrical surface (or polygonal cylindrical surface) having a smaller diameter, the second side surface 72*e*2 configured of the truncated cone surface (or polygonal truncated pyramid surface), and a third side surface 72*e*3 configured of the cylindrical surface (or polygonal cylindrical surface) having a larger diameter. In FIG. 11J, the maximum width wa of the thermoelectron emission surface 72*a* in the radial direction corresponds to a diameter of the third side surface 72*e*3, and the tip width wb of the thermoelectron emission surface 72*a* in the radial direction corresponds to the width (diameter of the first side surface 72*e*1) of the tip surface 72*d*** in the radial direction.

FIG. 11K shows the first cathode cap 72 having a shape in which a column (or polygonal column), a truncated cone (or polygonal truncated pyramid), and a cone (or polygonal cone) are coaxially overlapped with each other, and the truncated cone (or polygonal truncated pyramid) connects the column (or polygonal column) and the cone (or polygonal cone). The thermoelectron emission surface **72*a* of the first cathode cap 72 shown in FIG. 11K includes the tip surface 72*d* configured of the conical surface (or polygonal conical surface) that protrudes in the axial direction toward the inside of the arc chamber, the first side surface 72*e*1 configured of the truncated cone surface (or polygonal truncated pyramid surface) having an inclination angle different from that of the tip surface 72*d*, and the second side surface 72*e*2 configured of the cylindrical surface (or polygonal cylindrical surface). In FIG. 11K, the maximum width wa of the thermoelectron emission surface 72*a* in the radial direction corresponds to the diameter of the second side surface 72*e*2, and the tip width of the thermoelectron emission surface 72*a*** in the radial direction is zero.

FIG. 11L shows the first cathode cap 72 having a shape in which a column, a truncated cone, and a dome shape are coaxially overlapped with each other, and the truncated cone connects the column and the dome shape. The thermoelectron emission surface **72*a* of the first cathode cap 72 shown in FIG. 11L includes the tip surface 72*d* configured of the curved surface (for example, a part of spherical surface, elliptical spherical surface, or rotating parabolic surface) that protrudes in the axial direction toward the inside of the arc chamber, the first side surface 72*e*1 configured of the truncated cone surface, and the second side surface 72*e*2 configured of the cylindrical surface. In FIG. 11L, the maximum width wa of the thermoelectron emission surface 72*a* in the radial direction corresponds to the diameter of the second side surface 72*e*2, and the tip width of the thermoelectron emission surface 72*a*** in the radial direction is zero.

FIG. 11M shows the first cathode cap 72 having a shape in which an edge of a tip of a column is chamfered. The thermoelectron emission surface **72*a* of the first cathode cap 72 shown in FIG. 11M includes the tip surface 72*d* configured of the flat surface exposed in the axial direction toward the inside of the arc chamber, the first side surface 72*e*1 configured of a curved surface that protrudes obliquely with respect to the axial direction, and the second side surface 72*e*2 configured of the cylindrical surface. In FIG. 11M, the maximum width wa of the thermoelectron emission surface 72*a* in the radial direction corresponds to the diameter of the second side surface 72*e*2, and the tip width wb of the thermoelectron emission surface 72*a* in the radial direction corresponds to the width of the tip surface 72*d*** in the radial direction.

FIG. 11N shows the first cathode cap 72 having a shape in which a tip of a dome shape is cut. The thermoelectron emission surface **72*a* of the first cathode cap 72 shown in FIG. 11N includes the tip surface 72*d* configured of the flat surface exposed in the axial direction toward the inside of the arc chamber and the side surface 72*e* configured of a curved surface that is convex toward the radially outer side and the inner side of the arc chamber. In FIG. 11N, the maximum width wa of the thermoelectron emission surface 72*a* in the radial direction corresponds to the diameter of the dome shape in the radial direction, and the tip width wb of the thermoelectron emission surface 72***a* in the radial direction corresponds to the width of the tip surface 72*d* in the radial direction.

FIG. 11O shows the first cathode cap 72 having a shape in which a truncated cone and a dome shape are coaxially overlapped with each other. The thermoelectron emission surface 72*a* of the first cathode cap 72 shown in FIG. 11O includes the tip surface 72*d* configured of the curved surface (for example, a part of spherical surface, elliptical spherical surface, or rotating parabolic surface) that protrudes in the axial direction toward the inside of the arc chamber, and the side surface 72*e* configured of the truncated cone surface. In FIG. 11O, the maximum width wa of the thermoelectron emission surface 72*a* in the radial direction corresponds to a diameter of the truncated cone (side surface 72*e*), and the tip width of the thermoelectron emission surface 72*a* in the radial direction is zero.

Second Embodiment

Figure 12:
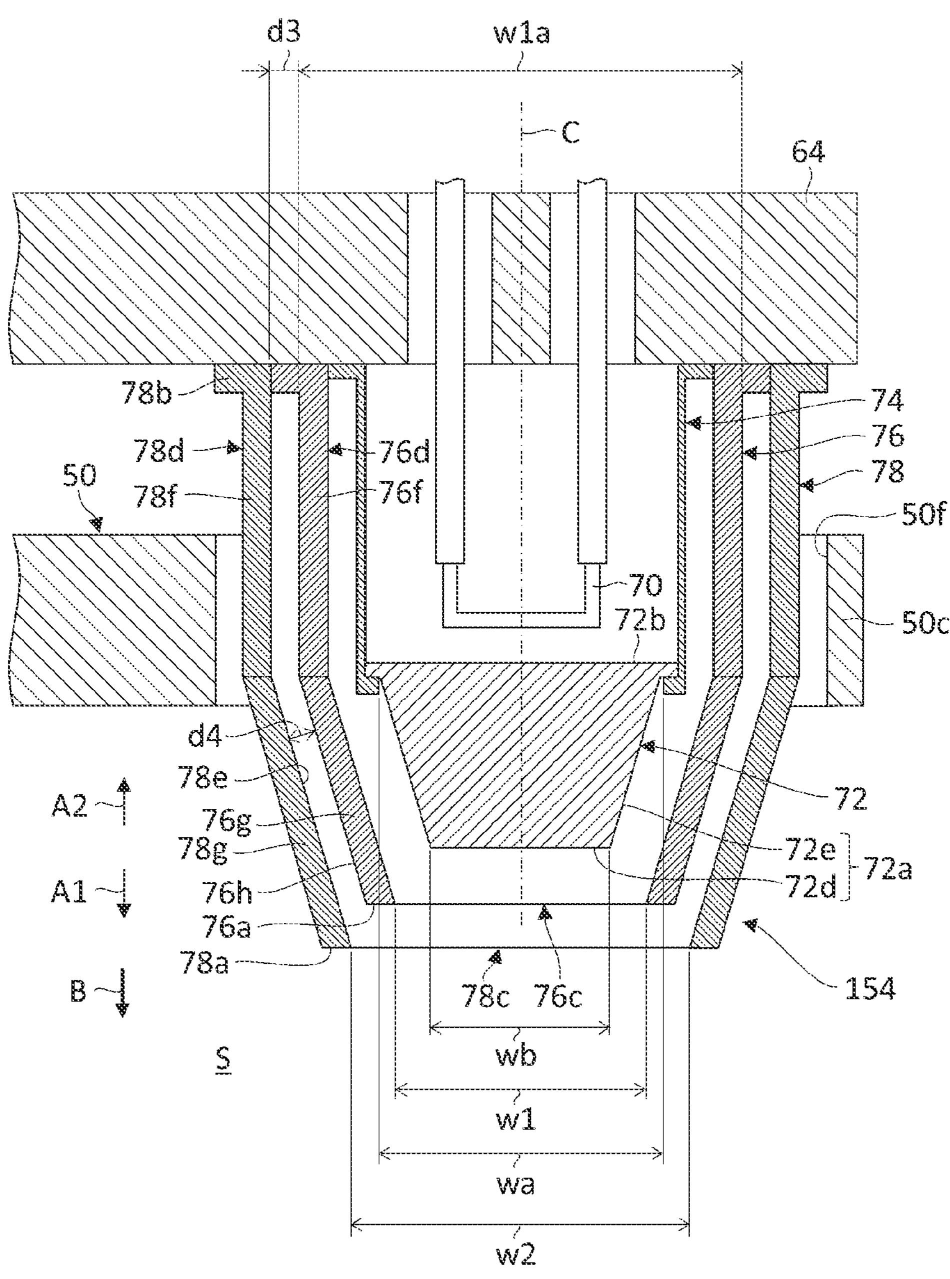
FIG. 12 is a cross-sectional view of a configuration of a first cathode according to a second embodiment in detail.

FIG. 12 is a cross-sectional view of a configuration of a first cathode 154 according to a second embodiment in detail. The first cathode 154 according to the second embodiment is different from the first embodiment in that the first cathode 154 further includes a second thermal shield 78. Hereinafter, in the second embodiment, differences from the first embodiment will be mainly described and description of common points will be omitted as appropriate.

The first cathode 154 includes the first heat source 70, the first cathode cap 72, the first thermal break 74, the first thermal shield 76, and the second thermal shield 78. The first heat source 70, the first cathode cap 72, the first thermal break 74, and the first thermal shield 76 are configured in the same manner as in the first embodiment.

The second thermal shield 78 extends in the axial direction in the tubular shape on the radially outer side of the first thermal shield 76. The second thermal shield 78 reflects heat radiation from the first thermal shield 76 which is in a high temperature state, and suppresses heat escape from the first thermal shield 76 to promote a rise in temperature of the first thermal shield 76. With the promotion of the rise in temperature of the first thermal shield 76, the second thermal shield 78 promotes the rise in temperatures of the first cathode cap 72 and the first thermal break 74. In the second embodiment, a potential of the second thermal shield 78 is the same as potentials of the first cathode cap 72, the first thermal break 74, and the first thermal shield 76.

The second thermal shield 78 has the shape rotationally symmetric with respect to the axial direction, and is disposed to be coaxial with the center axis C, for example. The second thermal shield 78 includes a second tip portion 78*a* that protrudes in the direction of the arrow A1 toward the inside of the arc chamber 50, and a second terminal portion 78*b* that protrudes in the direction of the arrow A2 toward the outside of the arc chamber 50.

The second tip portion 78*a* shown in FIG. 12 protrudes toward the inside of the arc chamber 50 more than the first tip portion 76*a* of the first thermal shield 76. That is, a position of the second tip portion 78*a* in the axial direction is closer to the inner side of the arc chamber 50 than the position of the first tip portion 76*a* in the axial direction. The second terminal portion 78*b* is attached to the first cathode support member 64. In a modification example, the second terminal portion 78*b* may be attached to the first thermal shield 76 or the first thermal break 74.

The second thermal shield 78 has a second tip opening 78*c* that opens in the axial direction at the second tip portion 78*a*. The second tip opening 78*c* allows the thermoelectron, which is supplied from the first cathode cap 72 toward the internal space S, to pass therethrough. A second opening width w2 of the second tip opening 78*c* in the radial direction is larger than the first opening width w1 of the first tip opening 76*c* in the radial direction. The second opening width w2 of the second tip opening 78*c* shown in FIG. 12 is larger than the maximum width wa of the thermoelectron emission surface 72*a* in the radial direction. The second opening width w2 of the second tip opening 78*c* in the radial direction is smaller than the maximum width w1a of the outer surface 76*h* in the first extension portion 76*d* of the first thermal shield 76 in the radial direction.

The second thermal shield 78 has a second extension portion 78*d* that extends in the axial direction in the tubular shape from the second terminal portion 78*b* toward the second tip portion 78*a*. The second extension portion 78*d* is adjacent to the first extension portion 76*d* of the first thermal shield 76 with a gap in the radial direction. The second extension portion 78*d* has a second cylindrical portion 78*f* and a second tapered portion 78*g*.

The second cylindrical portion 78*f* is a portion where a width of an inner surface 78*e* of the second extension portion 78*d* in the radial direction is constant, and is disposed adjacent to the first cylindrical portion 76*f* of the first thermal shield 76 with a gap in the radial direction. The second cylindrical portion 78*f* is configured such that at least the inner surface 78*e* has a cylindrical shape. The second cylindrical portion 78*f* is configured such that, for example, a distance d3 from the inner surface 78*e* of the second extension portion 78*d* to the outer surface 76*h* of the first extension portion 76*d* is constant. A length of the second cylindrical portion 78*f* in the axial direction shown in FIG. 12 is the same as a length of the first cylindrical portion 76*f* in the axial direction. In the modification example, the length of the second cylindrical portion 78*f* in the axial direction may be larger or smaller than the length of the first cylindrical portion 76*f* in the axial direction.

The second tapered portion 78*g* is a portion where the width of the inner surface 78*e* of the second extension portion 78*d* in the radial direction changes in the axial direction, and is a portion where the width of the inner surface 78*e* of the second extension portion 78*d* in the radial direction decreases toward the inside of the arc chamber 50. The second tapered portion 78*g* is disposed adjacent to the first tapered portion 76*g* of the first thermal shield 76 with a gap in the radial direction, and is disposed along the first tapered portion 76*g*. The second tapered portion 78*g* is configured such that at least the inner surface 78*e* has a conical shape. The second tapered portion 78*g* shown in FIG. 12 is configured such that a distance d4 from the inner surface 78*e* of the second extension portion 78*d* to the outer surface 76*h* of the first extension portion 76*d* is constant. In the modification example, the distance d4 may change according to the position in the axial direction, may be configured to decrease toward the inside of the arc chamber 50, or may be configured to increase toward the inside of the arc chamber 50. A length of the second tapered portion 78*g* in the axial direction shown in FIG. 12 is larger than a length of the first tapered portion 76*g* in the axial direction. In the modification example, the length of the second tapered portion 78*g* in the axial direction may be the same as or smaller than the length of the first tapered portion 76*g* in the axial direction.

In the second embodiment, with employment of the features (1) and (2) in combination, a larger number of multiply charged ions are generated under the low arc condition. Specifically, with use of the plurality of thermal shields 76 and 78 in combination, it is possible to promote the rise in temperature of the first cathode cap 72 as compared with a case where one thermal shield 76 is used. Furthermore, with use of the first thermal shield 76 to narrow the range in which the thermoelectron is emitted from the first cathode cap 72 toward the internal space S of the arc chamber 50, it is possible to generate the higher-density plasma in the narrower range.

Modification Examples According to Second Embodiment

Hereinafter, modification examples of the first cathode 154 according to the second embodiment will be shown with reference to FIGS. 13A to 16B. Hereinafter, while showing structures of the first cathode cap 72, the first thermal shield 76, and the second thermal shield 78, differences from the contents described in the above-described embodiments will be mainly described, and description of common points will be omitted as appropriate.

Figure 13A:
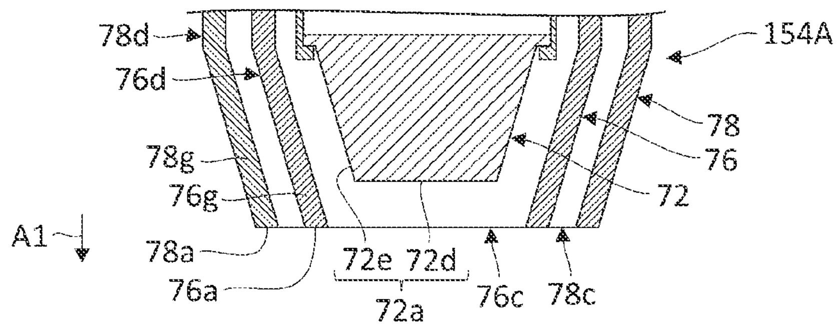
FIGS. 13A to 13C are cross-sectional views schematically showing a configuration of a first cathode according to a modification example of the second embodiment.
Figure 13B:
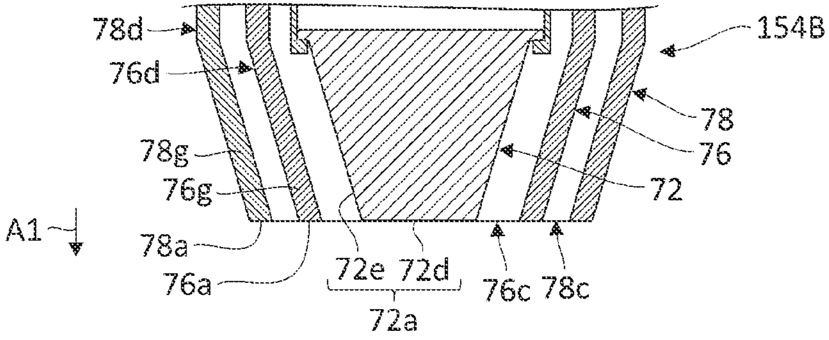
Figure 13C:
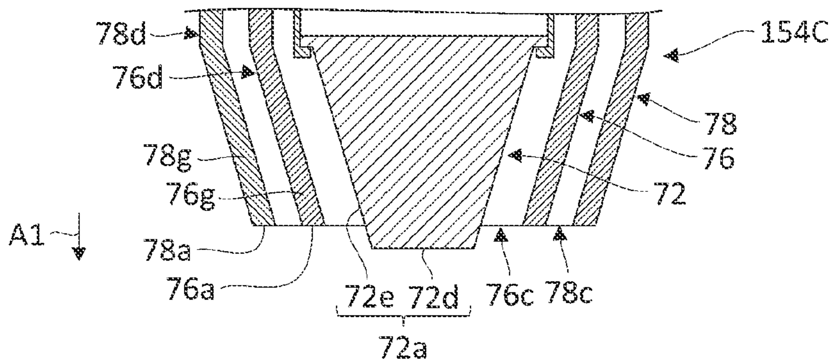

FIGS. 13A to 13C are cross-sectional views schematically showing configurations of first cathodes 154A, 154B, and 154C according to the modification example. In the first cathode 154A shown in FIG. 13A, the positions of the first tip portion 76*a* and the second tip portion 78*a* in the axial direction are the same, and the first tip portion 76*a* and the second tip portion 78*a* protrude toward the inside of the arc chamber more than the tip (tip surface 72*d*) of the first cathode cap 72. In the first cathode 154B shown in FIG. 13B, the positions of the tip (tip surface 72*d*) of the first cathode cap 72, the first tip portion 76*a*, and the second tip portion 78*a* in the axial direction are the same. In the first cathode 154C shown in FIG. 13C, the positions of the first tip portion 76*a* and the second tip portion 78*a* in the axial direction are the same, and the tip (tip surface 72*d*) of the first cathode cap 72 protrudes toward the inside of the arc chamber more than the first tip portion 76*a* and the second tip portion 78*a*.

Figure 14A:
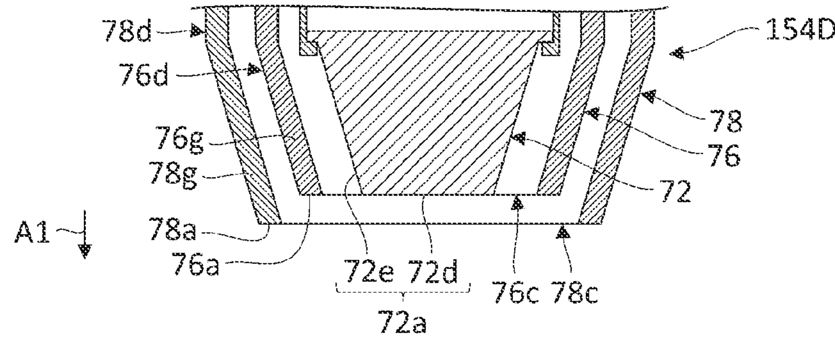
FIGS. 14A to 14C are cross-sectional views schematically showing a configuration of a first cathode according to the modification example of the second embodiment.
Figure 14B:
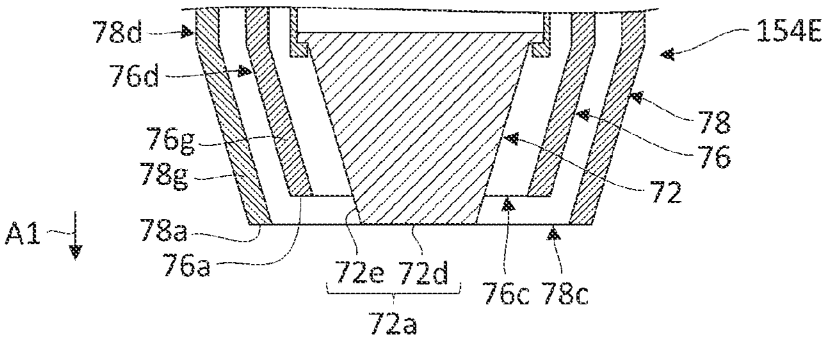
Figure 14C:
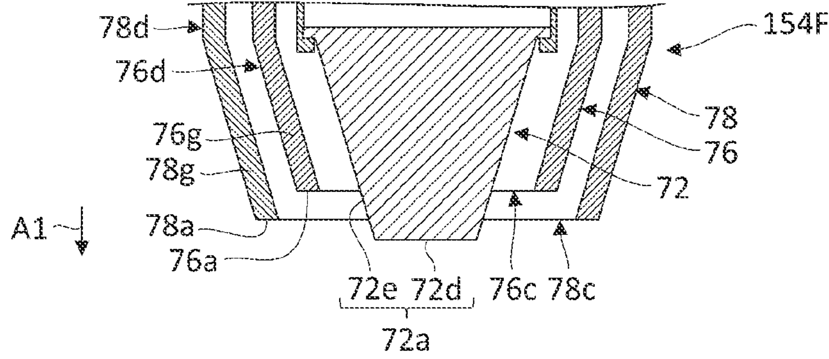

FIGS. 14A to 14C are cross-sectional views schematically showing configurations of first cathodes 154D, 154E, and 154F according to the modification example. In the first cathode 154D shown in FIG. 14A, the positions of the tip (tip surface 72*d*) of the first cathode cap 72 and the first tip portion 76*a* in the axial direction are the same, and the second tip portion 78*a* protrudes toward the inside of the arc chamber more than the tip (tip surface 72*d*) of the first cathode cap 72 and the first tip portion 76*a*. In the first cathode 154E shown in FIG. 14B, the positions of the tip (tip surface 72*d*) of the first cathode cap 72 and the second tip portion 78*a* in the axial direction are the same, and the tip (tip surface 72*d*) of the first cathode cap 72 and the second tip portion 78*a* protrude toward the inside of the arc chamber more than the first tip portion 76*a*. In the first cathode 154F shown in FIG. 14C, the second tip portion 78*a* protrudes toward the inside of the arc chamber more than the first tip portion 76*a*, and the tip (tip surface 72*d*) of the first cathode cap 72 protrudes toward the inside of the arc chamber more than the second tip portion 78*a*.

Figure 15A:
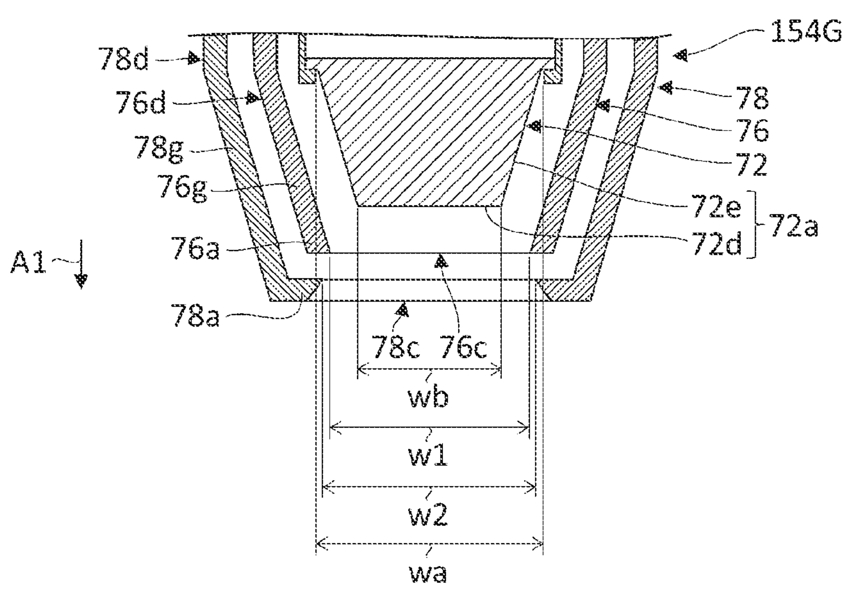
FIGS. 15A and 15B are cross-sectional views schematically showing a configuration of a first cathode according to the modification example of the second embodiment.
Figure 15B:
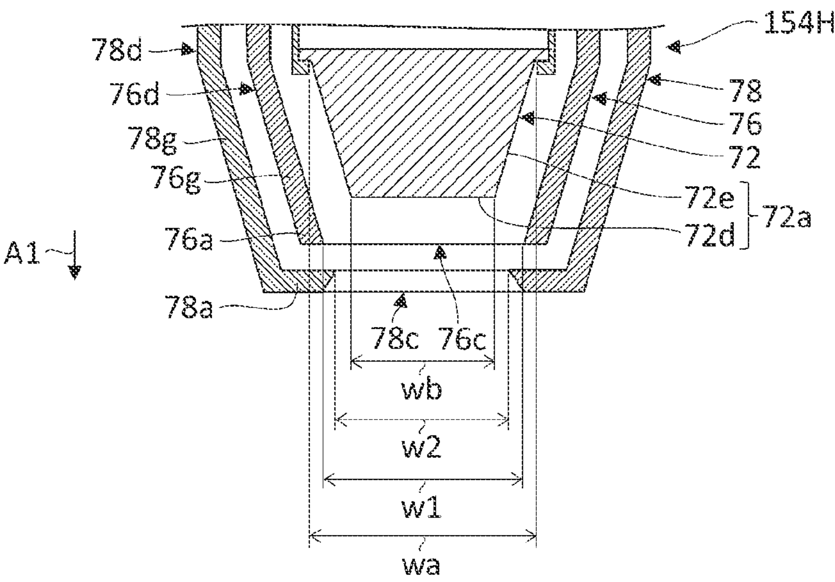

FIGS. 15A and 15B are cross-sectional views schematically showing configurations of first cathodes 154G and 154H according to the modification example. In the first cathodes 154G and 154H shown in FIGS. 15A and 15B, the second tip portion 78*a* of the second thermal shield 78 is configured to extend on the radially inner side. Further, the second tip opening 78*c* has the tapered shape whose opening width in the radial direction increases toward the inside of the arc chamber.

In FIG. 15A, the second opening width w2 of the second tip opening 78*c* in the radial direction is configured to be smaller than the maximum width wa of the thermoelectron emission surface 72*a* of the first cathode cap 72, and to be larger than the first opening width w1 of the first tip opening 76*c* in the radial direction and the tip width wb of the thermoelectron emission surface 72*a* of the first cathode cap 72 in the radial direction (width wb of the tip surface 72*d* in the radial direction). In a further modification example, the second opening width w2 of the second tip opening 78*c* may be the same as the first opening width w1 of the first tip opening 76*c*. That is, the second opening width w2 of the second tip opening 78*c* may be equal to or larger than the first opening width w1 of the first tip opening 76*c*.

In FIG. 15B, the second opening width w2 of the second tip opening 78*c* in the radial direction is configured to be smaller than the maximum width wa of the thermoelectron emission surface 72*a* of the first cathode cap 72 and the first opening width w1 of the first tip opening 76*c* in the radial direction, and to be larger than the tip width wb of the thermoelectron emission surface 72*a* of the first cathode cap 72 in the radial direction (width wb of the tip surface 72*d* in the radial direction). In this case, the second tip opening 78*c* is also configured to narrow the pass-through range of the thermoelectron emitted from the thermoelectron emission surface 72*a*, similarly to the first tip opening 76*c*. In a further modification example, the second opening width w2 of the second tip opening 78*c* may be the same as or smaller than the tip width wb of the thermoelectron emission surface 72*a* of the first cathode cap 72 in the radial direction (width wb of the tip surface 72*d* in the radial direction).

In FIGS. 15A and 15B, the second opening width w2 of the second tip opening 78*c* is adjusted by the second tip portion 78*a* that extends on the radially inner side. In a further modification example, in a configuration in which the second tip portion 78*a* does not extend on the radially inner side, that is, in the configurations as shown in FIGS. 12 to 14C, the second opening width w2 may be set to be the same as or smaller than any one of the maximum width wa of the thermoelectron emission surface 72*a* of the first cathode cap 72, the tip width wb (width wb of the tip surface 72*d* in the radial direction) thereof, and the first opening width w1 of the first tip opening 76*c*.

Figure 16A:
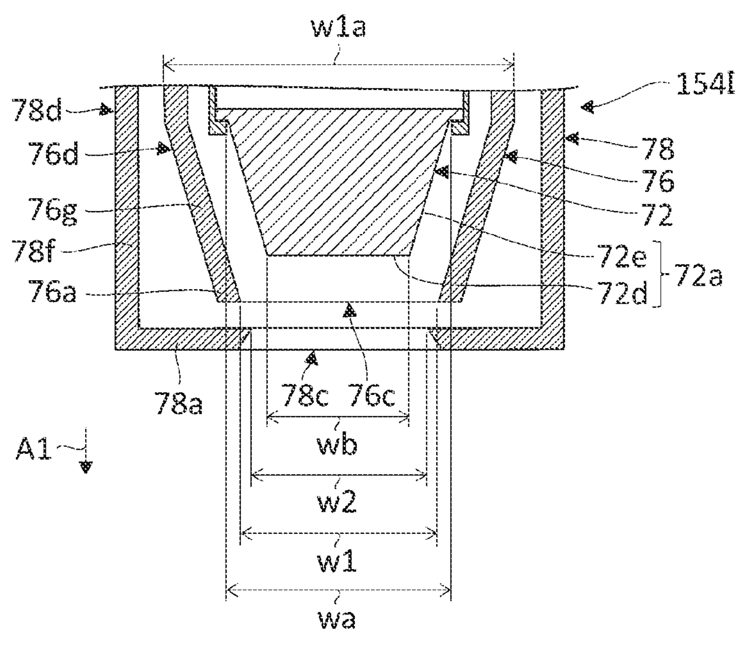
FIGS. 16A and 16B are cross-sectional views schematically showing a configuration of a first cathode according to the modification example of the second embodiment.
Figure 16B:
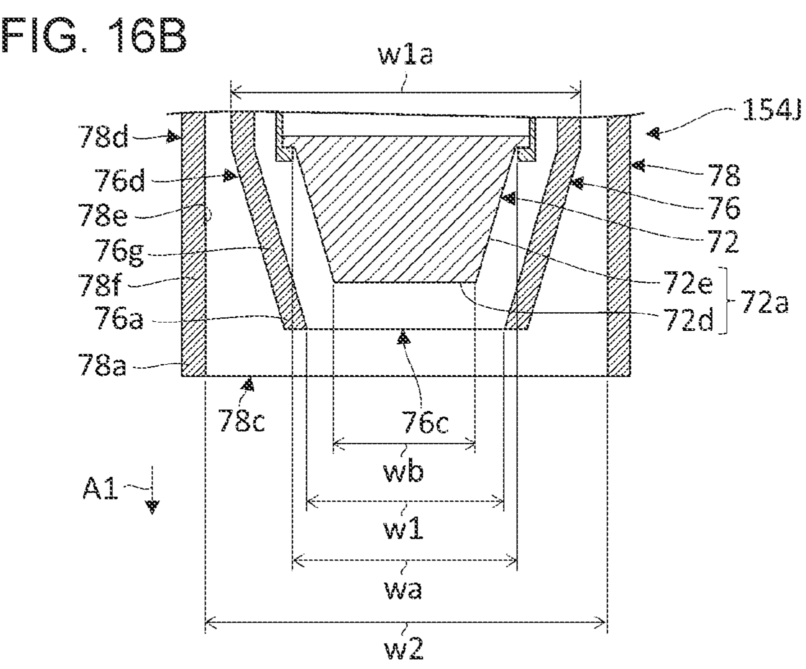

FIGS. 16A and 16B are cross-sectional views schematically showing configurations of first cathodes 154I and 154J according to the modification example. In the first cathodes 154I and 154J shown in FIGS. 16A and 16B, the second extension portion 78*d* of the second thermal shield 78 has the second cylindrical portion 78*f* but does not have the second tapered portion 78*g*. In FIGS. 16A and 16B, the second cylindrical portion 78*f* is adjacent to the first tapered portion 76*g* with a gap in the radial direction, and the second tip portion 78*a* is provided at a tip of the second cylindrical portion 78*f*.

In FIG. 16A, the second tip portion 78*a* extends on the radially inner side from the second cylindrical portion 78*f*. Further, the second tip opening 78*c* has the tapered shape whose opening width in the radial direction increases toward the inside of the arc chamber. In FIG. 16A, the second opening width w2 of the second tip opening 78*c* in the radial direction is smaller than the first opening width w1 of the first tip opening 76*c* in the radial direction, and is larger than the tip width wb of the thermoelectron emission surface 72*a* of the first cathode cap 72 in the radial direction (width wb of the tip surface 72*d* in the radial direction). In this case, the second tip opening 78*c* is also configured to narrow the pass-through range of the thermoelectron emitted from the thermoelectron emission surface 72*a*, similarly to the first tip opening 76*c*. In a further modification example, the second opening width w2 of the second tip opening 78*c* may be the same as or smaller than the tip width wb of the thermoelectron emission surface 72*a* of the first cathode cap 72 in the radial direction (width wb of the tip surface 72*d* in the radial direction). The second opening width w2 of the second tip opening 78*c* may be the same as or larger than the first opening width w1 of the first tip opening 76*c*. In this case, the second opening width w2 of the second tip opening 78*c* may be smaller than, the same as, or larger than the maximum width w1a of the first extension portion 76*d* of the first thermal shield 76 in the radial direction.

In FIG. 16B, the second tip portion 78*a* does not extend on the radially inner side from the second cylindrical portion 78*f*. Therefore, in FIG. 16B, the second opening width w2 of the second tip opening 78*c* in the radial direction corresponds to the width of the inner surface 78*e* of the second extension portion 78*d* in the radial direction, and is larger than the maximum width w1a of the first extension portion 76*d* in the radial direction.

In a further modification example of the second embodiment, a shape similar to the shape of the first thermal shield 76 shown in FIGS. 9A, 10A, and 10B may be employed as a shape of the second thermal shield 78. Further, as a shape of the first cathode cap 72, the first cathode cap 72 shown in FIGS. 11A to 11O may be employed. Furthermore, also in the second embodiment, the feature relating to the disposition of the first cathode cap 72 and the first thermal shield 76 shown in FIGS. 3 to 10B and the feature relating to the shape of the first thermal shield 76 shown in FIGS. 3 to 10B can be used in combination as appropriate.

Third Embodiment

Figure 17:
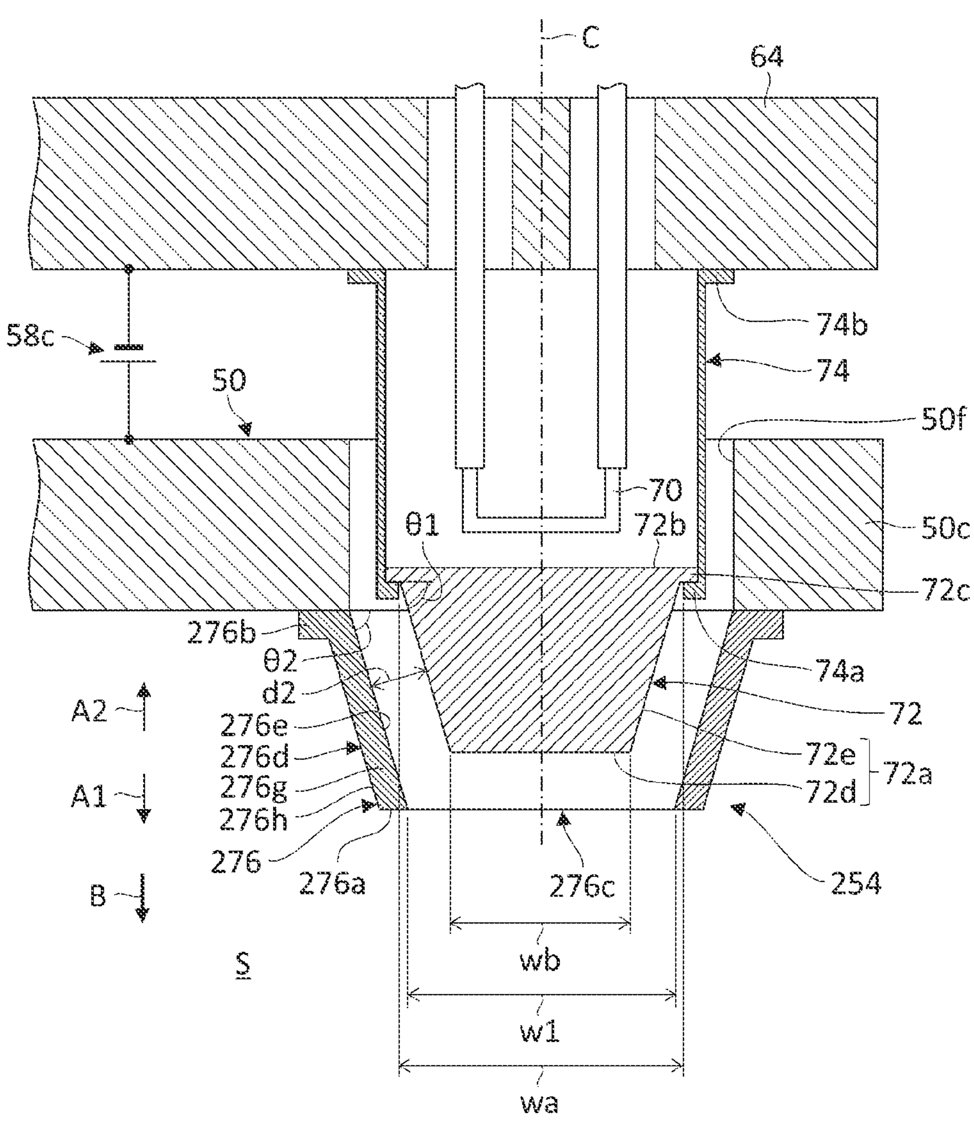
FIG. 17 is a cross-sectional view of the configuration of a first cathode according to a third embodiment in detail.

FIG. 17 is a cross-sectional view of the configuration of a first cathode 254 according to a third embodiment in detail. The first cathode 254 according to the third embodiment is different from the first embodiment in that a first thermal shield 276 is attached to the arc chamber 50. Hereinafter, in the third embodiment, differences from the first embodiment will be mainly described and description of common points will be omitted as appropriate.

The first cathode 254 includes the first heat source 70, the first cathode cap 72, the first thermal break 74, and the first thermal shield 276. The first heat source 70, the first cathode cap 72, and the first thermal break 74 are configured in the same manner as in the first embodiment.

The first thermal shield 276 is provided on the radially outer side of the first cathode cap 72. The first thermal shield 276 includes a first tip portion 276*a* that protrudes in the direction of the arrow A1 toward the inside of the arc chamber 50, and a first terminal portion 276*b* that protrudes in the direction of the arrow A2 toward the outside of the arc chamber 50. The first tip portion 276*a* protrudes toward the inside of the arc chamber 50 more than the first cathode cap 72. That is, a position of the first tip portion 276*a* in the axial direction is closer to the inner side of the arc chamber 50 than the position of a tip (tip surface 72*d*) of the first cathode cap 72 in the axial direction. The first terminal portion 276*b* is attached to the arc chamber 50, and is attached to, for example, the first end wall 50*c* of the arc chamber 50. The first thermal shield 276 may be configured to be integrated with the first end wall 50*c*, or may be configured to extend in the axial direction from the first end wall 50*c* toward the inside of the arc chamber 50.

The first thermal shield 276 has a first tip opening 276*c* that opens in the axial direction at the first tip portion 276*a*. The first tip opening 276*c* allows the thermoelectron, which is supplied from the first cathode cap 72 toward the internal space S, to pass therethrough. The first opening width w1 of the first tip opening 276*c* in the radial direction is smaller than the maximum width of the first cathode cap 72 in the radial direction (width at the position of the flange 72*c* in the radial direction), and is smaller than the maximum width wa of the thermoelectron emission surface 72*a* in the radial direction. The first opening width w1 of the first tip opening 276*c* is larger than the tip width wb of the thermoelectron emission surface 72*a* in the radial direction (width wb of the tip surface 72*d* in the radial direction).

The first thermal shield 276 has a first extension portion 276*d* that extends in the axial direction in the tubular shape from the first terminal portion 276*b* toward the first tip portion 276*a*. The first extension portion 276*d* is adjacent to the first cathode cap 72 with a gap in the radial direction. The first extension portion 276*d* includes a first tapered portion 276*g* where a width of the inner surface 276*e* of the first extension portion 276*d* in the radial direction decreases toward the inside of the arc chamber 50. The entire first extension portion 276*d* is configured to be the first tapered portion 276*g*. The first tapered portion 276*g* is disposed adjacent to the first cathode cap 72 with a gap in the radial direction, and is disposed along the thermoelectron emission surface 72*a* (side surface 72*e*) of the first cathode cap 72. The first tapered portion 276*g* is configured such that at least the inner surface 276*e* has the truncated cone shape. The first tapered portion 276*g* is configured such that, for example, a distance d2 from the inner surface 276*e* of the first extension portion 276*d* to the first cathode cap 72 is constant. For example, an inclination angle θ2 of the inner surface 276*e* of the first tapered portion 276*g* with respect to the radial direction is the same as an inclination angle θ1 of the side surface 72*e* of the first cathode cap 72 with respect to the radial direction. The first tapered portion 276*g* may be configured such that the outer surface 276*h* has the truncated cone shape.

In the third embodiment, a potential of the first thermal shield 276 is the same as a potential of the arc chamber 50. The arc voltage supplied by the first arc power supply 58*c* is applied between the arc chamber 50 and the first cathode cap 72. Therefore, the potential of the first thermal shield 276 is different from the potentials of the first cathode cap 72 and the first thermal break 74, and is higher than the potentials of the first cathode cap 72 and the first thermal break 74 by an amount of the arc voltage. The potential (that is, arc voltage) of the first thermal shield 276 with respect to the first cathode cap 72 and the first thermal break 74 is, for example, +30 V to +150 V.

In the third embodiment, with employment of the feature (3), a larger number of multiply charged ions are generated under the low arc condition. Specifically, with the applying of the voltage (here, equal to arc voltage) for extracting the thermoelectron to the first thermal shield 276, it is possible to more efficiently extract the thermoelectron from the first cathode cap 72 toward the inside of the arc chamber 50. As a result, it is possible to supply a larger number of thermoelectrons toward the internal space S of the arc chamber 50, as compared with a case where the potentials of the first thermal shield 276 and the first cathode cap 72 are the same, and to generate the higher-density plasma even under the low arc condition.

According to the third embodiment, with the protruding of the first tip portion 276*a* of the first thermal shield 276 toward the inside of the arc chamber 50 more than the tip (tip surface 72*d*) of the first cathode cap 72, it is possible to more efficiently extract the thermoelectron emitted from the tip (tip surface 72*d*) of the first cathode cap 72. Accordingly, it is possible to supply a larger number of thermoelectrons toward the internal space S of the arc chamber 50, as compared with a configuration where the tip (tip surface 72*d*) of the first cathode cap 72 protrudes toward the inside of the arc chamber 50 more than the first tip portion 276*a*.

In the third embodiment, with further employment of the feature (1) in combination, a larger number of multiply charged ions can be generated under the low arc condition. Specifically, with the first opening width w1 of the first tip portion 276*a* of the first thermal shield 276 in the radial direction to be made smaller than the maximum width wa of the thermoelectron emission surface 72*a* in the radial direction, it is possible to supply a larger number of thermoelectrons to the narrower range of the internal space S of the arc chamber 50 and to generate the higher-density plasma.

Modification Examples According to Third Embodiment

Also in the third embodiment, a structure similar to the structure of the first thermal shield 76 in the modification example according to the first embodiment can be employed. In the first thermal shield 276, the distance d2 from the inner surface 276*e* of the first thermal shield 276 to the first cathode cap 72 may change according to the position in the axial direction. The distance d2 from the inner surface 276*e* of the first thermal shield 276 to the first cathode cap 72 may be configured to decrease toward the inside of the arc chamber as shown in FIG. 6A. The distance d2 from the inner surface 276*e* of the first thermal shield 276 to the first cathode cap 72 may be configured to increase toward the inside of the arc chamber as shown in FIG. 6B.

In the first thermal shield 276, the first opening width w1 of the first tip portion 276*a* in the radial direction is configured to be the same as the tip width wb of the thermoelectron emission surface 72*a* in the radial direction (width wb of the tip surface 72*d* in the radial direction), as in FIG. 7A. In the first thermal shield 276, the first opening width w1 of the first tip portion 276*a* in the radial direction is configured to be smaller than the tip width wb of the thermoelectron emission surface 72*a* in the radial direction (width wb of the tip surface 72*d* in the radial direction), as in FIG. 7B.

The first thermal shield 276 may be configured such that the first tip portion 276*a* extends on the radially inner side, as in FIG. 8A. In this case, the first tip opening 276*c* may have the tapered shape whose opening width in the radial direction increases toward the inside of the arc chamber. The first opening width w1 of the first tip opening 276*c* in the radial direction may be smaller than, the same as, or larger than the tip width wb of the thermoelectron emission surface 72*a* in the radial direction (width wb of the tip surface 72*d* in the radial direction).

The first thermal shield 276 may be configured such that only the inner surface 276*e* of the first tapered portion 276*g* has the tapered shape and an outer surface of the first tapered portion 276*g* does not have the tapered shape, as in FIG. 9A. The first thermal shield 276 may be configured such that the first extension portion 276*d* includes only the first cylindrical portion and does not include the first tapered portion 276*g*, as in FIG. 9B. In this case, the first tip portion 276*a* may be configured to extend on the radially inner side. The first tip opening 276*c* may have the tapered shape whose opening width in the radial direction increases toward the inside of the arc chamber.

In the first thermal shield 276, the first tapered portion 276*g* may be configured in the dome shape, as in FIG. 10A. That is, the inner surface 276*e* and the outer surface 276*h* of the first tapered portion 276*g* may be configured of curved surfaces that are convex toward the radially outer side and the inner side of the arc chamber. The inner surface 276*e* and the outer surface 276*h* of the first tapered portion 276*g* may be configured to be a part of a spherical surface, an elliptical spherical surface, or a rotating parabolic surface.

Figure 18A:
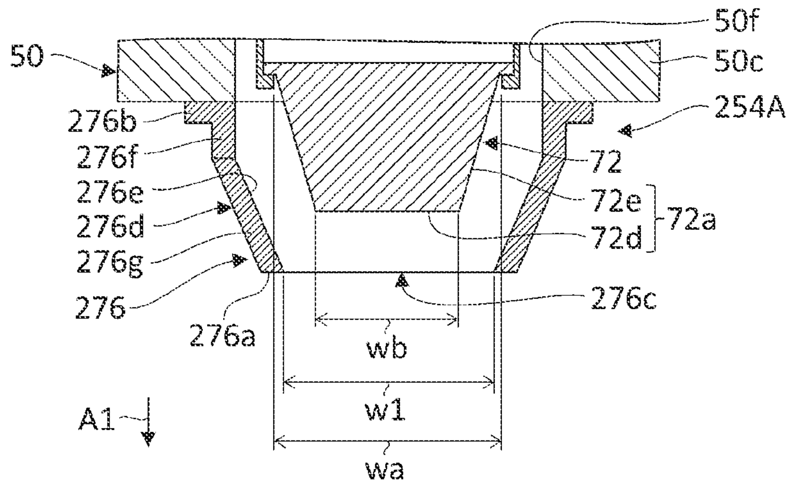
FIGS. 18A and 18B are cross-sectional views schematically showing a configuration of a first cathode according to a modification example of the third embodiment.
Figure 18B:
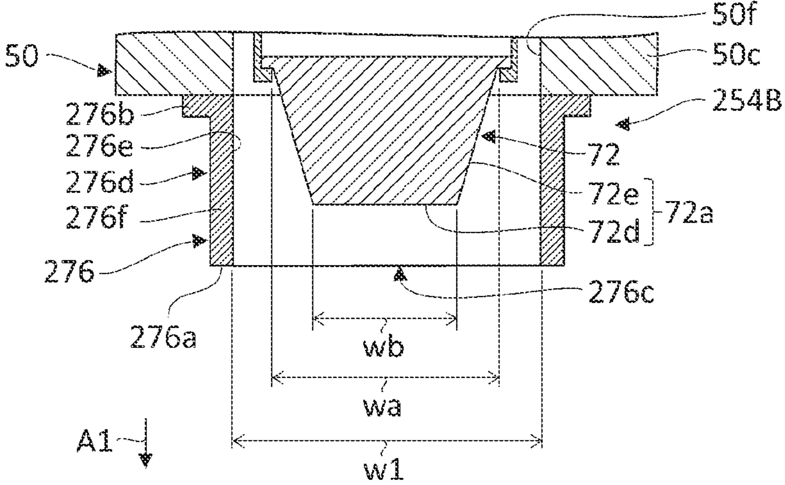

FIGS. 18A and 18B are cross-sectional views schematically showing configurations of first cathodes 254A and 254B according to the modification example. In the first cathode 254A shown in FIG. 18A, the first extension portion 276*d* of the first thermal shield 276 has a first cylindrical portion 276*f* and the first tapered portion 276*g*. The first cylindrical portion 276*f* is a portion where the width of the inner surface 276*e* of the first extension portion 276*d* in the radial direction is constant. The first cylindrical portion 276*f* is provided closer to an outer side of the arc chamber than the first tapered portion 276*g*. The first terminal portion 276*b* is provided at a terminal of the first cylindrical portion 276*f*. The first tapered portion 276*g* is provided closer to an inner side of the arc chamber than the first cylindrical portion 276*f*. The first tip portion 276*a* is provided at a tip of the first tapered portion 276*g*.

In FIG. 18A, the first opening width w1 of the first tip opening 276*c* in the radial direction is smaller than the maximum width wa of the thermoelectron emission surface 72*a* of the first cathode cap 72 in the radial direction, and is larger than the tip width wb of the thermoelectron emission surface 72*a* in the radial direction (width wb of the tip surface 72*d* in the radial direction). The first opening width w1 of the first tip opening 276*c* may be the same as or larger than the maximum width wa of the thermoelectron emission surface 72*a* in the radial direction. The first opening width w1 of the first tip opening 276*c* may be the same as or smaller than the tip width wb of the thermoelectron emission surface 72*a* in the radial direction (width wb of the tip surface 72*d* in the radial direction).

In the first cathode 254B shown in FIG. 18B, the first extension portion 276*d* of the first thermal shield 276 includes the first cylindrical portion 276*f*, but does not include the first tapered portion (for example, 276*g* in FIG. 18A). The first extension portion 276*d* is configured such that the width of the inner surface 276*e* of the first extension portion 276*d* in the radial direction is constant. The first tip portion 276*a* is provided at a tip of the first cylindrical portion 276*f*. The first terminal portion 276*b* is provided at the terminal of the first cylindrical portion 276*f*. In FIG. 18B, the first opening width w1 of the first tip opening 276*c* in the radial direction is larger than the maximum width wa of the thermoelectron emission surface 72*a* of the first cathode cap 72 in the radial direction.

In a further modification example of the third embodiment, as the shape of the first cathode cap 72, the shapes of the first cathode cap 72 shown in FIGS. 11A to 11O may be employed.

In a further modification example of the third embodiment, the potential of the first thermal shield 276 may be different from the potential of the arc chamber 50. In this case, the first thermal shield 276 may be attached to the first end wall 50*c* via an electrically insulating member provided between the first thermal shield 276 and the arc chamber 50. The potential of the first thermal shield 276 may be lower than the potential of the arc chamber 50. For example, the potential of the arc chamber 50 with respect to the first cathode cap 72 may be +30 V to +150 V, while the potential of the first thermal shield 276 with respect to the first cathode cap 72 may be +5 V to +100 V.

Fourth Embodiment

Figure 19:
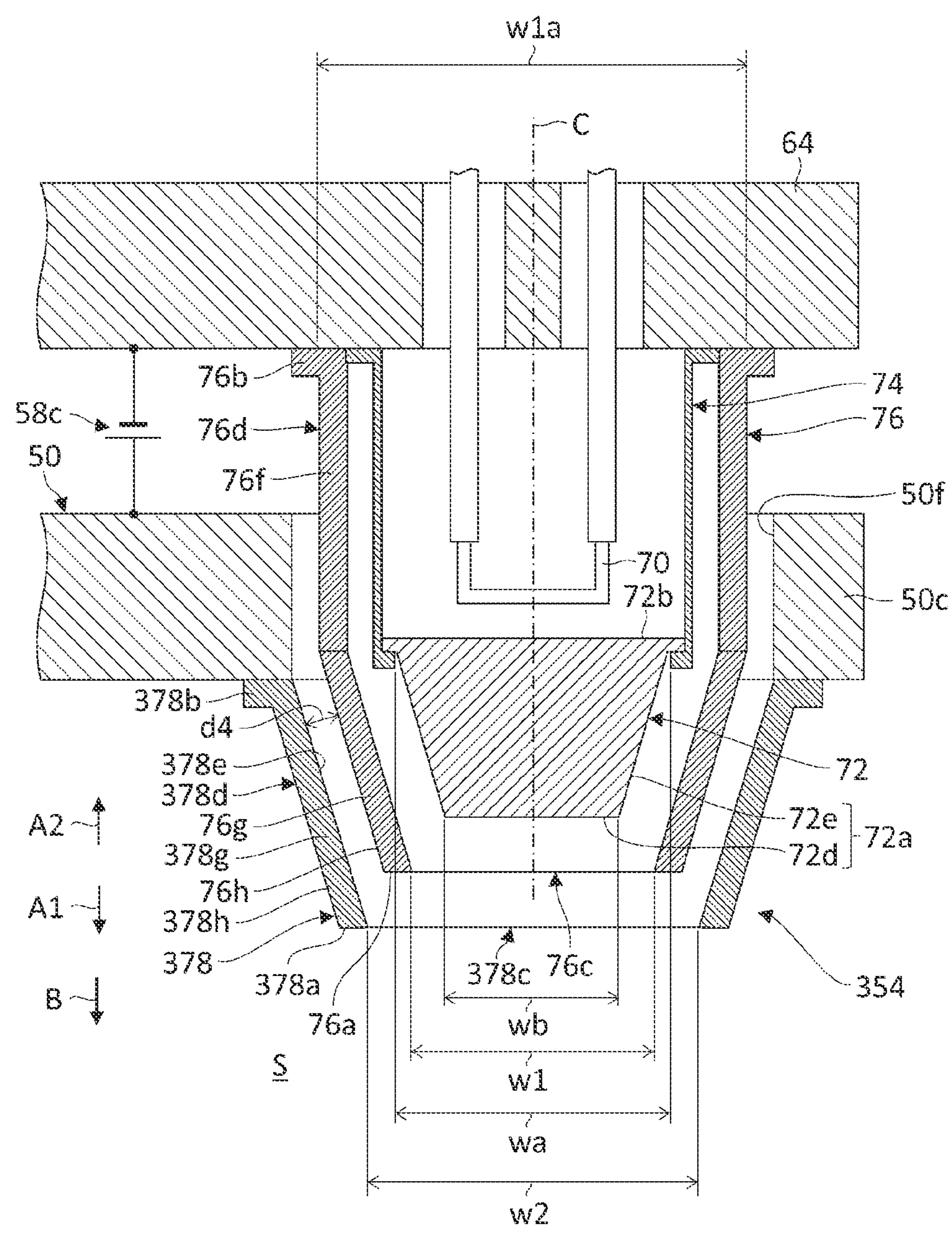
FIG. 19 is a cross-sectional view of a configuration of a first cathode according to a fourth embodiment in detail.

FIG. 19 is a cross-sectional view of a configuration of a first cathode 354 according to a fourth embodiment in detail. The first cathode 354 according to the fourth embodiment is different from the first embodiment and the second embodiment in that the first cathode 354 includes a second thermal shield 378 attached to the arc chamber 50. Hereinafter, in the fourth embodiment, differences from the first embodiment will be mainly described and description of common points will be omitted as appropriate.

The first cathode 354 includes the first heat source 70, the first cathode cap 72, the first thermal break 74, the first thermal shield 76, and the second thermal shield 378. The first heat source 70, the first cathode cap 72, the first thermal break 74, and the first thermal shield 76 are configured in the same manner as in the first embodiment.

The second thermal shield 378 extends in the axial direction in the tubular shape on the radially outer side of the first thermal shield 76. The second thermal shield 378 has the shape rotationally symmetric with respect to the axial direction, and is disposed to be coaxial with the center axis C shown in FIG. 4, for example. The second thermal shield 378 reflects heat radiation from the first thermal shield 76 which is in a high temperature state, and suppresses heat escape from the first thermal shield 76 to promote a rise in temperature of the first thermal shield 76. With the promotion of the rise in temperature of the first thermal shield 76, the second thermal shield 378 promotes the rise in temperatures of the first thermal break 74 and the first cathode cap 72.

In the fourth embodiment, a potential of the second thermal shield 378 is the same as the potential of the arc chamber 50, and the potential of the first thermal shield 76 is the same as the potential of the first cathode cap 72. The arc voltage supplied by the first arc power supply 58*c* is applied between the arc chamber 50 and the first cathode cap 72. Therefore, the potential of the second thermal shield 378 is different from the potentials of the first cathode cap 72, the first thermal break 74, and the first thermal shield 76, and is higher than the potentials of the first cathode cap 72, the first thermal break 74, and the first thermal shield 76 by an amount of the arc voltage. The potential (that is, the arc voltage) of the second thermal shield 378 with respect to the first cathode cap 72, the first thermal break 74, and the first thermal shield 76 is, for example, +30 V to +150 V.

The second thermal shield 378 includes a second tip portion 378*a* that protrudes in the direction of the arrow A1 toward the inside of the arc chamber 50, and a second terminal portion 378*b* that protrudes in the direction of the arrow A2 toward the outside of the arc chamber 50. The second tip portion 378*a* protrudes toward the inside of the arc chamber 50 more than the first cathode cap 72 and the first thermal shield 76. That is, a position of the second tip portion 378*a* in the axial direction is closer to the inner side of the arc chamber 50 than the position of a tip (tip surface 72*d*) of the first cathode cap 72 in the axial direction, and is closer to the inner side of the arc chamber 50 than the position of the first tip portion 76*a* of the first thermal shield 76 in the axial direction. The second terminal portion 378*b* is attached to the arc chamber 50, and is attached to, for example, the first end wall 50*c* of the arc chamber 50.

The second thermal shield 378 has a second tip opening 378*c* that opens in the axial direction at the second tip portion 378*a*. The second tip opening 378*c* allows the thermoelectron, which is supplied from the first cathode cap 72 toward the internal space S, to pass therethrough. The second opening width w2 in the second tip opening 378*c* in the radial direction is smaller than the maximum width w1a of the outer surface 76*h* of the first thermal shield 76 in the radial direction. The second opening width w2 of the second tip opening 378*c* shown in FIG. 19 is larger than the first opening width w1 of the first tip opening 76*c* in the radial direction and larger than the maximum width wa of the thermoelectron emission surface 72*a* in the radial direction. The second opening width w2 of the second tip opening 378*c* may be the same as the first opening width w1 of the first tip opening 76*c* in the radial direction. That is, the second opening width w2 of the second tip opening 378*c* may be equal to or larger than the first opening width w1 of the first tip opening 76*c* in the radial direction.

The second thermal shield 378 has a second extension portion 378*d* that extends in the axial direction in the tubular shape from the second terminal portion 378*b* toward the second tip portion 378*a*. The second extension portion 378*d* is adjacent to the first extension portion 76*d* of the first thermal shield 76 with a gap in the radial direction. The second extension portion 378*d* includes a second tapered portion 378*g* where a width of the inner surface 378*e* of the second extension portion 378*d* in the radial direction decreases toward the inside of the arc chamber 50. The entire second extension portion 378*d* is configured to be the second tapered portion 378*g*. The second tapered portion 378*g* is disposed adjacent to the first tapered portion 76*g* with a gap in the radial direction, and is disposed along the outer surface 76*h* of the first tapered portion 76*g*. The second tapered portion 378*g* is configured such that at least the inner surface 378*e* has the truncated cone shape. The second tapered portion 378*g* may be configured such that the outer surface 378*h* has the truncated cone shape. The second tapered portion 378*g* is configured such that, for example, a distance d4 from the inner surface 378*e* of the second extension portion 378*d* to the outer surface 76*h* of the first extension portion 76*d* is constant.

In the fourth embodiment, with employment of the features (1) to (3) in combination, a larger number of multiply charged ions are generated under the low arc condition. Specifically, with use of the first thermal shield 76 to narrow the range in which the thermoelectron is emitted from the first cathode cap 72 toward the internal space S of the arc chamber 50, it is possible to generate the higher-density plasma in the narrower range. Further, with use of the plurality of the thermal shields 76 and 378, it is possible to promote the rise in temperature of the first cathode cap 72 as compared with a case where one thermal shield 76 is used. Furthermore, with the applying of the voltage (here, equal to arc voltage) for extracting the thermoelectron to the second thermal shield 378, it is possible to more efficiently extract the thermoelectron from the first cathode cap 72 toward the inside of the arc chamber 50.

According to the fourth embodiment, since the second opening width w2 of the second tip opening 378*c* is equal to or larger than the first opening width w1 of the first tip opening 76*c* in the radial direction, the range in which the thermoelectron is emitted from the first cathode cap 72 toward the internal space S of the arc chamber 50 is limited by the first opening width w1 of the first tip opening 76*c*. As a result, the feature (1) can be realized by the first thermal shield 76, and the feature (3) can be realized by the second thermal shield 378. With the realization of the two features (1) and (3) by the individual thermal shields 76 and 378, respectively, it is possible to decide shapes of the thermal shields 76 and 378 to be optimal for the respective features (1) and (3).

Modification Examples According to Fourth Embodiment

Figure 20:
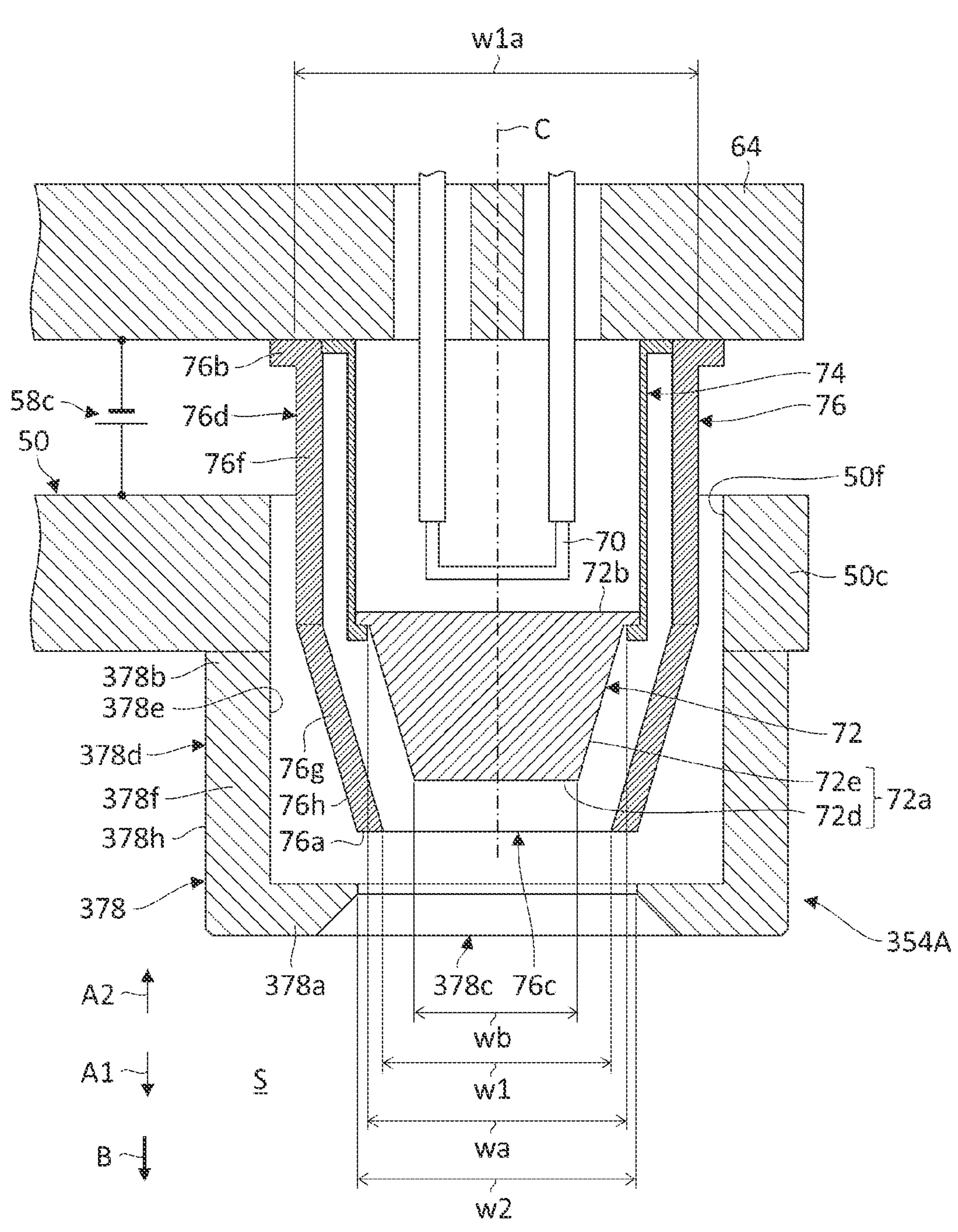
FIG. 20 is a cross-sectional view of a configuration of a first cathode according to a modification example of the fourth embodiment in detail.

FIG. 20 is a cross-sectional view of a configuration of a first cathode 354A according to the modification example in detail. In the first cathode 354A shown in FIG. 20, the second thermal shield 378 is configured to be integrated with the first end wall 50*c* of the arc chamber 50. That is, the first end wall 50*c* of the arc chamber 50 has the second thermal shield 378 configured to extend in the axial direction toward the inside of the arc chamber 50.

The second thermal shield 378 has the second terminal portion 378*b* joined to the first end wall 50*c*. The second thermal shield 378 has the second extension portion 378*d* that extends in the axial direction from the second terminal portion 378*b* toward the second tip portion 378*a*. The second extension portion 378*d* has a second cylindrical portion 378*f* configured such that widths of the inner surface 378*e* and the outer surface 378*h* of the second extension portion 378*d* in the radial direction are constant. The second extension portion 378*d* is configured of only the second cylindrical portion 378*f*, and does not include the second tapered portion (for example, 378*g* in FIG. 19). The second tip portion 378*a* is configured to extend on the radially inner side from the tip of the second extension portion 378*d*. The second tip opening 378*c* has the tapered shape whose opening width in the radial direction increases toward the inside of the arc chamber 50.

The second extension portion 378*d* shown in FIG. 20 may have only the second tapered portion 378*g* as shown in FIG. 19. The second extension portion 378*d* shown in FIG. 20 may include both the second cylindrical portion 378*f* and the second tapered portion 378*g*, similarly to the first thermal shield 276 shown in FIG. 18A. The second opening width w2 of the second tip opening 378*c* may be larger than, the same as, or smaller than the maximum width w1a of the outer surface 76*h* of the first thermal shield 76 in the radial direction. The second opening width w2 of the second tip opening 378*c* may be larger than, the same as, or smaller than the maximum width of the first cathode cap 72 in the radial direction. The second opening width w2 of the second tip opening 378*c* may be larger than, the same as, or smaller than the maximum width wa of the thermoelectron emission surface 72*a* in the radial direction. The second opening width w2 of the second tip opening 378*c* may be larger than, the same as, or smaller than the first opening width w1 of the first tip opening 76*c*. The second opening width w2 of the second tip opening 378*c* may be larger than, the same as, or smaller than the tip width wb of the thermoelectron emission surface 72*a* in the radial direction (width wb of the tip surface 72*d* in the radial direction).

Also in the fourth embodiment, the modification example according to the first embodiment described above can be applied. As the first cathode cap 72 and the first thermal shield 76 according to the fourth embodiment, the structures shown in FIGS. 3 to 10B can be used. Further, as the shape of the first cathode cap 72 according to the fourth embodiment, the shapes shown in FIGS. 11A to 11O can be used. Further, a structure similar to the structure of the second thermal shield 78 shown in FIGS. 12 to 16B may be used as a structure of the second thermal shield 378 according to the fourth embodiment.

Fifth Embodiment

Figure 21:
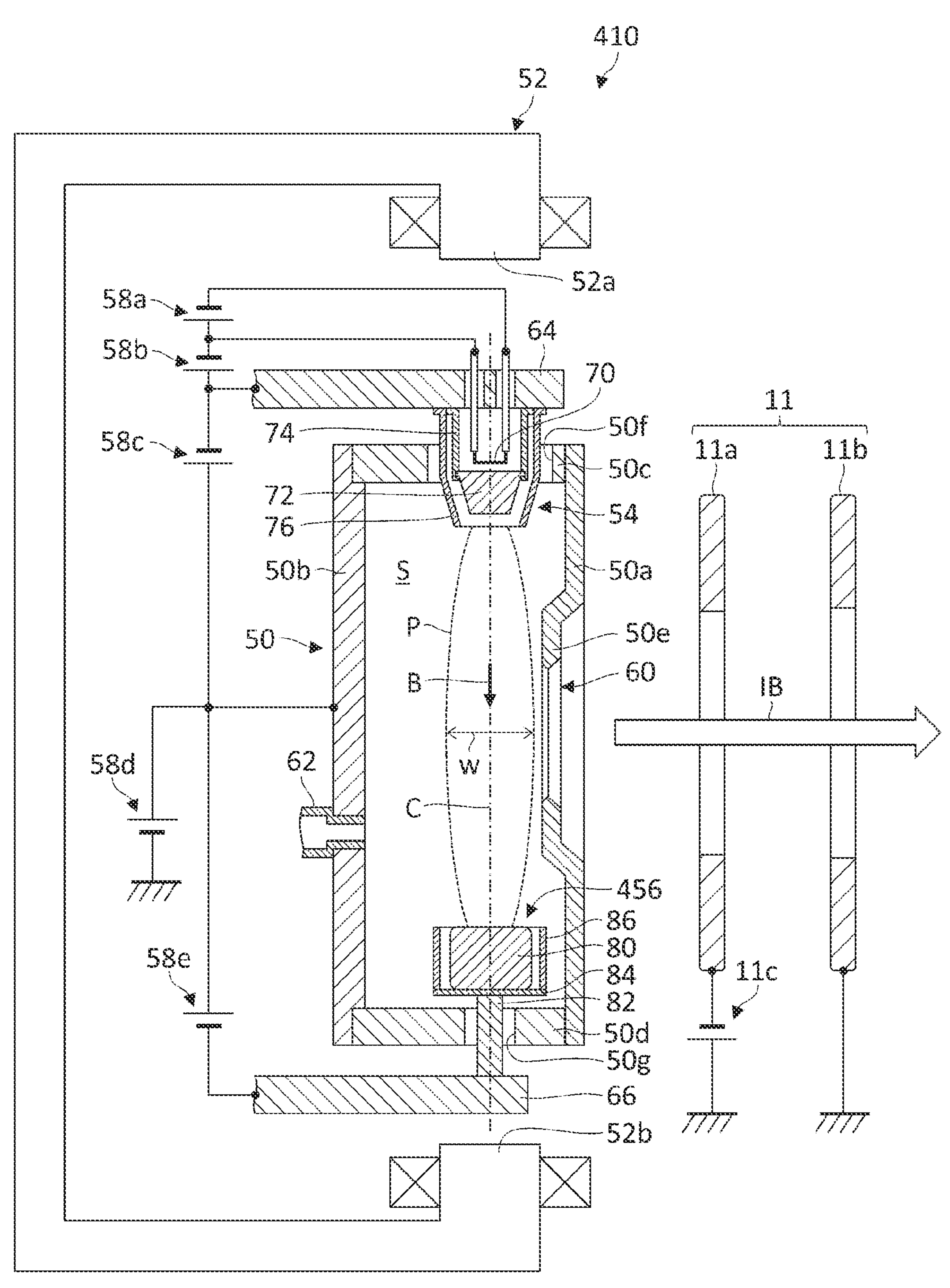
FIG. 21 is a cross-sectional view of a schematic configuration of an ion generation device according to a fifth embodiment.

FIG. 21 is a cross-sectional view of a schematic configuration of an ion generation device 410 according to a fifth embodiment. The fifth embodiment is different from the first embodiment described above in that a repeller 456 includes a thermal shield 86 (hereinafter also referred to as third thermal shield 86). Hereinafter, in the fifth embodiment, differences from the first embodiment will be mainly described and description of common points will be omitted as appropriate.

The ion generation device 410 includes the arc chamber 50, the magnetic field generator 52, the first cathode 54, the repeller 456, the first filament power supply 58*a*, the first cathode power supply 58*b*, the first arc power supply 58*c*, the extraction power supply 58*d*, and the repeller power supply 58*e*. The arc chamber 50, the magnetic field generator 52, the first cathode 54, and various power supplies 58*a* to 58*e* are configured in the same manner as in the first embodiment. The repeller power supply 58*e* may not be provided, and the repeller 456 may be configured to have a floating potential. Further, in a configuration in which the repeller power supply 58*e* is not provided, the arc power supply 58*c* may be connected to the repeller 456 to apply the arc voltage to the repeller 456.

The repeller 456 includes the repeller head 80, the repeller shaft 82, the repeller connecting part 84, and the third thermal shield 86. The repeller head 80 and the repeller shaft 82 are configured in the same manner as in the first embodiment described above.

The repeller connecting part 84 is provided between the repeller head 80 and the repeller shaft 82, and has a disk shape that extends in the radial direction. The third thermal shield 86 is provided on the radially outer side of the repeller head 80, and extends in the axial direction in the tubular shape from an outer periphery of the repeller connecting part 84 toward the inside of the arc chamber 50. The third thermal shield 86 reflects heat radiation from the repeller head 80 which is in a high temperature state, and suppresses heat escape from the repeller head 80 to promote a rise in temperature of the repeller head 80. The repeller connecting part 84 and the third thermal shield 86 are made of the refractory material. For example, a refractory metal such as tungsten, molybdenum, or tantalum, an alloy thereof, or graphite is used.

Figure 22:
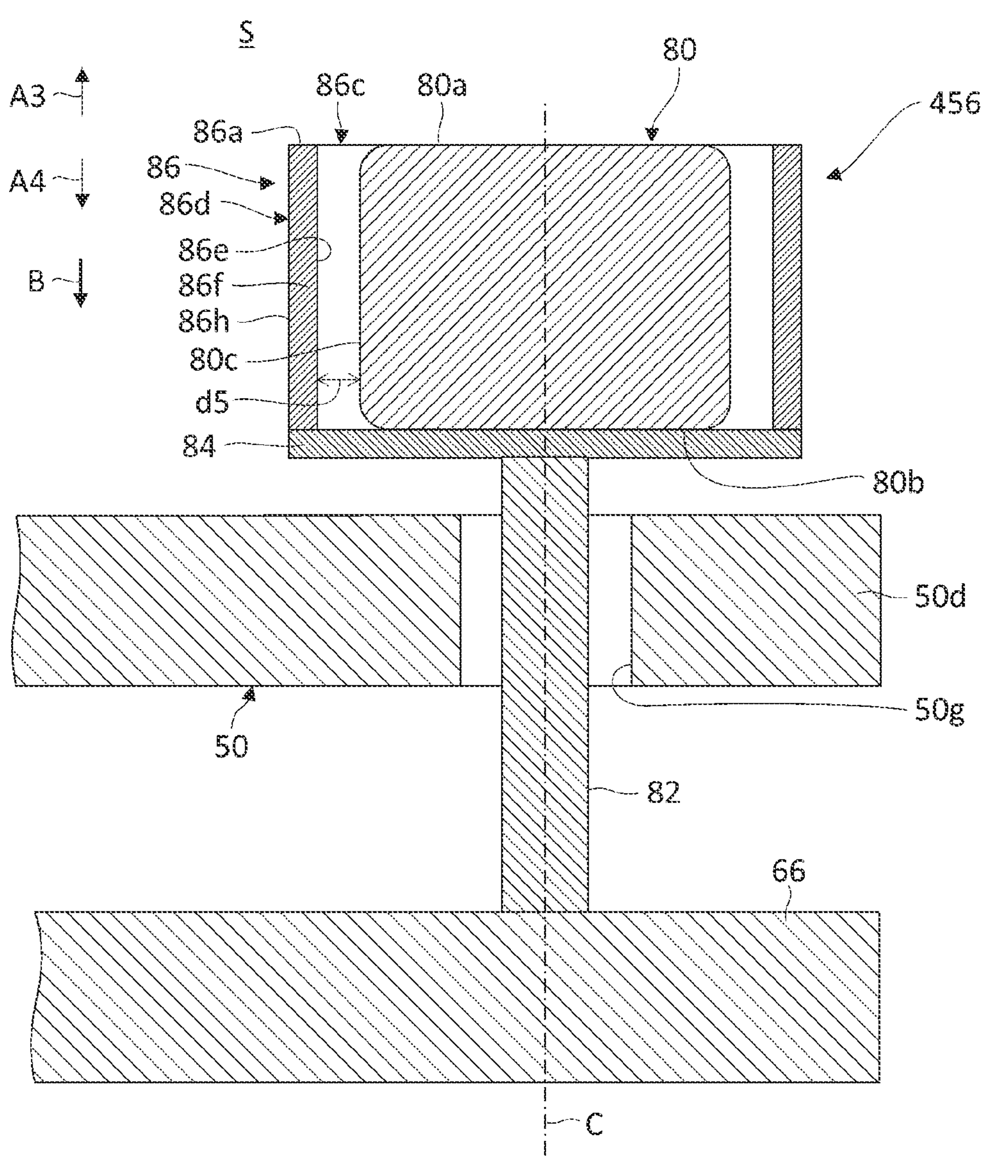
FIG. 22 is a cross-sectional view of a configuration of a repeller according to the fifth embodiment in detail.

FIG. 22 is a cross-sectional view of a configuration of the repeller 456 according to the fifth embodiment in detail, and is an enlarged view of the repeller 456 shown in FIG. 21. In FIG. 22, an arrow A3 indicates a direction extending in the axial direction from the outside to the inside of the arc chamber 50 with reference to the second end wall 50*d*. The arrow A3 is a direction toward the inner side of the arc chamber 50 along the axial direction. An arrow A4 is a direction opposite to the arrow A3, and is a direction toward an outer side of the arc chamber 50 along the axial direction.

The repeller head 80 is a solid member that protrudes in the axial direction toward the inside of the arc chamber 50, and is disposed to be exposed to the internal space S. The repeller head 80 has the shape rotationally symmetric with respect to the center axis C extending in the axial direction, and has, for example, a shape in which edges of an upper surface and a lower surface of a column are chamfered. The repeller head 80 includes a tip surface 80*a* configured of a flat surface exposed in the axial direction toward the inside of the arc chamber 50, a terminal surface 80*b* configured of a flat surface facing the outside of the arc chamber 50, and a side surface 80*c* configured of a cylindrical surface facing on a radially outer side. The repeller connecting part 84 has the shape rotationally symmetric with respect to the center axis C extending in the axial direction, and is disposed to be coaxial with the repeller head 80 and the repeller shaft 82.

The third thermal shield 86 has a third tip portion 86*a* that protrudes in the direction of the arrow A3 toward the inside of the arc chamber 50. The third thermal shield 86 has a third tip opening 86*c* that opens in the axial direction at the third tip portion 86*a*. The third thermal shield 86 has a third extension portion 86*d* that extends in the axial direction in the tubular shape from the repeller connecting part 84 toward the third tip portion 86*a*. The third extension portion 86*d* is adjacent to the repeller head 80 with a gap in the radial direction. The third thermal shield 86 has the shape rotationally symmetric with respect to the center axis C extending in the axial direction. For example, the third thermal shield 86 is disposed to be coaxial with the repeller head 80, the repeller shaft 82, and the repeller connecting part 84.

A position of the third tip portion 86*a* of the third thermal shield 86 in the axial direction is the same as the position of the tip (tip surface 80*a*) of the repeller head 80 in the axial direction. In a modification example, the third tip portion 86*a* of the third thermal shield 86 may protrude toward the inside of the arc chamber more than the tip (tip surface 80*a*) of the repeller head 80. In another modification example, the tip (tip surface 80*a*) of the repeller head 80 may protrude toward the inside of the arc chamber more than the third tip portion 86*a* of the third thermal shield 86.

The third extension portion 86*d* has a third cylindrical portion 86*f*. The third cylindrical portion 86*f* is a portion where a width of the inner surface 86*e* of the third extension portion 86*d* in the radial direction is constant. The third cylindrical portion 86*f* is configured such that at least the inner surface 86*e* has a cylindrical shape. The third cylindrical portion 86*f* is configured such that, for example, a distance d5 from the inner surface 86*e* of the third extension portion 86*d* to the side surface 80*c* of the repeller head 80 is constant. The third extension portion 86*d* shown in FIG. 22 is configured to include only the third cylindrical portion 86*f* and not to have the tapered portion. In the modification example, the third extension portion 86*d* of the third thermal shield 86 may include a third tapered portion. The third tapered portion is configured such that the width of the inner surface 86*e* of the third extension portion 86*d* in the radial direction changes according to the position in the axial direction. For example, the width of the inner surface 86*e* of the third extension portion 86*d* in the radial direction may be configured to increase toward the inside of the arc chamber, or conversely, to decrease toward the inside of the arc chamber. That is, the distance d5 from the inner surface 86*e* of the third extension portion 86*d* to the side surface 80*c* of the repeller head 80 may be configured to increase toward the inside of the arc chamber, or conversely, to decrease toward the inside of the arc chamber.

In the fifth embodiment, with employment of the feature (4), a larger number of multiply charged ions are generated under the low arc condition. The repeller head 80 is heated by an interaction with the plasma generated in the plasma generation region P, and becomes a high temperature state. The third thermal shield 86 reflects heat radiation from the repeller head 80 which is in a high temperature state, and suppresses heat escape from the repeller head 80 to promote a rise in temperature of the repeller head 80. Since the thermoelectron is emitted from the repeller head 80 maintained in a high temperature state, with the promotion of such a temperature rise, it is possible to supply a larger number of thermoelectrons from the repeller head 80 toward the internal space S of the arc chamber 50. Therefore, according to the present embodiment, with the providing of the third thermal shield 86 around the repeller head 80, it is possible to improve the plasma generation efficiency in the plasma generation region P.

The repeller 456 according to the fifth embodiment may be used in combination with the first cathode according to the modification example of the first embodiment, or may be used in combination with the first cathode according to the second embodiment, the third embodiment, or the fourth embodiment or the modification examples of the second to fourth embodiments.

Modification Examples According to Fifth Embodiment

Figure 23:
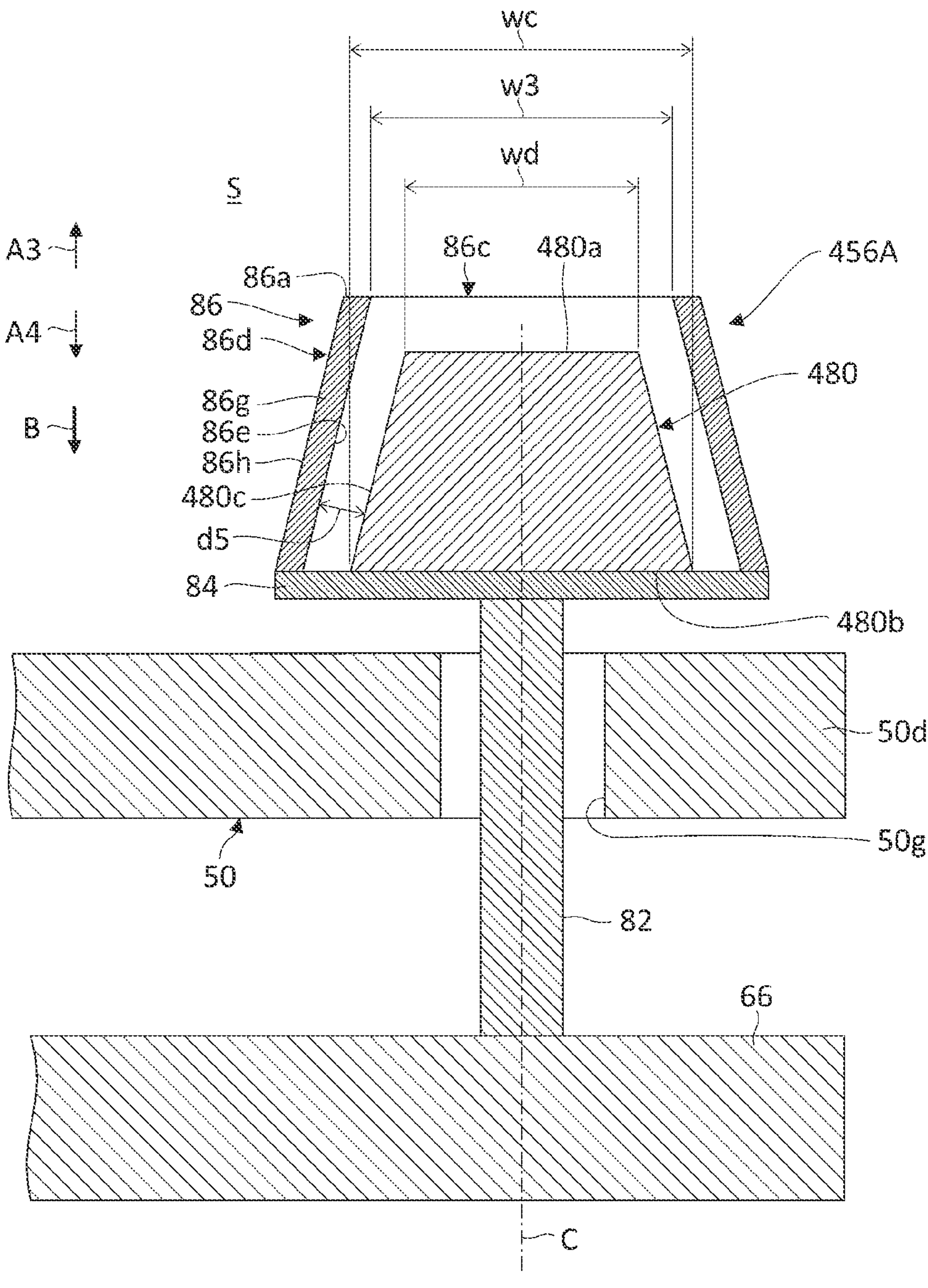
FIG. 23 is a cross-sectional view of a configuration of a repeller according to a modification example of the fifth embodiment in detail.

FIG. 23 is a cross-sectional view of a configuration of a repeller 456A according to a modification example in detail. The repeller 456A includes a repeller head 480, the repeller shaft 82, the repeller connecting part 84, and the third thermal shield 86. In the present modification example, the feature (5) is employed, and the third thermal shield 86 provided around the repeller head 480 is used to narrow the range in which the thermoelectron is emitted from the repeller head 480 toward the internal space S of the arc chamber 50. In the present modification example, differences from the fifth embodiment described above will be mainly described, and description of common points will be omitted as appropriate.

The repeller head 480 has the tapered shape whose width in the radial direction decreases toward the inside of the arc chamber 50, and has, for example, a trapezoidal shape symmetrical in the cross section of FIG. 23. The repeller head 480 has the shape rotationally symmetric with respect to a center axis C extending in the axial direction, and has, for example, the truncated cone shape. The repeller head 480 has a tip surface 480*a* configured of a flat surface exposed in the axial direction toward the inside of the arc chamber 50, and a side surface 480*c* exposed in a direction oblique to the axial direction. The tip surface 480*a* and the side surface 480*c* of the repeller head 480 are thermoelectron emission surfaces that emit the thermoelectron toward the internal space S of the arc chamber 50. A width wd of the tip surface 480*a* of the repeller head 480 in the radial direction is smaller than a maximum width wc of the repeller head 480 in the radial direction.

The third extension portion 86*d* of the third thermal shield 86 includes a third tapered portion 86*g* configured such that the width of the inner surface 86*e* in the radial direction decreases toward the inside of the arc chamber. The third tapered portion 86*g* is disposed adjacent to the repeller head 480 with a gap in the radial direction, and is disposed along the side surface 480*c* of the repeller head 480. The third tapered portion 86*g* is configured such that at least a space formed by the inner surface 86*e* has the truncated cone shape. The third tapered portion 86*g* is configured such that, for example, a distance d5 from the inner surface 86*e* to the side surface 480*c* of the repeller head 480 is constant.

A third opening width w3 of the third tip opening 86*c* of the third thermal shield 86 in the radial direction is smaller than the maximum width wc of the repeller head 480 in the radial direction, and is larger than the tip width wd of the repeller head 480 in the radial direction (width wd of the tip surface 480*a* in the radial direction). Therefore, at least a part of the third thermal shield 86 is disposed to overlap the repeller head 480 in the axial direction. More specifically, at least a part of an edge of the third tip opening 86*c* of the third thermal shield 86 overlaps the side surface 480*c*, which is a thermoelectron emission surface of the repeller head 480, in the axial direction.

As structures of the repeller head 480 and the third thermal shield 86, structures similar to the structures of the first cathode cap 72 and the first thermal shield 76 shown in FIGS. 3 to 10B can be used. More specifically, as a structure of the third extension portion 86*d* of the third thermal shield 86, the structure of the first extension portion 76*d* (or first tapered portion 76*g*) shown in FIGS. 3 to 10B can be used. Further, as a shape of the repeller head 480, the shape of the first cathode cap 72 shown in FIGS. 11A to 11O can be used.

Sixth Embodiment

Figure 24:
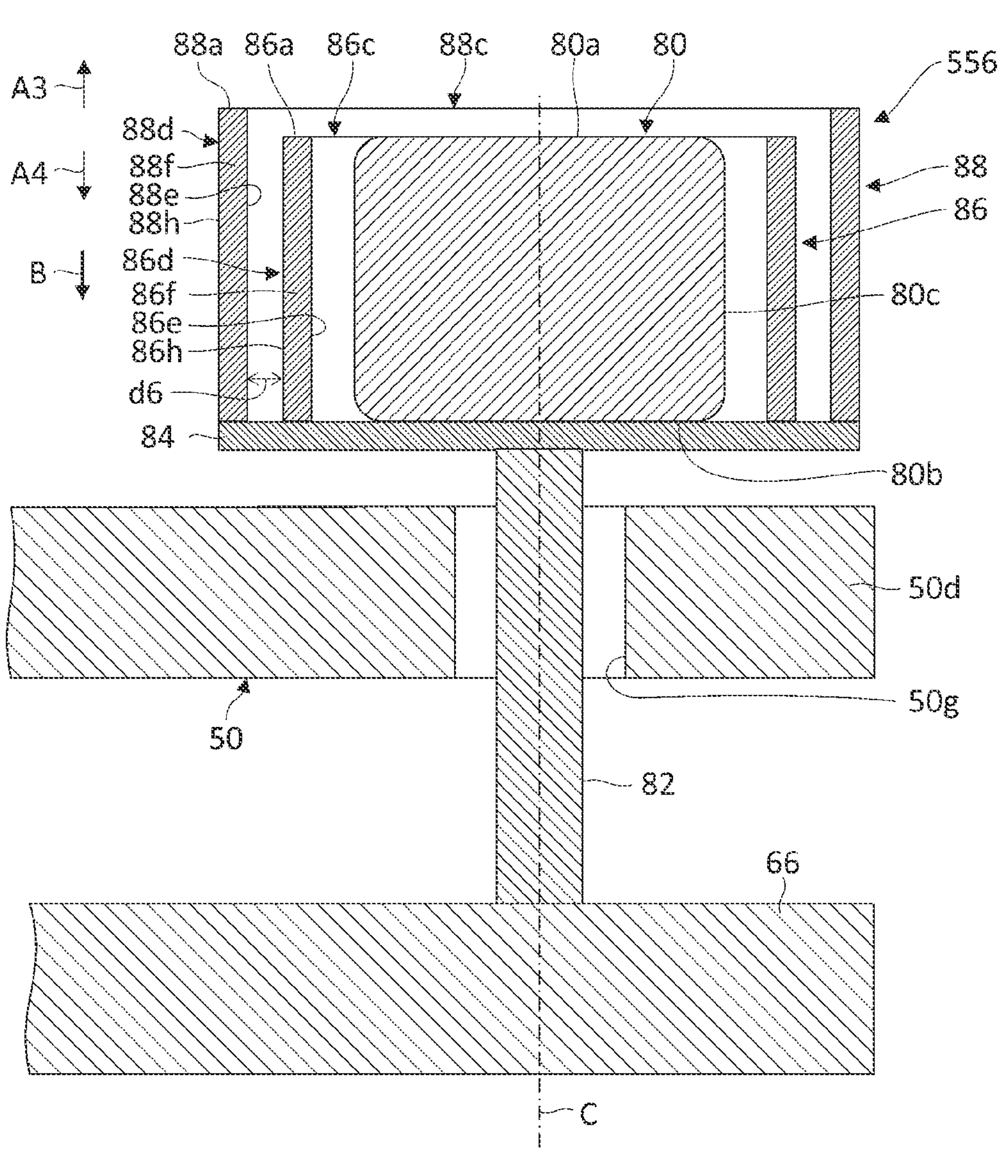
FIG. 24 is a cross-sectional view of a configuration of a repeller according to a sixth embodiment in detail.

FIG. 24 is a cross-sectional view of a configuration of a repeller 556 according to a sixth embodiment in detail. The repeller 556 is different from the fifth embodiment shown in FIG. 22 in that the repeller 556 further includes an additional thermal shield 88 (also referred to as fourth thermal shield 88). In the sixth embodiment, the feature (6) is employed, and a plurality of thermal shields 86 and 88 are provided around the repeller head 80 to further promote the rise in temperature of the repeller head 80. In the sixth embodiment, differences from the fifth embodiment described above will be mainly described, and description of common points will be omitted as appropriate.

The repeller 556 includes the repeller head 80, the repeller shaft 82, the repeller connecting part 84, the third thermal shield 86, and the fourth thermal shield 88. The repeller head 80, the repeller shaft 82, the repeller connecting part 84, and the third thermal shield 86 are configured in the same manner as in the fifth embodiment, but a diameter of the repeller connecting part 84 is larger than that in FIG. 22.

The fourth thermal shield 88 is provided on the radially outer side of the third thermal shield 86, and extends in the axial direction in the tubular shape from the outer periphery of the repeller connecting part 84. The fourth thermal shield 88 has a fourth tip portion 88*a* that protrudes in the direction of the arrow A3 toward the inside of the arc chamber 50. The fourth thermal shield 88 has a fourth tip opening 88*c* that opens in the axial direction at the fourth tip portion 88*a*. The fourth thermal shield 88 has a fourth extension portion 88*d* that extends in the axial direction in the tubular shape from the repeller connecting part 84 toward the fourth tip portion 88*a*. The fourth extension portion 88*d* is adjacent to the third extension portion 86*d* with a gap in the radial direction. The fourth thermal shield 88 has the shape rotationally symmetric with respect to the center axis C extending in the axial direction. The fourth thermal shield 88 is disposed to be coaxial with, for example, the repeller head 80, the repeller shaft 82, the repeller connecting part 84, and the third thermal shield 86.

The fourth tip portion 88*a* of the fourth thermal shield 88 protrudes toward the inside of the arc chamber more than the tip (tip surface 80*a*) of the repeller head 80 and the third tip portion 86*a* of the third thermal shield 86. In a modification example, a position of the fourth tip portion 88*a* of the fourth thermal shield 88 in the axial direction may be the same as the position of the tip (tip surface 80*a*) of the repeller head 80 in the axial direction, or may be the same as the position of the third tip portion 86*a* of the third thermal shield 86 in the axial direction. In another modification example, at least one of the tip (tip surface 80*a*) of the repeller head 80 and the third tip portion 86*a* of the third thermal shield 86 may protrude toward the inside of the arc chamber more than the fourth tip portion 88*a* of the fourth thermal shield 88.

The fourth extension portion 88*d* has a fourth cylindrical portion 88*f*. The fourth cylindrical portion 88*f* is a portion where a width of the inner surface 88*e* of the fourth extension portion 88*d* in the radial direction is constant. The fourth cylindrical portion 88*f* is configured such that at least the inner surface 88*e* has a cylindrical shape. The fourth cylindrical portion 88*f* is configured such that, for example, a distance d6 from the inner surface 88*e* of the fourth extension portion 88*d* to the outer surface 86*h* of the third extension portion 86*d* is constant. The fourth extension portion 88*d* shown in FIG. 24 is configured to include only the fourth cylindrical portion 88*f* and not to have the tapered portion. In the modification example, the fourth extension portion 88*d* of the fourth thermal shield 88 may include a fourth tapered portion. The fourth tapered portion is configured such that the width of the inner surface 88*e* of the fourth extension portion 88*d* in the radial direction changes according to the position in the axial direction. For example, the width of the inner surface 488*e* of the fourth extension portion 88*d* in the radial direction may be configured to increase toward the inside of the arc chamber, or conversely, to decrease toward the inside of the arc chamber. That is, the distance d6 from the inner surface 88*e* of the fourth extension portion 88*d* to the outer surface 86*h* of the third extension portion 86*d* may be configured to increase toward the inside of the arc chamber, or conversely, to decrease toward the inside of the arc chamber.

The fourth thermal shield 88 reflects heat radiation from the third thermal shield 86 which is in a high temperature state, and suppresses heat escape from the third thermal shield 86 to promote a rise in temperature of the third thermal shield 86. With the promotion of the rise in temperature of the third thermal shield 86, the fourth thermal shield 88 promotes the rise in temperature of the repeller head 80.

The repeller 556 according to the sixth embodiment may be used in combination with the first cathode according to the modification example of the first embodiment, or may be used in combination with the first cathode according to the second embodiment, the third embodiment, or the fourth embodiment or the modification examples of the second to fourth embodiments.

Modification Examples According to Sixth Embodiment

Figure 25:
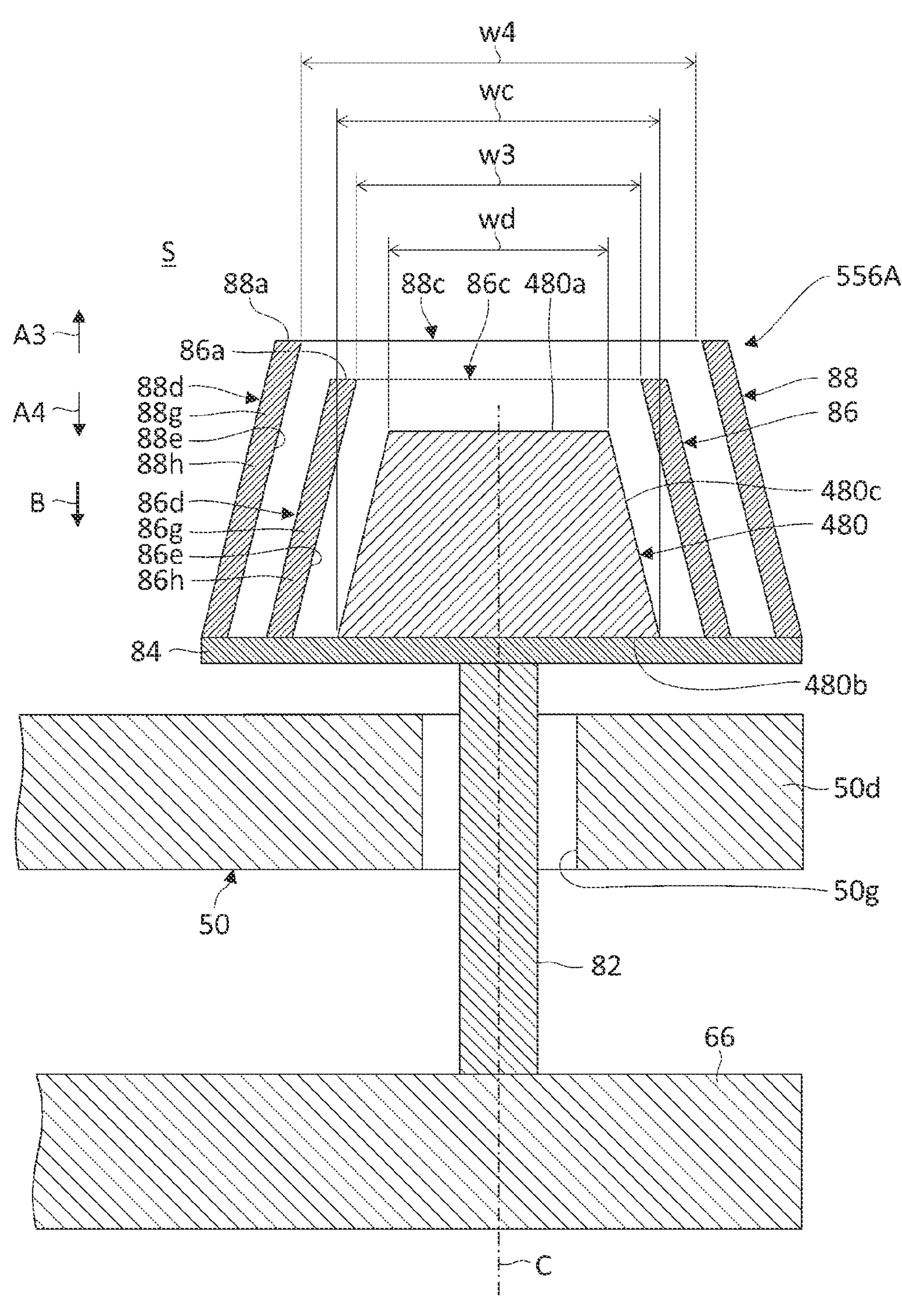
FIG. 25 is a cross-sectional view of a configuration of a repeller according to a modification example of the sixth embodiment in detail.

FIG. 25 is a cross-sectional view of a configuration of a repeller 556A according to a modification example in detail. The repeller 556A includes the repeller head 480, the repeller shaft 82, the repeller connecting part 84, the third thermal shield 86, and the fourth thermal shield 88. In the present modification example, the repeller head 480 has the truncated cone shape, and the third extension portion 86*d* of the third thermal shield 86 includes the third tapered portion 86*g*, as in the modification example of FIG. 23. Further, the fourth extension portion 88*d* of the fourth thermal shield 88 includes a fourth tapered portion 88*g*.

In the present modification example, with employment of the features (5) and (6) in combination, a larger number of multiply charged ions are generated under the low arc condition. Specifically, with a combination of the third thermal shield 86 and the fourth thermal shield 88, it is possible to further promote the rise in temperature of the repeller head 480. Furthermore, with use of the third thermal shield 86 to narrow the range in which the thermoelectron is emitted from the repeller head 480 toward the internal space S of the arc chamber 50, it is possible to generate the higher-density plasma in the narrower range.

The repeller 556A may have a structure similar to the structure of the first cathode 154 shown in FIG. 12. The third extension portion 86*d* (or third tapered portion 86*g*) may be configured in the same manner as the first extension portion 76*d* (or first tapered portion 76*g*) shown in FIGS. 3 to 16B. The fourth extension portion 88*d* (or fourth tapered portion 88*g*) may be configured in the same manner as the second extension portion 78*d* (or second tapered portion 78*g*) shown in FIGS. 12 to 16B. The repeller head 480 may have a shape similar to the shape of the first cathode cap 72 shown in FIGS. 11A to 11O.

In FIG. 25, a fourth opening width w4 of the fourth tip opening 88*c* in the radial direction is larger than the third opening width w3 of the third tip opening 86*c*, the maximum width wc of the repeller head 480, and the tip width wd of the repeller head 480. In a further modification example, the fourth opening width w4 of the fourth tip opening 88*c* in the radial direction may be the same as or smaller than any one of the third opening width w3 of the third tip opening 86*c*, the maximum width wc of the repeller head 480, and the tip width wd of the repeller head 480.

Seventh Embodiment

Figure 26:
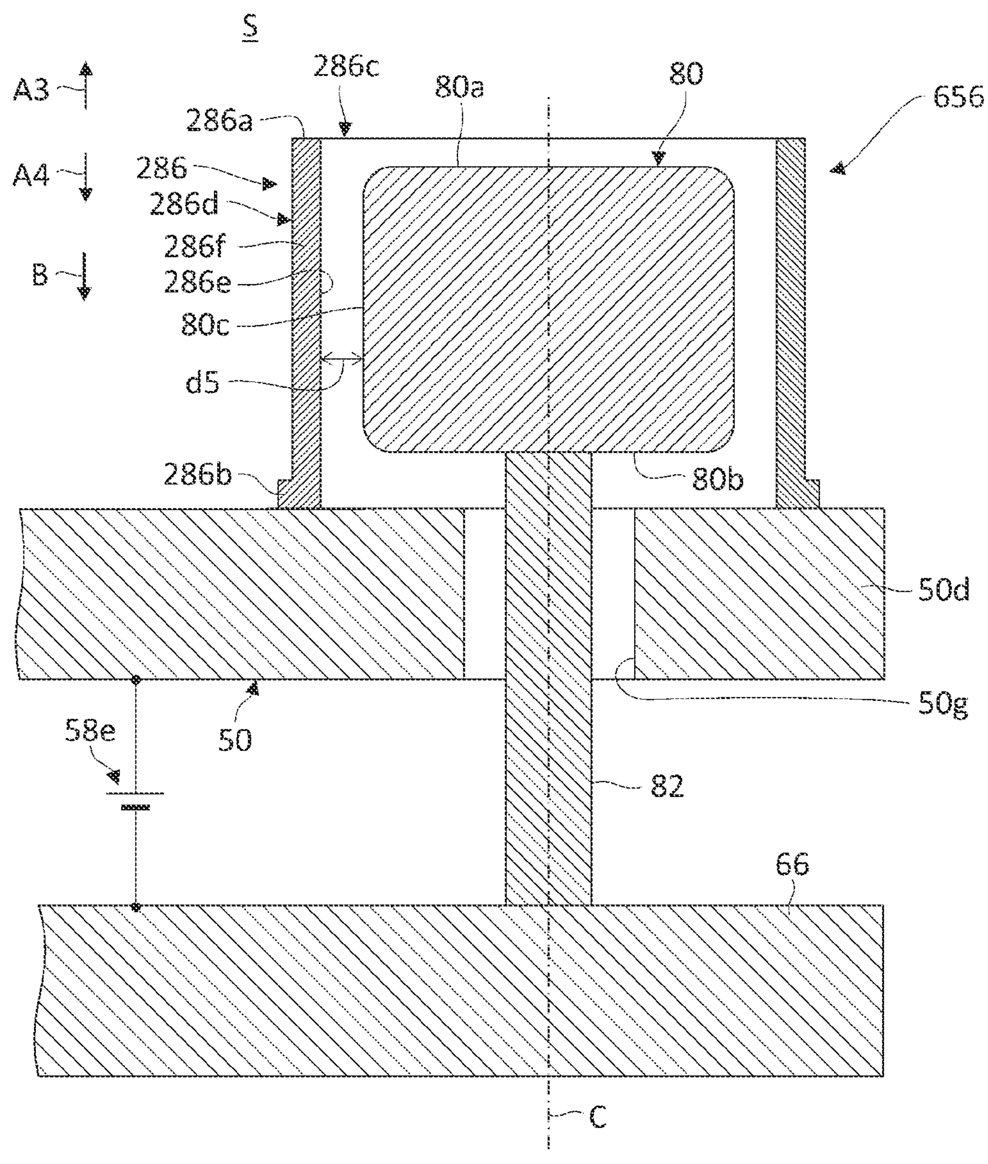
FIG. 26 is a cross-sectional view of a configuration of a repeller according to a seventh embodiment in detail.

FIG. 26 is a cross-sectional view of a configuration of a repeller 656 according to a seventh embodiment in detail. The repeller 656 according to the seventh embodiment includes the repeller head 80, the repeller shaft 82, and a third thermal shield 286. The seventh embodiment is different from the fifth embodiment in that the third thermal shield 286 is attached to the arc chamber 50. Hereinafter, in the seventh embodiment, differences from the fifth embodiment will be mainly described, and description of common points will be omitted as appropriate.

The third thermal shield 286 has a third tip portion 286*a* that protrudes in the direction of the arrow A3 toward the inside of the arc chamber and a third terminal portion 286*b* that protrudes in the direction of the arrow A4 toward the outside of the arc chamber. The third tip portion 286*a* protrudes toward the inside of the arc chamber 50 more than the repeller head 80. That is, a position of the third tip portion 286*a* in the axial direction is closer to the inner side of the arc chamber 50 than the position of the tip (tip surface 80*a*) of the repeller head 80 in the axial direction. The third thermal shield 286 has a third tip opening 286*c* that opens in the axial direction at the third tip portion 286*a*. The third terminal portion 286*b* is attached to the arc chamber 50, and is attached to, for example, the second end wall 50*d* of the arc chamber 50. The third thermal shield 286 may be configured to be integrated with the second end wall 50*d*, or may be configured to extend in the axial direction from the second end wall 50*d* toward the inside of the arc chamber 50.

The third thermal shield 286 has a third extension portion 286*d* that extends in the axial direction in the tubular shape from the third terminal portion 286*b* toward the third tip portion 286*a*. The third extension portion 286*d* is adjacent to the repeller head 80 with a gap in the radial direction. The third extension portion 286*d* has a third cylindrical portion 286*f* configured such that the width of the inner surface 286*e* of the third extension portion 286*d* in the radial direction is constant. The third extension portion 286*d* shown in FIG. 26 is configured to include only the third cylindrical portion 286*f* and not to have the tapered portion. In a modification example, the third extension portion 286*d* of the third thermal shield 286 may include a third tapered portion.

In the seventh embodiment, with employment of the feature (7), a larger number of multiply charged ions are generated under the low arc condition. Specifically, with the applying of the voltage (here, equal to repeller voltage) for extracting the thermoelectron to the third thermal shield 286, it is possible to more efficiently extract the thermoelectron from the repeller head 80 toward the inside of the arc chamber 50. As a result, it is possible to supply a larger number of thermoelectrons toward the internal space S of the arc chamber 50, as compared with a case where potentials of the repeller head 80 and the thermal shield 286 are the same, and to generate the higher-density plasma even under the low arc condition.

The third thermal shield 286 according to the seventh embodiment is configured in the same manner as the first thermal shield 276 shown in FIG. 18B. In the modification example, the third thermal shield 286 may be configured in the same manner as the first thermal shield 276 shown in FIG. 17 or FIG. 18A. More specifically, as a structure of the third extension portion 286*d* of the third thermal shield 286, the structure of the first extension portion 276*d* shown in FIGS. 17 to 18B can be used. The third thermal shield 286 according to the seventh embodiment may have a structure similar to the structure of the first thermal shield 76 shown in FIGS. 3 to 10B. Further, as a shape of the repeller head 80, a truncated cone shape similar to the truncated cone shape of the first cathode cap 72 shown in FIGS. 17 to 18B may be used, or the shape of the first cathode cap 72 shown in FIGS. 11A to 11O may be also used.

The repeller 656 according to the seventh embodiment may be used in combination with the first cathode according to the modification example of the first embodiment, or may be used in combination with the first cathode according to the second embodiment, the third embodiment, or the fourth embodiment or the modification examples of the second to fourth embodiments.

Eighth Embodiment

Figure 27:
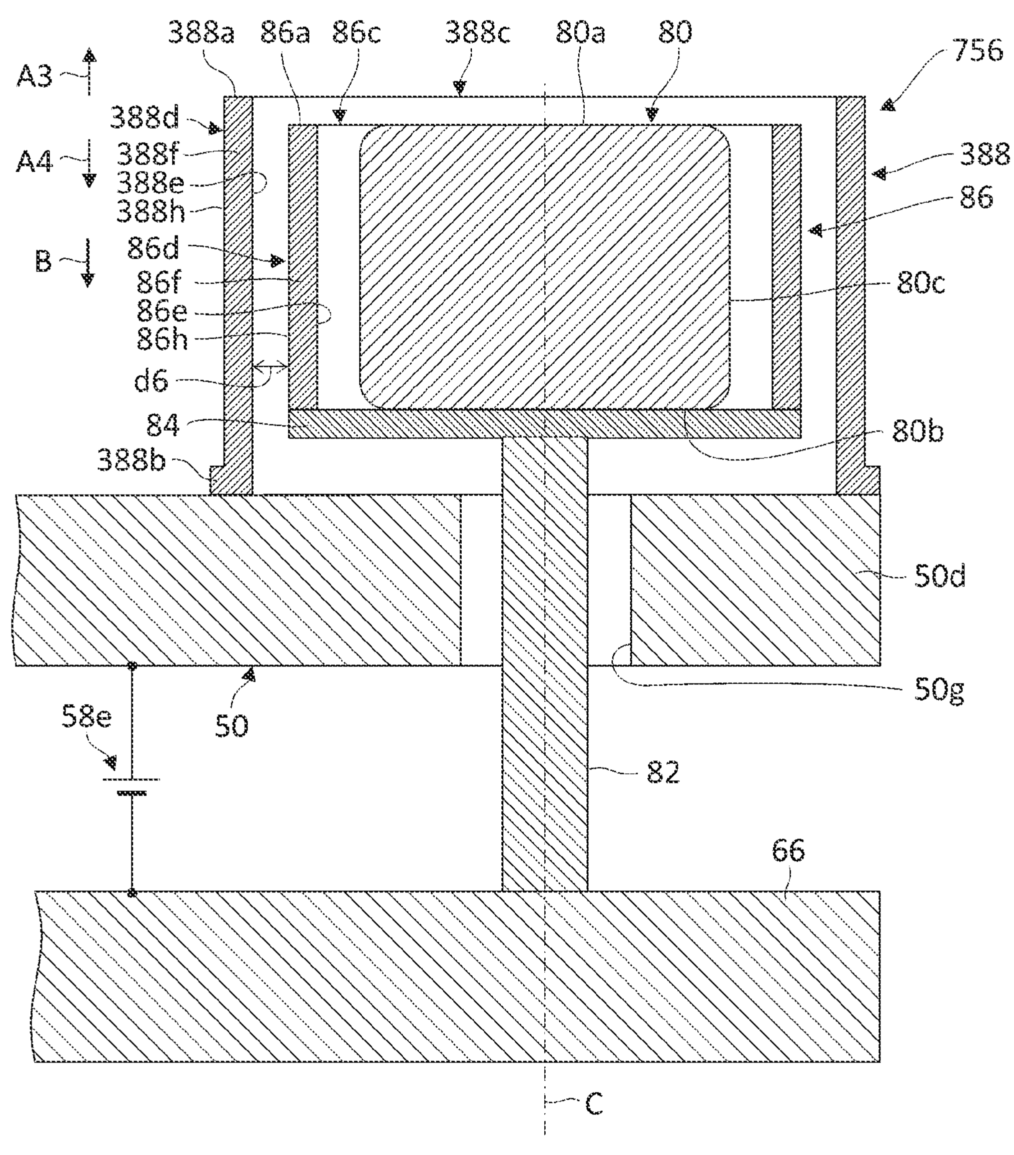
FIG. 27 is a cross-sectional view of a configuration of a repeller according to an eighth embodiment in detail.

FIG. 27 is a cross-sectional view of a configuration of a repeller 756 according to an eighth embodiment in detail. The repeller 756 according to the eighth embodiment includes the repeller head 80, the repeller shaft 82, the repeller connecting part 84, the third thermal shield 86, and a fourth thermal shield 388. The eighth embodiment is different from the sixth embodiment in that the fourth thermal shield 388 is attached to the arc chamber 50. Hereinafter, in the eighth embodiment, differences from the sixth embodiment will be mainly described, and description of common points will be omitted as appropriate.

The fourth thermal shield 388 has a fourth tip portion 388*a* that protrudes in the direction of the arrow A3 toward the inside of the arc chamber and a fourth terminal portion 388*b* that protrudes in the direction of the arrow A4 toward the outside of the arc chamber. The fourth tip portion 388*a* protrudes toward the inside of the arc chamber 50 from the tip (tip surface 80*a*) of the repeller head 80 and the third tip portion 86*a* of the third thermal shield 86. That is, a position of the fourth tip portion 388*a* in the axial direction is closer to the inner side of the arc chamber 50 than the positions of the tip (tip surface 80*a*) of the repeller head 80 and the third tip portion 86*a* of the third thermal shield 86 in the axial direction. The fourth thermal shield 388 has a fourth tip opening 388*c* that opens in the axial direction at the fourth tip portion 388*a*. The fourth terminal portion 388*b* is attached to the arc chamber 50, and is attached to, for example, the second end wall 50*d* of the arc chamber 50. The fourth thermal shield 388 may be configured to be integrated with the second end wall 50*d*, or may be configured to extend in the axial direction from the second end wall 50*d* toward the inside of the arc chamber 50.

The fourth thermal shield 388 has a fourth extension portion 388*d* that extends in the axial direction in the tubular shape from the fourth terminal portion 388*b* toward the fourth tip portion 388*a*. The fourth extension portion 388*d* is adjacent to the third extension portion 86*d* with a gap in the radial direction. The fourth extension portion 388*d* has a fourth cylindrical portion 388*f* configured such that the width of the inner surface 388*e* of the fourth extension portion 388*d* in the radial direction is constant. The fourth extension portion 388*d* shown in FIG. 27 is configured to include only the fourth cylindrical portion 388*f* and not to have the tapered portion. In a modification example, the fourth extension portion 388*d* of the fourth thermal shield 388 may include a fourth tapered portion.

In the eighth embodiment, with employment of the features (6) and (7), a larger number of multiply charged ions are generated under the low arc condition. Specifically, with providing of the plurality of thermal shields 86 and 388 around the repeller head 80, it is possible to promote the rise in temperature of the repeller head 80. Further, with the applying of the voltage (here, equal to repeller voltage) for extracting the thermoelectron to the fourth thermal shield 388, it is possible to more efficiently extract the thermoelectron from the repeller head 80 toward the inside of the arc chamber 50.

The repeller 756 according to the eighth embodiment may be configured in the same manner as the first cathodes 354 and 354A shown in FIGS. 19 and 20. As the structure of the third extension portion 86*d* of the third thermal shield 86, the structure of the first extension portion 76*d* (or first tapered portion 76*g*) shown in FIGS. 19 and 20 can be used. Further, the structure of the second extension portion 378*d* (or second tapered portion 378*g*) shown in FIGS. 19 and 20 can be used as a structure of the fourth extension portion 388*d* of the fourth thermal shield 388. A structure similar to the structure of the first thermal shield 76 shown in FIGS. 3 to 10B may be used as a structure of the third thermal shield 86. A structure similar to the structure of the second thermal shield 78 shown in FIGS. 12 to 16B may be used as a structure of the fourth thermal shield 388. As a shape of the repeller head 80, a truncated cone shape similar to the truncated cone shape of the first cathode cap 72 shown in FIGS. 19 and 20 may be used, or the shape of the first cathode cap 72 shown in FIGS. 11A to 11O may be used.

The repeller 756 according to the eighth embodiment may be used in combination with the first cathode according to the modification example of the first embodiment, or may be used in combination with the first cathode according to the second embodiment, the third embodiment, or the fourth embodiment or the modification examples of the second to fourth embodiments.

Ninth Embodiment

Figure 28:
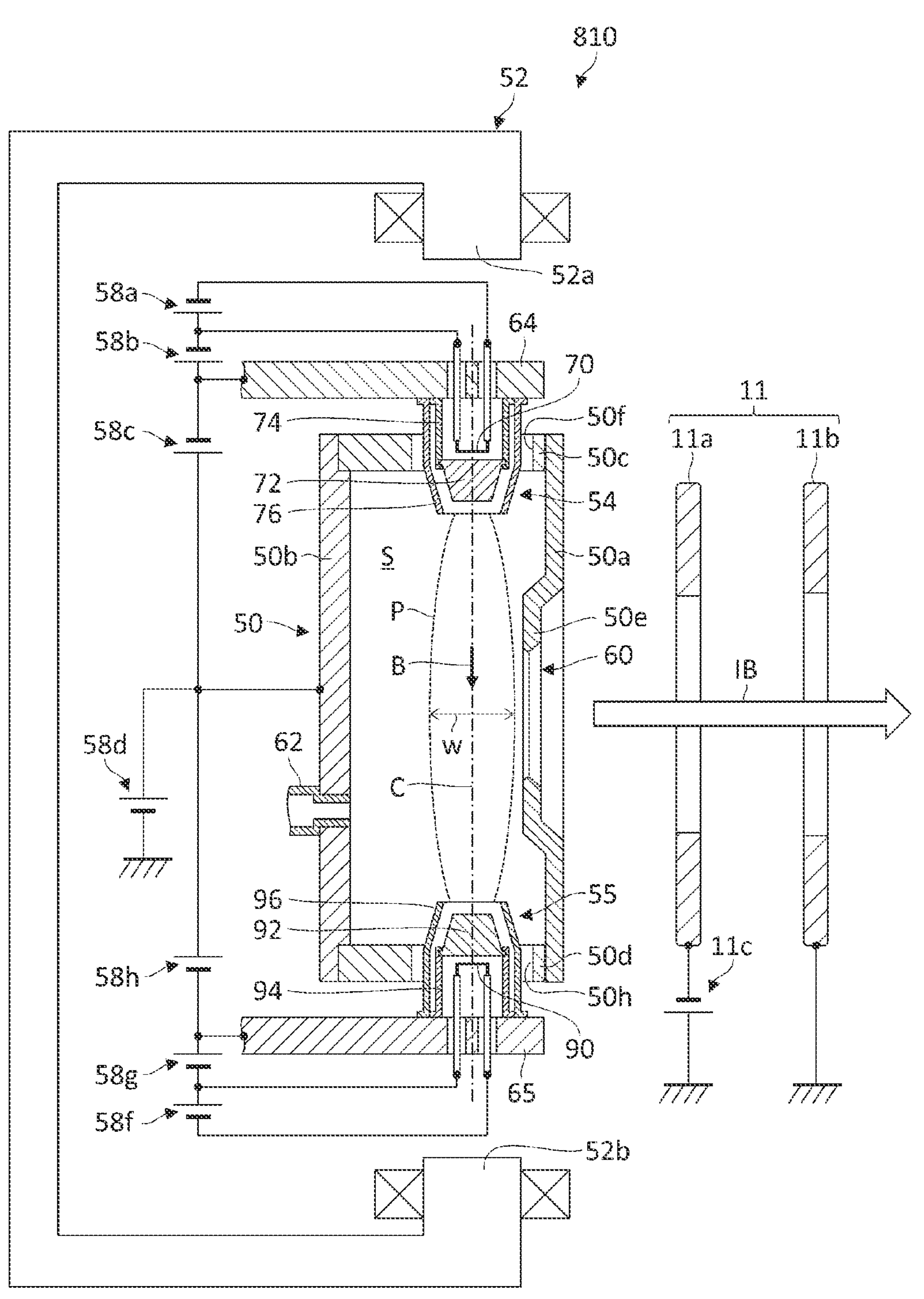
FIG. 28 is a cross-sectional view of a schematic configuration of an ion generation device according to a ninth embodiment.

FIG. 28 is a cross-sectional view of a schematic configuration of an ion generation device 810 according to a ninth embodiment. The ninth embodiment is different from the first embodiment described above in that a second cathode 55 is provided instead of the repeller 56. The ion generation device 810 according to the ninth embodiment is a dual-cathode-type ion generation device provided with two cathodes of the first cathode 54 and the second cathode 55. Hereinafter, in the ninth embodiment, differences from the first embodiment will be mainly described and description of common points will be omitted as appropriate.

The ion generation device 810 includes the arc chamber 50, the magnetic field generator 52, the first cathode 54, the second cathode 55, the first filament power supply 58*a*, the first cathode power supply 58*b*, the first arc power supply 58*c*, the extraction power supply 58*d*, a second filament power supply 58*f*, a second cathode power supply 58*g*, and a second arc power supply 58*h*. The arc chamber 50, the magnetic field generator 52, the first cathode 54, the first filament power supply 58*a*, the first cathode power supply 58*b*, the first arc power supply 58*c*, and the extraction power supply 58*d* are configured in the same manner as in the first embodiment.

The second cathode 55 supplies the thermoelectron into the internal space S of the arc chamber 50. The second cathode 55 is provided on a side opposite to the first cathode 54 in the axial direction with the internal space S interposed therebetween. The second cathode 55 is inserted into a second cathode insertion hole 50*h* provided in the second end wall 50*d*, and is fixed to a second cathode support member 65 in a state of being electrically isolated from the arc chamber 50. The second cathode support member 65 is provided outside the arc chamber 50. The second cathode 55 includes a second heat source 90, a second cathode cap 92, a second thermal break 94, and a second thermal shield 96.

The second heat source 90 is a heat source for heating the second cathode cap 92. The second heat source 90 is, for example, a filament connected to the second filament power supply 58*f*. The second heat source 90 is disposed inside the second thermal break 94 to face the second cathode cap 92. The second cathode power supply 58*g* is connected between the second heat source 90 and the second cathode cap 92, and a cathode voltage is applied to therebetween.

The second cathode cap 92 is a solid member that protrudes in the axial direction toward the inside of the arc chamber 50. The second cathode cap 92 has, for example, the truncated cone shape. The second cathode cap 92 is heated by the second heat source 90 to emit the thermoelectron toward the internal space S. The second arc power supply 58*h* is connected between the second cathode cap 92 and the arc chamber 50, and the arc voltage is applied to therebetween. The first arc power supply 58*c* and the second arc power supply 58*h* may be shared. For example, the arc voltage may be applied to the second cathode cap 92 by connecting the first arc power supply 58*c* to the second cathode cap 92 in a configuration in which the second arc power supply 58*h* is not provided.

The second thermal break 94 is a cylindrical member that supports the second cathode cap 92, and extends in the axial direction from the second cathode support member 65 toward the second cathode cap 92. The second thermal shield 96 extends in the axial direction in the tubular shape on the radially outer side of the second cathode cap 92 and the second thermal break 94. The second thermal shield 96 reflects heat radiation from the second cathode cap 92 and the second thermal break 94 which are in a high temperature state, and suppresses heat escape from the second cathode cap 92 and the second thermal break 94 to promote a rise in temperatures of the second cathode cap 92 and the second thermal break 94.

The second cathode cap 92, the second thermal break 94, and the second thermal shield 96 are made of the refractory material. For example, a refractory metal such as tungsten, molybdenum, or tantalum, an alloy thereof, or graphite is used. As an example, the second cathode cap 92 and the second thermal shield 96 are made of tungsten, and the second thermal break 94 is made of tantalum.

The second cathode 55 is configured in the same manner as the first cathode 54 according to the first embodiment shown in FIG. 3. The second cathode 55 includes a configuration similar to that in which "first" of the component of the first cathode 54 is replaced with "second". For example, the second thermal shield 96 includes a second extension portion that extends in the axial direction in the tubular shape on the radially outer side of the second cathode cap 92 and is adjacent to the second cathode cap 92 with a gap in the radial direction, a second tip portion that protrudes toward the inside of the arc chamber, and a second tip opening that opens in the axial direction at the second tip portion. A second opening width of the second tip opening in the radial direction is smaller than a maximum width of a thermoelectron emission surface of the second cathode cap 92 in the radial direction.

According to the ninth embodiment, with the use of the first cathode 54 and the second cathode 55 in combination, it is possible to supply a larger number of thermoelectrons into the internal space S of the arc chamber 50. Further, also in the second cathode 55, since the second opening width of the second tip opening in the radial direction is smaller than the maximum width of the thermoelectron emission surface of the second cathode cap in the radial direction, it is possible to narrow the range in the radial direction in which the thermoelectron is emitted from the second cathode cap 92 toward the inside of the arc chamber 50. As a result, it is possible to intensively supply the thermoelectron to the range limited in the radial direction and to generate the high density plasma in the plasma generation region P even under the low arc condition.

The second cathode 55 according to the ninth embodiment may be used in combination with the first cathode according to the modification example of the first embodiment, or may be used in combination with the first cathode according to the second embodiment, the third embodiment, or the fourth embodiment or the modification examples of the second to fourth embodiments.

Modification Examples According to Ninth Embodiment

The second cathode 55 may be configured in the same manner as the first cathodes 54A to 54L according to the modification example shown in FIGS. 5A to 10B. The second cathode cap 92 of the second cathode 55 may have a shape similar to the shape of the first cathode cap 72 according to the modification example shown in FIGS. 11A to 11O.

The second cathode 55 may be configured in the same manner as the first cathode 154 according to the second embodiment. In this case, the second cathode 55 includes a configuration similar to that in which "the first heat source 70, the first cathode cap 72, the first thermal break 74, the first thermal shield 76, and the second thermal shield 78" of the first cathode 154 are replaced with "a second heat source, a second cathode cap, a second thermal break, a third thermal shield, and a fourth thermal shield", respectively. That is, the second cathode 55 includes the second heat source, the second cathode cap, the second thermal break, the third thermal shield, and the fourth thermal shield. The third thermal shield includes a third extension portion that extends in the axial direction in the tubular shape on the radially outer side of the second cathode cap and the second thermal break and is adjacent to the second cathode cap and the second thermal break with a gap in the radial direction, a third tip portion that protrudes toward the inside of the arc chamber, and a third tip opening that opens in the axial direction at the third tip portion. The fourth thermal shield includes a fourth extension portion that extends in the axial direction in the tubular shape on the radially outer side of the third thermal shield and is adjacent to the third extension portion with a gap in the radial direction, a fourth tip portion that protrudes toward the inside of the arc chamber, and a fourth tip opening that opens in the axial direction at the fourth tip portion. A third opening width of the third tip opening in the radial direction is larger than a maximum width of a thermoelectron emission surface of the second cathode cap in the radial direction. The second cathode 55 may be configured in the same manner as the first cathodes 154A to 154J according to the modification example of the second embodiment.

The second cathode 55, which is configured in the same manner as the first cathodes 154 to 154J according to the second embodiment or the modification example of the second embodiment, may be used in combination with the first cathode according to the modification example of the first embodiment, or may be used in combination with the first cathode according to the second embodiment, the third embodiment, or the fourth embodiment or the modification examples of the second to fourth embodiments.

The second cathode 55 may be configured in the same manner as the first cathode 254 according to the third embodiment. In this case, the second cathode 55 includes a configuration similar to that in which "the first heat source 70, the first cathode cap 72, the first thermal break 74, and the first thermal shield 276" of the first cathode 254 are replaced with "a second heat source, a second cathode cap, a second thermal break, and a second thermal shield", respectively. That is, the second cathode 55 includes the second heat source, the second cathode cap, the second thermal break, and the second thermal shield. The second thermal shield includes a second extension portion that extends in the axial direction in the tubular shape on the radially outer side of the second cathode cap and the second thermal break and is adjacent to the second cathode cap and the second thermal break with a gap in the radial direction, a second tip portion that protrudes toward the inside of the arc chamber, and a second tip opening that opens in the axial direction at the second tip portion. A potential of the second thermal shield is higher than a potential of the second cathode cap, and the second tip portion protrudes in the axial direction toward the inside of the arc chamber more than the second cathode cap. The second cathode 55 may be configured in the same manner as the first cathodes 254A and 254B according to the modification example of the third embodiment.

The second cathode 55, which is configured in the same manner as the first cathodes 254 to 254B according to the third embodiment or the modification example of the third embodiment, may be used in combination with the first cathode according to the modification example of the first embodiment, or may be used in combination with the first cathode according to the second embodiment, the third embodiment, or the fourth embodiment or the modification examples of the second to fourth embodiments.

The second cathode 55 may be configured in the same manner as the first cathode 354 according to the fourth embodiment. In this case, the second cathode 55 includes a configuration similar to that in which "the first heat source 70, the first cathode cap 72, the first thermal break 74, the first thermal shield 76, and the second thermal shield 378" of the first cathode 354 are replaced with "a second heat source, a second cathode cap, a second thermal break, a third thermal shield, and a fourth thermal shield", respectively. That is, the second cathode 55 includes the second heat source, the second cathode cap, the second thermal break, the third thermal shield, and the fourth thermal shield. The third thermal shield includes a third extension portion that extends in the axial direction in the tubular shape on the radially outer side of the second cathode cap and the second thermal break and is adjacent to the second cathode cap and the second thermal break with a gap in the radial direction, a third tip portion that protrudes toward the inside of the arc chamber, and a third tip opening that opens in the axial direction at the third tip portion. The fourth thermal shield includes a fourth extension portion that extends in the axial direction in the tubular shape on the radially outer side of the third thermal shield and is adjacent to the third extension portion with a gap in the radial direction, a fourth tip portion that protrudes toward the inside of the arc chamber, and a fourth tip opening that opens in the axial direction at the fourth tip portion. A fourth opening width of the fourth tip opening in the radial direction is equal to or larger than the third opening width of the third tip opening in the radial direction. The second cathode 55 may be configured in the same manner as the first cathode 354A according to the modification example of the fourth embodiment.

The second cathode 55, which is configured in the same manner as the first cathodes 354 to 354A according to the fourth embodiment or the modification example of the fourth embodiment, may be used in combination with the first cathode according to the modification example of the first embodiment, or may be used in combination with the first cathode according to the second embodiment, the third embodiment, or the fourth embodiment or the modification examples of the second to fourth embodiments.

Tenth Embodiment

Figure 29:
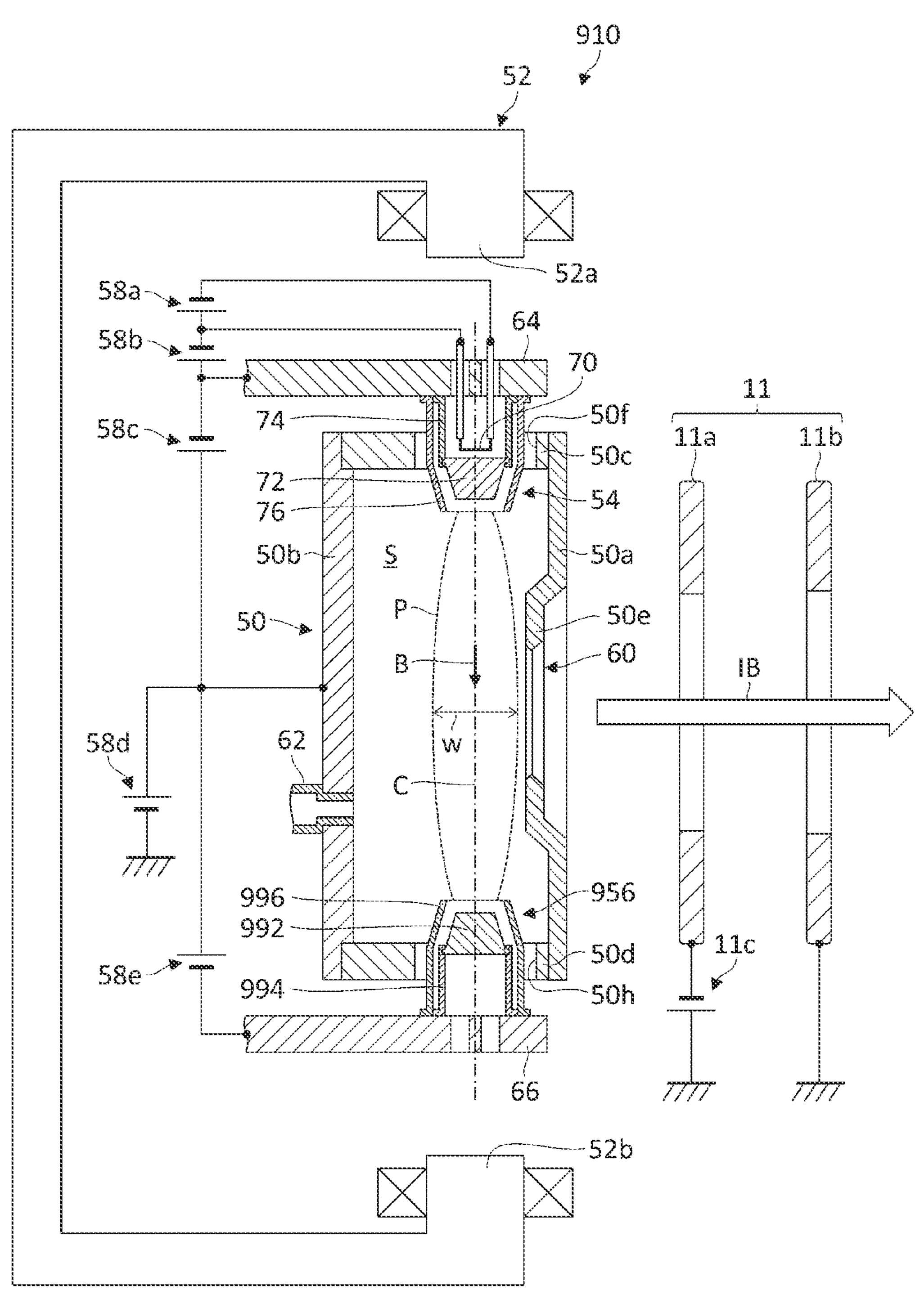
FIG. 29 is a cross-sectional view of a schematic configuration of an ion generation device according to a tenth embodiment.

FIG. 29 is a cross-sectional view of a schematic configuration of an ion generation device 910 according to a tenth embodiment. The tenth embodiment is different from the above-described embodiment in that a repeller 956 has a structure similar to the structure of the second cathode 55. Hereinafter, in the tenth embodiment, differences from the above-described embodiment will be mainly described and description of common points will be omitted as appropriate.

The ion generation device 910 includes the arc chamber 50, the magnetic field generator 52, the first cathode 54, the repeller 956, the first filament power supply 58*a*, the first cathode power supply 58*b*, the first arc power supply 58*c*, the extraction power supply 58*d*, and the repeller power supply 58*e*. The arc chamber 50, the magnetic field generator 52, the first cathode 54, the first filament power supply 58*a*, the first cathode power supply 58*b*, the first arc power supply 58*c*, the extraction power supply 58*d*, and the repeller power supply 58*e* are configured to be the same as those in the first embodiment.

The repeller 956 includes a repeller head 992, a second thermal break 994, and a second thermal shield 996. The repeller 956 is configured in the same manner as that in which the second heat source 90 is excluded from the second cathode 55 in FIG. 28. The repeller 956 includes a configuration similar to that in which "the second cathode cap 92, the second thermal break 94, and the second thermal shield 96" of the second cathode 55 are replaced with "the repeller head 992, the second thermal break 994, and the second thermal shield 996", respectively. The repeller 956 is different from the second cathode 55 in that the repeller 956 does not include the second heat source 90. The repeller head 992 is heated by an interaction with the plasma generated in the plasma generation region P.

Modification Examples According to Tenth Embodiment

The repeller 956 may be configured in the same manner as that in which the first heat source is excluded from the first cathodes 54A to 54L according to the modification examples shown in FIGS. 5A to 10B. The repeller head 992 of the repeller 956 may have a shape similar to the shape of the first cathode cap 72 according to the modification example shown in FIGS. 11A to 11O.

The repeller 956 may be configured in the same manner as that in which the first heat source is excluded from the first cathode 154 according to the second embodiment. In this case, the repeller 956 includes a configuration similar to that in which "the first cathode cap 72, the first thermal break 74, the first thermal shield 76, and the second thermal shield 78" of the first cathode 154 are replaced with "a repeller head, a second thermal break, a third thermal shield, and a fourth thermal shield", respectively. That is, the repeller 956 includes the repeller head, the second thermal break, the third thermal shield, and the fourth thermal shield. The repeller 956 may be configured in the same manner as that in which the first heat source is excluded from the first cathodes 154A to 154J according to the modification example of the second embodiment.

The repeller 956 may be configured in the same manner as that in which the first heat source is excluded from the first cathode 254 according to the third embodiment. In this case, the repeller 956 includes a configuration similar to that in which "the first cathode cap 72, the first thermal break 74, and the first thermal shield 276" of the first cathode 254 are replaced with "a repeller head, a second thermal break, and a second thermal shield", respectively. That is, the repeller 956 includes the repeller head, the second thermal break, and the second thermal shield. The repeller 956 may be configured in the same manner as that in which the first heat source is excluded from the first cathodes 254A and 254B according to the modification example of the third embodiment.

The repeller 956 may be configured in the same manner as that in which the first heat source is excluded from the first cathode 354 according to the fourth embodiment. In this case, the repeller 956 includes a configuration similar to that in which "the first cathode cap 72, the first thermal break 74, the first thermal shield 76, and the second thermal shield 378" of the first cathode 354 are replaced with "a repeller head, a second thermal break, a third thermal shield, and a fourth thermal shield", respectively. That is, the repeller 956 includes the repeller head, the second thermal break, the third thermal shield, and the fourth thermal shield. The repeller 956 may be configured in the same manner as that in which the first heat source is excluded from the first cathode 354A according to the modification example of the fourth embodiment.

Although the present disclosure has been described above with reference to each of the above-described embodiments, the present disclosure is not limited to each of the above-described embodiments, and the configuration of each of the above-described embodiments may be combined or replaced as appropriate or may be replaced. Further, it is also possible to rearrange the combination in each of the above-described embodiments or the order of processing as appropriate based on the knowledge of those skilled in the art, or to add modifications such as various design changes to the embodiment. The scope of the ion generation device and the ion implanter according to the present disclosure may also include the embodiment to which such a combination change or modification is added.

In the above-described embodiments and modification examples, a case has been described where the heat source of the cathode cap is a filament. In a further modification example, a heat source other than the filament may be used. For example, with a laser as a heat source, a laser beam may be emitted to a heat inflow surface of the cathode cap to heat the cathode cap.

In the above-described embodiments and modification examples, a case has been described where one or two thermal shields are provided on the radially outer side of the cathode cap or the repeller head. In a further modification example, three or more thermal shields may be provided on the radially outer side of the cathode cap or the repeller head. For example, an additional thermal shield may be further provided on the radially outer side of the second thermal shield included in the first cathode, or an additional thermal shield may be further provided on the radially outer side of the fourth thermal shield included in the repeller or the second cathode.

In the above-described embodiments and modification examples, the repeller used in combination with the first cathode according to the present disclosure has been described. The repeller according to the present disclosure is applicable to any aspect of an ion generation device or an ion implanter including the repeller, and is not limited to the combination with the first cathode including the first cathode cap having the tapered shape and the first thermal shield having the tapered shape according to the present disclosure. The repeller according to the present disclosure may be used in combination with the first cathode in which at least one of the first cathode cap or the first thermal shield does not have the tapered shape, or may be used in combination with the first cathode in which the first thermal shield is not included. The repeller according to the present disclosure may be used in combination with the first cathode which is any aspect of an indirect-heating-type cathode.

Hereinafter, some aspects of the present disclosure will be described.

[Aspect 1]

An ion generation device including:

an arc chamber including an internal space and including a front slit for extracting an ion beam from plasma generated in the internal space;

a magnetic field generator that generates a magnetic field applied in an axial direction in the internal space; and a first cathode configured to supply a thermoelectron into the internal space, wherein the first cathode includes a first cathode cap that protrudes in the axial direction toward an inside of the arc chamber and emits the thermoelectron supplied into the internal space, a first heat source that heats the first cathode cap, and a first thermal shield including a first extension portion that extends in the axial direction in a substantially tubular shape on a radially outer side of the first cathode cap and is adjacent to the first cathode cap with a gap in a radial direction perpendicular to the axial direction, a first tip portion that protrudes toward the inside of the arc chamber, and a first tip opening that opens in the axial direction at the first tip portion, and a first opening width of the first tip opening in the radial direction is smaller than a maximum width of the first cathode cap in the radial direction.

[Aspect 2]

The ion generation device according to aspect 1, wherein at least a part of an edge of the first tip opening is provided at a position overlapping the first cathode cap in the axial direction.

[Aspect 3]

The ion generation device according to aspect 1 or 2, wherein the first cathode cap includes a substantially tapered shape whose width in the radial direction decreases toward the inside of the arc chamber.

[Aspect 4]

The ion generation device according to any one of aspects 1 to 3, wherein the first extension portion includes a first tapered portion configured such that a width of an inner surface of the first extension portion in the radial direction decreases toward the inside of the arc chamber.

[Aspect 5]

The ion generation device according to any one of aspects 1 to 4, wherein a distance between the first extension portion and the first cathode cap is configured to be constant.

[Aspect 6]

The ion generation device according to any one of aspects 1 to 5, wherein the first cathode cap includes a tip surface that is exposed in the axial direction toward the inside of the arc chamber, and the first opening width is larger than a width of the tip surface in the radial direction.

[Aspect 7]

The ion generation device according to any one of aspects 1 to 5, wherein the first cathode cap includes a tip surface that is exposed in the axial direction toward the inside of the arc chamber, and the first opening width is equal to or smaller than a width of the tip surface in the radial direction.

[Aspect 8]

The ion generation device according to any one of aspects 1 to 7, wherein the first tip portion protrudes in the axial direction toward the inside of the arc chamber more than a tip of the first cathode cap that protrudes in the axial direction toward the inside of the arc chamber.

[Aspect 9]

The ion generation device according to any one of aspects 1 to 6, wherein a tip of the first cathode cap that protrudes in the axial direction toward the inside of the arc chamber has the same position in the axial direction as the first tip portion, or protrudes toward the inside of the arc chamber more than the first tip portion.

[Aspect 10]

The ion generation device according to any one of aspects 1 to 9, wherein a potential of the first thermal shield is the same as a potential of the first cathode cap.

[Aspect 11]

The ion generation device according to any one of aspects 1 to 10, wherein the first tip portion extends on an inner side in the radial direction from the first extension portion.

[Aspect 12]

The ion generation device according to any one of aspects 1 to 11, wherein the first tip opening has a substantially tapered shape whose opening width in the radial direction increases toward the inside of the arc chamber.

[Aspect 13]

The ion generation device according to any one of aspects 1 to 12, further including:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, and a second thermal shield including a second extension portion that extends in the axial direction in a substantially tubular shape on a radially outer side of the second cathode cap and is adjacent to the second cathode cap with a gap in the radial direction, a second tip portion that protrudes toward the inside of the arc chamber, and a second tip opening that opens in the axial direction at the second tip portion, and a second opening width of the second tip opening in the radial direction is smaller than a maximum width of the second cathode cap in the radial direction.

[Aspect 14]

The ion generation device according to any one of aspects 1 to 12, further including:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

[Aspect 15]

The ion generation device according to any one of aspects 1 to 12, wherein the first cathode further includes a second thermal shield including a second extension portion that extends in the axial direction in a substantially tubular shape on a radially outer side of the first thermal shield and is adjacent to the first extension portion with a gap in the radial direction, a second tip portion that protrudes toward the inside of the arc chamber, and a second tip opening that opens in the axial direction at the second tip portion.

[Aspect 16]

The ion generation device according to aspect 15, wherein the second tip portion has the same position in the axial direction as the first tip portion, or protrudes toward the inside of the arc chamber more than the first tip portion.

[Aspect 17]

The ion generation device according to aspect 15 or 16, wherein in a cross section along the axial direction, the second opening width of the second tip opening in the radial direction is smaller than a maximum width of an outer surface of the first extension portion in the radial direction.

[Aspect 18]

The ion generation device according to aspect 17, wherein the second opening width is equal to or larger than the first opening width.

[Aspect 19]

The ion generation device according to aspect 17, wherein the second opening width is smaller than the first opening width.

[Aspect 20]

The ion generation device according to any one of aspects 15 to 19, wherein the second extension portion includes a second tapered portion configured such that a width of an inner surface of the second extension portion in the radial direction decreases toward the inside of the arc chamber.

[Aspect 21]

The ion generation device according to any one of aspects 15 to 20, wherein a potential of the second thermal shield is the same as a potential of the first thermal shield.

[Aspect 22]

The ion generation device according to any one of aspects 15 to 21, wherein the second tip portion extends on an inner side in the radial direction from the second extension portion.

[Aspect 23]

The ion generation device according to any one of aspects 15 to 22, wherein the second tip opening has a substantially tapered shape whose opening width in the radial direction increases toward the inside of the arc chamber.

[Aspect 24]

The ion generation device according to any one of aspects 15 to 23, further including:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, a third thermal shield including a third extension portion that extends in the axial direction in a substantially tubular shape on a radially outer side of the second cathode cap and is adjacent to the second cathode cap with a gap in a radial direction perpendicular to the axial direction, a third tip portion that protrudes toward the inside of the arc chamber, and a third tip opening that opens in the axial direction at the third tip portion, and a fourth thermal shield including a fourth extension portion that extends in the axial direction in a substantially tubular shape on a radially outer side of the third thermal shield and is adjacent to the third extension portion with a gap in the radial direction, a fourth tip portion that protrudes toward the inside of the arc chamber, and a fourth tip opening that opens in the axial direction at the fourth tip portion, and a third opening width of the third tip opening in the radial direction is smaller than a maximum width of the second cathode cap in the radial direction.

[Aspect 25]

The ion generation device according to any one of aspects 15 to 23, further including:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

[Aspect 26]

An ion generation device including:

an arc chamber including an internal space and including a front slit for extracting an ion beam from plasma generated in the internal space;

a magnetic field generator that generates a magnetic field applied in an axial direction in the internal space; and a first cathode configured to supply a thermoelectron into the internal space, wherein the first cathode includes a first cathode cap that protrudes in the axial direction toward an inside of the arc chamber and emits the thermoelectron supplied into the internal space, a first heat source that heats the first cathode cap, and a first thermal shield including a first extension portion that extends in the axial direction in a substantially tubular shape on a radially outer side of the first cathode cap and is adjacent to the first cathode cap with a gap in a radial direction perpendicular to the axial direction, a first tip portion that protrudes toward the inside of the arc chamber, and a first tip opening that opens in the axial direction at the first tip portion, a potential of the first thermal shield is higher than a potential of the first cathode cap, and the first tip portion protrudes in the axial direction toward the inside of the arc chamber more than the first cathode cap.

[Aspect 27]

The ion generation device according to aspect 26, wherein a first opening width of the first tip opening in the radial direction is smaller than a maximum width of the first cathode cap in the radial direction.

[Aspect 28]

The ion generation device according to aspect 26 or 27, wherein at least a part of an edge of the first tip opening is provided at a position overlapping the first cathode cap in the axial direction.

[Aspect 29]

The ion generation device according to any one of aspects 26 to 28, wherein the first cathode cap includes a substantially tapered shape whose width in the radial direction decreases toward the inside of the arc chamber.

[Aspect 30]

The ion generation device according to any one of aspects 26 to 29, wherein the first extension portion includes a first tapered portion configured such that a width of an inner surface of the first extension portion in the radial direction decreases toward the inside of the arc chamber.

[Aspect 31]

The ion generation device according to any one of aspects 26 to 30, wherein a distance between the first extension portion and the first cathode cap is configured to be constant.

[Aspect 32]

The ion generation device according to any one of aspects 26 to 31, wherein the first cathode cap includes a tip surface that is exposed in the axial direction toward the inside of the arc chamber, and a first opening width of the first tip opening in the radial direction is larger than a width of the tip surface in the radial direction.

[Aspect 33]

The ion generation device according to any one of aspects 26 to 31, wherein the first cathode cap includes a tip surface that is exposed in the axial direction toward the inside of the arc chamber, and a first opening width of the first tip opening in the radial direction is equal to or smaller than a width of the tip surface in the radial direction.

[Aspect 34]

The ion generation device according to any one of aspects 26 to 33, wherein the first tip portion extends on an inner side in the radial direction from the first extension portion.

[Aspect 35]

The ion generation device according to any one of aspects 26 to 34,

Wherein the first tip opening has a substantially tapered shape whose opening width in the radial direction increases toward the inside of the arc chamber.

[Aspect 36]

The ion generation device according to any one of aspects 26 to 35, further including:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, and a second thermal shield including a second extension portion that extends in the axial direction in a substantially tubular shape on a radially outer side of the second cathode cap and is adjacent to the second cathode cap with a gap in the radial direction, a second tip portion that protrudes toward the inside of the arc chamber, and a second tip opening that opens in the axial direction at the second tip portion, a potential of the second thermal shield is higher than a potential of the second cathode cap, and the second tip portion protrudes in the axial direction toward the inside of the arc chamber more than the second cathode cap.

[Aspect 37]

The ion generation device according to any one of aspects 26 to 35, further including:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

[Aspect 38]

An ion generation device including:

an arc chamber including an internal space and including a front slit for extracting an ion beam from plasma generated in the internal space;

a magnetic field generator that generates a magnetic field applied in an axial direction in the internal space; and a first cathode configured to supply a thermoelectron into the internal space, wherein the first cathode includes a first cathode cap that protrudes in the axial direction toward an inside of the arc chamber and emits the thermoelectron supplied into the internal space, a first heat source that heats the first cathode cap, a first thermal shield including a first extension portion that extends in the axial direction in a substantially tubular shape on a radially outer side of the first cathode cap and is adjacent to the first cathode cap with a gap in a radial direction perpendicular to the axial direction, a first tip portion that protrudes toward the inside of the arc chamber, and a first tip opening that opens in the axial direction at the first tip portion, and a second thermal shield including a second extension portion that extends in the axial direction in a substantially tubular shape on a radially outer side of the first thermal shield and is adjacent to the first extension portion with a gap in the radial direction, a second tip portion that protrudes toward the inside of the arc chamber, and a second tip opening that opens in the axial direction at the second tip portion, and a second opening width of the second tip opening in the radial direction is equal to or larger than a first opening width of the first tip opening in the radial direction.

[Aspect 39]

The ion generation device according to aspect 38, wherein the second tip portion protrudes in the axial direction toward the inside of the arc chamber more than the first cathode cap and the first tip portion.

[Aspect 40]

The ion generation device according to aspect 38 or 39, wherein a potential of the second thermal shield is higher than a potential of the first cathode cap or the first thermal shield.

[Aspect 41]

The ion generation device according to aspect 38 or 39, wherein a potential of the second thermal shield is higher than potentials of the first cathode cap and the first thermal shield.

[Aspect 42]

The ion generation device according to aspect 40 or 41, wherein the first opening width is smaller than a maximum width of the first cathode cap in the radial direction.

[Aspect 43]

The ion generation device according to any one of aspects 40 to 42, wherein at least a part of an edge of the first tip opening is provided at a position overlapping the first cathode cap in the axial direction.

[Aspect 44]

The ion generation device according to any one of aspects 40 to 43, wherein the first cathode cap includes a substantially tapered shape whose width in the radial direction decreases toward the inside of the arc chamber.

[Aspect 45]

The ion generation device according to any one of aspects 40 to 44, wherein the first extension portion includes a first tapered portion configured such that a width of an inner surface of the first extension portion in the radial direction decreases toward the inside of the arc chamber.

[Aspect 46]

The ion generation device according to any one of aspects 40 to 45, wherein a distance between the first extension portion and the first cathode cap is configured to be constant.

[Aspect 47]

The ion generation device according to any one of aspects 40 to 46, wherein the first cathode cap includes a tip surface that is exposed in the axial direction toward the inside of the arc chamber, and the first opening width is larger than a width of the tip surface in the radial direction.

[Aspect 48]

The ion generation device according to any one of aspects 40 to 46, wherein the first cathode cap includes a tip surface that is exposed in the axial direction toward the inside of the arc chamber, and the first opening width is equal to or smaller than a width of the tip surface in the radial direction.

[Aspect 49]

The ion generation device according to any one of aspects 40 to 48, wherein the first tip portion protrudes in the axial direction toward the inside of the arc chamber more than the first cathode cap.

[Aspect 50]

The ion generation device according to any one of aspects 40 to 47, wherein a tip of the first cathode cap that protrudes in the axial direction toward the inside of the arc chamber has the same position in the axial direction as the first tip portion, or protrudes toward the inside of the arc chamber more than the first tip portion.

[Aspect 51]

The ion generation device according to any one of aspects 40 to 50, wherein a potential of the first thermal shield is the same as a potential of the first cathode cap.

[Aspect 52]

The ion generation device according to any one of aspects 40 to 51, wherein the first tip portion extends on an inner side in the radial direction from the first extension portion.

[Aspect 53]

The ion generation device according to any one of aspects 40 to 52, wherein the first tip opening has a substantially tapered shape whose opening width in the radial direction increases toward the inside of the arc chamber.

[Aspect 54]

The ion generation device according to any one of aspects 40 to 53, wherein in a cross section along the axial direction, a second opening width of the second tip opening in the radial direction is smaller than a maximum width of an outer surface of the first extension portion in the radial direction.

[Aspect 55]

The ion generation device according to any one of aspects 40 to 54, wherein the second extension portion includes a second tapered portion configured such that a width of an inner surface of the second extension portion in the radial direction decreases toward the inside of the arc chamber.

[Aspect 56]

The ion generation device according to any one of aspects 40 to 55, wherein the second tip portion extends on an inner side in the radial direction from the second extension portion.

[Aspect 57]

The ion generation device according to any one of aspects 40 to 56, wherein the second tip opening has a substantially tapered shape whose opening width in the radial direction increases toward the inside of the arc chamber.

[Aspect 58]

The ion generation device according to any one of aspects 38 to 57, further including:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, a third thermal shield including a third extension portion that extends in the axial direction in a substantially tubular shape on a radially outer side of the second cathode cap and is adjacent to the second cathode cap with a gap in a radial direction perpendicular to the axial direction, a third tip portion that protrudes toward the inside of the arc chamber, and a third tip opening that opens in the axial direction at the third tip portion, and a fourth thermal shield including a fourth extension portion that extends in the axial direction in a substantially tubular shape on a radially outer side of the third thermal shield and is adjacent to the third extension portion with a gap in the radial direction, a fourth tip portion that protrudes toward the inside of the arc chamber, and a fourth tip opening that opens in the axial direction at the fourth tip portion, and a fourth opening width of the fourth tip opening in the radial direction is equal to or larger than a third opening width of the third tip opening in the radial direction.

[Aspect 59]

The ion generation device according to any one of aspects 38 to 57, further including:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

[Aspect 60]

An ion implanter including:

the ion generation device according to any one of aspects 1 to 59;

a beam accelerator that accelerates an ion beam extracted from the ion generation device; and an implantation processing chamber in which the ion beam output from the beam accelerator is implanted to a wafer.

INDUSTRIAL APPLICABILITY

According to a non-limiting exemplary embodiment of the present disclosure, it is possible to provide the ion generation device capable of generating a larger number of multiply charged ions under the lower arc condition.

It should be understood that the invention is not limited to the above-described embodiment, but may be modified into various forms on the basis of the spirit of the invention. Additionally, the modifications are included in the scope of the invention.

What is claimed is:

1. An ion generation device comprising:

an arc chamber including an internal space and including a front slit for extracting an ion beam from plasma generated in the internal space;

a magnetic field generator that generates a magnetic field applied in an axial direction in the internal space; and a first cathode configured to supply a thermoelectron into the internal space, wherein the first cathode includes a first cathode cap that protrudes in the axial direction toward an inside of the arc chamber and emits the thermoelectron supplied into the internal space, a first heat source that heats the first cathode cap, and a first thermal shield including a first extension portion that extends in the axial direction in a substantially tubular shape on a radially outer side of the first cathode cap and is adjacent to the first cathode cap with a gap in a radial direction perpendicular to the axial direction, a first tip portion that protrudes toward the inside of the arc chamber, and a first tip opening that opens in the axial direction at the first tip portion, and a first opening width of the first tip opening in the radial direction is smaller than a maximum width of the first cathode cap in the radial direction.

2. The ion generation device according to claim 1, wherein at least a part of an edge of the first tip opening is provided at a position overlapping the first cathode cap in the axial direction.

3. The ion generation device according to claim 1, wherein the first cathode cap includes a substantially tapered shape whose width in the radial direction decreases toward the inside of the arc chamber.

4. The ion generation device according to claim 1, wherein the first extension portion includes a first tapered portion configured such that a width of an inner surface of the first extension portion in the radial direction decreases toward the inside of the arc chamber.

5. The ion generation device according to claim 1, wherein a distance between the first extension portion and the first cathode cap is configured to be constant.

6. The ion generation device according to claim 1, wherein the first cathode cap includes a tip surface that is exposed in the axial direction toward the inside of the arc chamber, and the first opening width is larger than a width of the tip surface in the radial direction.

7. The ion generation device according to claim 1, wherein the first cathode cap includes a tip surface that is exposed in the axial direction toward the inside of the arc chamber, and the first opening width is equal to or smaller than a width of the tip surface in the radial direction.

8. The ion generation device according to claim 1, wherein the first tip portion protrudes in the axial direction toward the inside of the arc chamber more than a tip of the first cathode cap that protrudes in the axial direction toward the inside of the arc chamber.

9. The ion generation device according to claim 1, wherein a tip of the first cathode cap that protrudes in the axial direction toward the inside of the arc chamber has the same position in the axial direction as the first tip portion, or protrudes toward the inside of the arc chamber more than the first tip portion.

10. The ion generation device according to claim 1, wherein a potential of the first thermal shield is the same as a potential of the first cathode cap.

11. The ion generation device according to claim 1, wherein the first tip portion extends on an inner side in the radial direction from the first extension portion.

12. The ion generation device according to claim 1, Wherein the first tip opening has a substantially tapered shape whose opening width in the radial direction increases toward the inside of the arc chamber.

13. The ion generation device according to claim 1, further comprising:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, and a second thermal shield including a second extension portion that extends in the axial direction in a substantially tubular shape on a radially outer side of the second cathode cap and is adjacent to the second cathode cap with a gap in the radial direction, a second tip portion that protrudes toward the inside of the arc chamber, and a second tip opening that opens in the axial direction at the second tip portion, and a second opening width of the second tip opening in the radial direction is smaller than a maximum width of the second cathode cap in the radial direction.

14. The ion generation device according to claim 1, further comprising:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

15. The ion generation device according to claim 1, wherein the first cathode further includes a second thermal shield including a second extension portion that extends in the axial direction in a substantially tubular shape on a radially outer side of the first thermal shield and is adjacent to the first extension portion with a gap in the radial direction, a second tip portion that protrudes toward the inside of the arc chamber, and a second tip opening that opens in the axial direction at the second tip portion.

16. The ion generation device according to claim 15, wherein the second tip portion has the same position in the axial direction as the first tip portion, or protrudes toward the inside of the arc chamber more than the first tip portion.

17. The ion generation device according to claim 15, wherein in a cross section along the axial direction, a second opening width of the second tip opening in the radial direction is smaller than a maximum width of an outer surface of the first extension portion in the radial direction.

18. The ion generation device according to claim 17, wherein the second opening width is equal to or larger than the first opening width.

19. The ion generation device according to claim 17, wherein the second opening width is smaller than the first opening width.

20. The ion generation device according to claim 15, wherein the second extension portion includes a second tapered portion configured such that a width of an inner surface of the second extension portion in the radial direction decreases toward the inside of the arc chamber.

21. The ion generation device according to claim 15, wherein a potential of the second thermal shield is the same as a potential of the first thermal shield.

22. The ion generation device according to claim 15, wherein the second tip portion extends on an inner side in the radial direction from the second extension portion.

23. The ion generation device according to claim 15, Wherein the second tip opening has a substantially tapered shape whose opening width in the radial direction increases toward the inside of the arc chamber.

24. The ion generation device according to claim 15, further comprising:

a second cathode that is provided on a side opposite to the first cathode in the axial direction with the internal space interposed therebetween and is configured to supply a thermoelectron into the internal space, wherein the second cathode includes a second cathode cap that protrudes in the axial direction toward the inside of the arc chamber and emits the thermoelectron supplied into the internal space, a second heat source that heats the second cathode cap, a third thermal shield including a third extension portion that extends in the axial direction in a substantially tubular shape on a radially outer side of the second cathode cap and is adjacent to the second cathode cap with a gap in a radial direction perpendicular to the axial direction, a third tip portion that protrudes toward the inside of the arc chamber, and a third tip opening that opens in the axial direction at the third tip portion, and a fourth thermal shield including a fourth extension portion that extends in the axial direction in a substantially tubular shape on a radially outer side of the third thermal shield and is adjacent to the third extension portion with a gap in the radial direction, a fourth tip portion that protrudes toward the inside of the arc chamber, and a fourth tip opening that opens in the axial direction at the fourth tip portion, and a third opening width of the third tip opening in the radial direction is smaller than a maximum width of the second cathode cap in the radial direction.

25. The ion generation device according to claim 15, further comprising:

a repeller provided on a side opposite to the first cathode in the axial direction with the internal space interposed therebetween, wherein the repeller includes a repeller head that protrudes in the axial direction toward the inside of the arc chamber, and a thermal shield that extends in the axial direction in a substantially tubular shape on a radially outer side of the repeller head.

26. An ion implanter comprising:

the ion generation device according to claim 1;

a beam accelerator that accelerates an ion beam extracted from the ion generation device; and an implantation processing chamber in which the ion beam output from the beam accelerator is implanted to a wafer.

* * * * *